United States Patent
Lee

(10) Patent No.: US 12,216,859 B2
(45) Date of Patent: Feb. 4, 2025

(54) DISPLAY DEVICE AND METHOD OF DRIVING THE SAME

(71) Applicant: Samsung Display Co., LTD., Yongin-si (KR)

(72) Inventor: Soon Gyu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 47 days.

(21) Appl. No.: 17/833,919

(22) Filed: Jun. 7, 2022

(65) Prior Publication Data

US 2023/0094019 A1    Mar. 30, 2023

(30) Foreign Application Priority Data

Sep. 28, 2021 (KR) .................. 10-2021-0128098

(51) Int. Cl.
    *G09G 5/00*      (2006.01)
    *G06F 3/041*      (2006.01)
    *G06F 3/044*      (2006.01)
    *H10K 59/40*      (2023.01)

(52) U.S. Cl.
    CPC ........ *G06F 3/04166* (2019.05); *G06F 3/0446* (2019.05); *H10K 59/40* (2023.02)

(58) Field of Classification Search
    CPC .... G06F 3/04166; G06F 3/0446; H10K 59/40
    USPC ....................................... 345/173
    See application file for complete search history.

(56) References Cited

U.S. PATENT DOCUMENTS

| | | |
|---|---|---|
| 9,274,589 B2 | 3/2016 | Park |
| 10,726,715 B2 | 7/2020 | Hwang et al. |
| 11,141,098 B2 | 10/2021 | Park et al. |
| 11,158,685 B2 * | 10/2021 | Yang ............... G06F 3/0416 |
| 2014/0302894 A1 | 10/2014 | Woo et al. |
| 2015/0261378 A1 * | 9/2015 | Lee .................. G06F 3/0447 |
| | | 715/765 |
| 2016/0274726 A1 | 9/2016 | Chung et al. |
| 2016/0349871 A1 * | 12/2016 | Tanemura ......... G06F 3/04166 |
| 2017/0255295 A1 * | 9/2017 | Tanemura .......... G06F 1/3262 |
| 2018/0275794 A1 * | 9/2018 | Takada ............. G06F 3/04164 |

FOREIGN PATENT DOCUMENTS

| | | |
|---|---|---|
| KR | 10-2014-0121755 | 10/2014 |
| KR | 10-1572331 | 11/2015 |
| KR | 10-2016-0112559 | 9/2016 |
| KR | 10-2017-0055893 | 5/2017 |
| KR | 10-2019-0063177 | 6/2019 |

* cited by examiner

*Primary Examiner* — Jennifer T Nguyen
(74) *Attorney, Agent, or Firm* — Lewis Roca Rothgerber Christie LLP

(57) ABSTRACT

A display device includes a display panel. The display panel includes pixels. A sensor layer overlaps the display panel and includes sensors. A sensor driver is configured to transmit a driving signal to the sensors and receive sensing signals from the sensors. The sensor driver is configured to transmit a first driving signal to the sensors to detect a first sensing area where a touch occurs in a first mode, and to transmit a second driving signal to at least a portion of the sensors corresponding to a second sensing area different from the first sensing area in a second mode.

27 Claims, 39 Drawing Sheets

| TX DRIVING SIGNAL | TOUCH SENSING (FIRST MODE) | PROXIMITY SENSING (SECOND MODE) | BIOMETRIC INFORMATION MEASUREMENT (THIRD MODE) |
|---|---|---|---|
| SENSING TARGET | Finger | LARGE-AREA CONDUCTOR | LARGE-AREA CONDUCTOR |
| VOLTAGE (V) | V1 | V2 (V1 <= V2) | V3 (V1 <= V2 <= V3) |
| FREQUENCY (kHz) | F1 | F2 (F1 >= F2) | F3 (F1 >= F2 >= F3) |
| NUMBER OF SIMULTANEOUS TRANSMISSION LINES | p | q (p <= q) | r (p <= q <= r) |

FIG. 12

| TX DRIVING SIGNAL | TOUCH SENSING (FIRST MODE) | PROXIMITY SENSING (SECOND MODE) | BIOMETRIC INFORMATION MEASUREMENT (THIRD MODE) |
|---|---|---|---|
| SENSING TARGET | Finger | LARGE-AREA CONDUCTOR | LARGE-AREA CONDUCTOR |
| VOLTAGE (V) | V1 | V2 (V1 <= V2) | V3 (V1 <= V2 <= V3) |
| FREQUENCY (kHz) | F1 | F2 (F1 >= F2) | F3 (F1 >= F2 >= F3) |
| NUMBER OF SIMULTANEOUS TRANSMISSION LINES | p | q (p <= q) | r (p <= q <= r) |

| OPERATIONAL SUBJECT | TOUCH SENSING (FIRST MODE) | PROXIMITY SENSING (SECOND MODE) |
|---|---|---|
| DATA PREPROCESSING | SENSOR DRIVER | SENSOR DRIVER |
| OPERATION | SENSOR DRIVER | AP |
| FINAL DETERMINATION | SENSOR DRIVER | AP |

FIG. 27
<SECOND MODE>
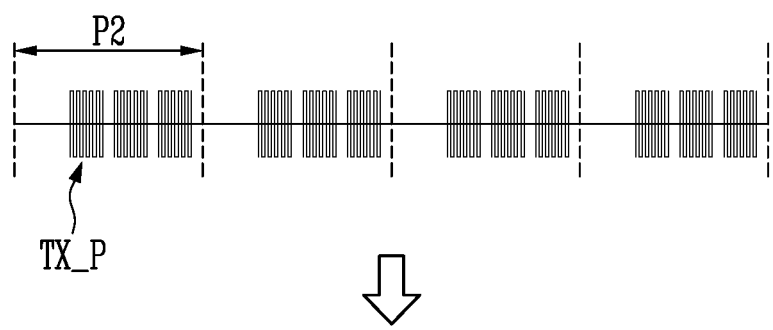
<THIRD MODE>
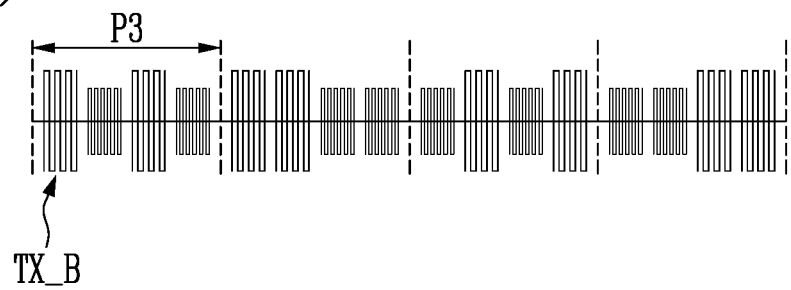
<THIRD MODE>
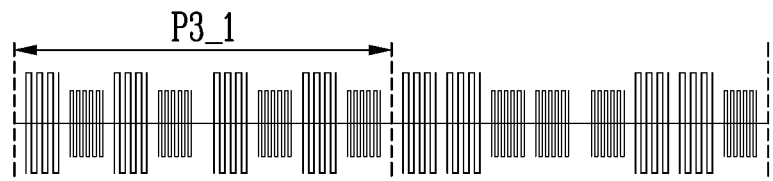

DISPLAY DEVICE AND METHOD OF DRIVING THE SAME

CROSS-REFERENCE TO RELATED APPLICATION

This application claims priority from and the benefit of Korean Patent Application No. 10-2021-0128098, filed on Sep. 28, 2021, which is hereby incorporated by reference for all purposes as if fully set forth herein.

BACKGROUND

Field

Embodiments of the invention relate generally to a display device and a method of driving the display device and more specifically, to a display device having various sensing modes and a method of driving the display device.

Discussion of the Background

With the development of information technology, the importance of a display device that is a connection medium between a user and information has been emphasized. Owing to the importance of the display device, various display devices, such as a liquid crystal display (LCD) device and an organic light-emitting display device, have been widely used in various fields.

The display device may include a display panel for displaying an image and a sensor panel for sensing a touch position. At this time, the sensor panel may be used to measure the coordinate of the touch position of an object, and may be used to check whether the object is in proximity to the sensor panel.

The above information disclosed in this Background section is only for understanding of the background of the inventive concepts, and, therefore, it may contain information that does not constitute prior art.

SUMMARY

Display devices constructed according to the principles of the invention are capable of more effectively determining whether an object is in proximity to the display devices, and measuring biometric information (e.g., hydration) of the object based on the proximity of the object.

Methods of driving the display devices according to the principles of the invention are capable of more effectively determining whether the object is in proximity to the display devices, and measuring the biometric information (e.g., hydration) of the object based on the proximity of the object.

Additional features of the inventive concepts will be set forth in the description which follows, and in part will be apparent from the description, or may be learned by practice of the inventive concepts.

According to an aspect of the invention, a display device includes a display panel including pixels; a sensor layer overlapping the display panel and including sensors; and a sensor driver configured to transmit a driving signal to the sensors and receive sensing signals from the sensors. In a first mode, the sensor driver is configured to transmit a first driving signal to the sensors to detect a first sensing area where a touch occurs, and, in a second mode, the sensor driver is configured to transmit a second driving signal to at least a portion of the sensors corresponding to a second sensing area different from the first sensing area.

The sensor driver may be configured to detect the touch based on first sensing signals provided from the sensors in response to the first driving signal in the first mode, and second sensing signals may be provided from the sensors in response to the second driving signal in the second mode, and may be used for proximity sensing.

The first driving signal and the second driving signal may be different from each other in at least one of a voltage magnitude, a frequency, and a number of sensors to which the driving signal simultaneously provided.

In the second mode, the sensor driver may be configured to provide the first driving signal to the sensors corresponding to the first and second sensing areas, and a second transmission rate of the first driving signal in the second mode may be lower than a first transmission rate of the first driving signal in the first mode.

The sensor driver may be configured to alternately transmit the first driving signal and the second driving signal to the sensor layer at least once in the second mode.

A second sensing rate at which a second sensing result based on the sensing signals is output in the second mode may be less than a first sensing rate at which a first sensing result based on the sensing signals is output in the first mode.

The sensor driver may be configured to transmit only sensing signals corresponding to the second driving signal to an external device, in the second mode.

The sensor driver may include an analog front-end configured to differentially amplify one sensing signal of the sensing signals and a reference signal; and an analog-to-digital converter configured to convert an output of the analog front-end into a sensing value, and the reference signal may be another sensing signal of the sensing signals.

The one sensing signal of the sensing signals and the another sensing signal of the sensing signals may correspond to the first sensing area.

The one sensing signal of the sensing signals may correspond to the first sensing area, and the another sensing signal of the sensing signals may correspond to the second sensing area.

The sensor driver may include an analog front-end configured to receive one of the sensing signals, and an analog-to-digital converter configured to convert an output of the analog front-end into a sensing value, and the analog front-end may be implemented as a single analog front-end.

In the third mode, the sensor driver may be configured to transmit a third driving signal to at least a portion of the sensors corresponding to the second sensing area, the third driving signal and the second driving signal may be different from each other in at least one of a voltage magnitude, a frequency, and a number of sensors to which the driving signal simultaneously provided.

Second sensing signals may be provided from the sensors in response to the second driving signal in the second mode, and may be used for proximity sensing, and the sensor driver may be operated by switching from the second mode to the third mode in response to an object approaching the sensor layer within a first threshold distance.

Third sensing signals, provided from the sensors in response to the third driving signal in the third mode, may include first sensing information in a state in which the object contacts the display device and second sensing information in a state in which the object does not contact the display device.

Third sensing signals may be provided from the sensors in response to the third driving signal in the third mode, and may be used for measuring hydration of the object.

The sensor driver may be operated by switching from the third mode to the second mode in response to the object being released from the sensor layer by a second threshold distance, and the second threshold distance may be greater than the first threshold distance.

The pixels may be configured to emit light in the first mode and the second mode, and the pixels may be configured to emit no light in the third mode.

A number of transmissions of the driving signal per unit time in the third mode may be greater than a number of transmissions of the driving signal per unit time in the second mode.

A third sensing rate at which a third sensing result based on the sensing signals is output in the third mode may be equal to or less than a second sensing rate at which a second sensing result based on the sensing signals is output in the second mode.

The sensor driver may be configured to alternately transmit the second driving signal and the third driving signal to the sensor layer at least once in the third mode.

The sensor driver may be configured to alternately transmit the first driving signal, the second driving signal, and the third driving signal to the sensor layer at least once in the third mode.

According to another aspect of the invention, a method of driving a display device having pixels and sensors includes the steps of: driving a display device having pixels and sensors overlapping the pixels, the method including transmitting a first driving signal to the sensors through a sensor driver; receiving first sensing signals corresponding to the first driving signal from the sensors through the sensor driver; transmitting a second driving signal to the sensors through the sensor driver, in response to an object approaching within a first threshold distance; and receiving second sensing signals corresponding to the second driving signal from the sensors through the sensor driver. The first driving signal and the second driving signal are different from each other in at least one of a voltage magnitude, a frequency, and a number of sensors to which a driving signal simultaneously provided.

The method may further include the steps of: sensing proximity of the object based on the first sensing signals; and measuring hydration of the object based on the second sensing signals.

The second sensing signals may include first sensing information in a state in which the object contacts the display device and second sensing information in a state in which the object does not contact the display device.

The method may further include stopping the transmitting the second driving signal through the sensor driver to the sensors in response to the object being released from the sensors by a second threshold distance, and the second threshold distance may be greater than the first threshold distance.

The pixels may be configured to emit light while the first driving signal is transmitted to the sensors, and the pixels may be configured to emit no light while the second driving signal is transmitted to the sensors.

A number of transmissions of the second driving signal per unit time may be greater than a number of transmissions of the first driving signal per unit time.

A second sensing rate for the second sensing signals may be equal to or less than a first sensing rate for the first sensing signals.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 12 is a diagram for explaining characteristics of a driving signal which is set in each of the first, second, and third modes.

FIGS. 27 and 28 are waveform diagrams illustrating examples of a driving signal which is set in the third mode.

DETAILED DESCRIPTION

Figure 1:
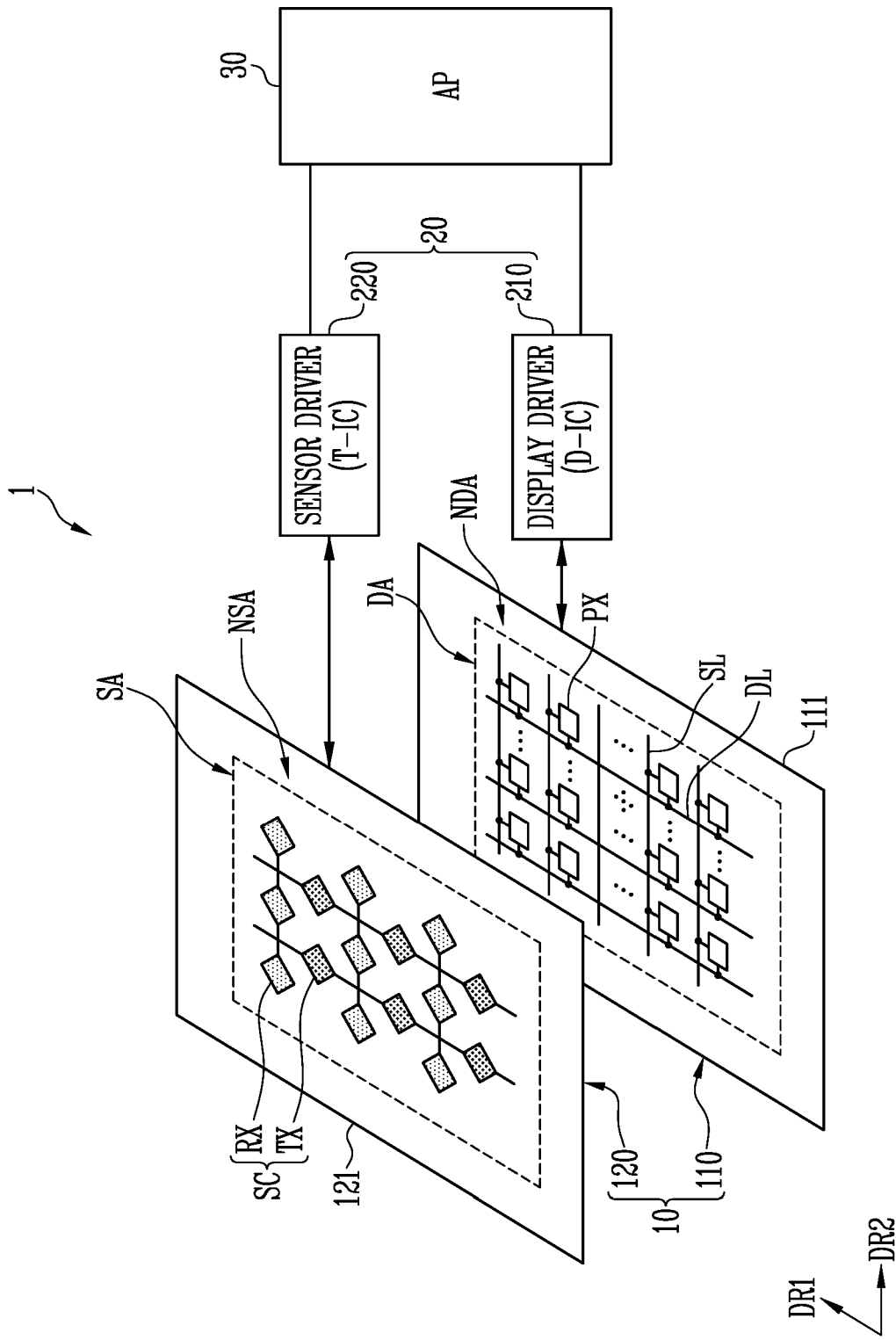
FIG. 1 is a diagram of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc. of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described in detail with reference to the attached drawings, such that those skilled in the art can easily implement the present disclosure. The present disclosure may be implemented in various forms, and is not limited to embodiments to be described herein below.

In the drawings, portions which are not related to the present disclosure will be omitted to explain the present disclosure more clearly. Reference should be made to the drawings, in which similar reference numerals are used throughout the different drawings to designate similar components. Therefore, the aforementioned reference numerals may be used in other drawings.

For reference, the size of each component and the thicknesses of lines illustrating the component are arbitrarily expressed for the sake of explanation, and embodiments are not limited to those illustrated in the drawings. In the drawings, the thicknesses of the components may be exaggerated to clearly express several layers and areas.

In addition, the expression "the same" in the description may mean "substantially the same." In other words, the expression "same" may mean a level acceptable to those skilled in the art. Other expressions may be expressions in which "substantially" is omitted.

Some embodiments are described in the accompanying drawings in connection with functional blocks, units and/or modules. Those skilled in the art will understand that such blocks, units, and/or modules are physically implemented by logic circuits, discrete components, microprocessors, hard-wired circuits, memory elements, line connections, and other electronic circuits. This may be formed using semiconductor-based fabrication techniques or other fabrication techniques. For blocks, units, and/or modules implemented by a microprocessor or other similar hardware, they may be programmed and controlled using software to perform various functions discussed herein, and may be optionally driven by firmware and/or software. In addition, each block, unit, and/or module may be implemented by dedicated hardware, or be implemented by a combination of the dedicated hardware which performs some functions and a processor which performs different functions (e.g., one or more programmed microprocessors and related circuits). Further, in some embodiments, blocks, units and/or modules may be physically separated into two or more individual blocks, units and/or modules which interact with each other without departing from the scope of the inventive concept. Furthermore, in some embodiments, blocks, units and/or modules may be physically combined into more complex blocks, units and/or modules without departing from the scope of the inventive concept.

FIG. 1 is a diagram illustrating a display device in accordance with embodiments.

Referring to FIG. 1, a display device 1 may include a panel 10 and a driver circuit 20 for driving the panel 10. The display device 1 may further include an application processor 30 or may be connected to the application processor 30.

The panel 10 may include a display panel 110 (e.g., a display layer) for displaying an image and a sensor layer 120 (e.g., a sensor panel) for sensing touch, pressure, fingerprint, hovering, biometric information (e.g., biometric characteristics, e.g., hydration), and the like. For example, the panel 10 may include pixels PX and sensors SC positioned to overlap at least some of the pixels PX. In an embodiment, the sensors SC may include first sensors TX (e.g., a driving electrode) and second sensors RX (e.g., a sensing electrode). In an embodiment (e.g., self-capacitive type), the sensors SC may be configured as one type of sensors without distinguishing between the first and second sensors TX and RX.

The driver circuit 20 may include a display driver 210 for driving the display panel 110 and a sensor driver 220 for driving the sensor layer 120. For example, the pixels PX may display an image on the basis of display frame periods. For example, the sensors SC may sense a user's input on the basis of a sensing frame period. The sensing frame period and the display frame period may be independent of each other, and may be different from each other. The sensing frame period and the display frame period may be synchronized with each other or may be asynchronous.

According to an embodiment, the display panel 110 and the sensor layer 120 may be separately manufactured, and then be disposed to overlap each other and/or combined with together. Alternatively, in an embodiment, the display panel 110 and the sensor layer 120 may be integrally manufactured. For example, the sensor layer 120 may be directly formed on at least one substrate (e.g., upper and/or lower substrates of a display panel or a thin film encapsulation layer) of the display panel 110. For example, the sensor layer 120 may be directly formed on another insulating layer or various functional layers (e.g., an optical layer or a protective layer) of the display panel 110.

Although FIG. 1 illustrates that the sensor layer 120 is disposed on the front surface (e.g., an upper surface on which an image is displayed) of the display panel 110, the position of the sensor layer 120 is not limited thereto. For example, in an embodiment, the sensor layer 120 may be disposed on the rear side or both sides of the display panel 110. In an embodiment, the sensor layer 120 may be disposed on at least one edge area of the display panel 110.

The display panel 110 may include a display substrate 111 and a plurality of pixels PX formed on the display substrate 111. The pixels PX may be disposed in a display area DA of the display substrate 111.

The display substrate 111 may include a display area DA on which an image is displayed, and a non-display area NDA which is provided outside the display area DA. In an embodiment, the display area DA may be disposed in a central portion of the display panel 110, and the non-display area NDA may be disposed in a perimeter portion of the display panel 110 to surround the display area DA.

The display substrate 111 may be a rigid or flexible substrate, and the material or properties thereof are not particularly limited. For example, the display substrate 111 may be a rigid substrate formed of glass or reinforced glass. Alternatively, the display substrate 111 may be a flexible substrate including a thin film formed of plastic or metal.

In the display area DA, scan lines SL, data lines DL, and the pixels PX connected to the scan lines SL and the data lines DL may be disposed. The pixels PX may be selected by a scan signal of a turn-on level supplied from the scan lines SL, receive a data signal from the data lines DL, and emit light having a luminance corresponding to the data signal. For example, an image corresponding to the data signal may be displayed in the display area DA. However, the structure and driving method of the pixels PX are not particularly limited. For example, each of the pixels PX may be implemented as a pixel having various currently known structures and driving methods.

Various lines and/or internal circuit components which are connected to the pixels PX of the display area DA may be disposed in the non-display area NDA. For instance, a plurality of lines for supplying various power and control signals to the display area DA may be disposed in the non-display area NDA. In addition, a scan driver or the like may be further disposed in the non-display area.

For example, the display panel 110 is not limited to a particular kind of display panel. For example, the display panel 110 may be implemented as a self-emissive type display panel such as an organic light-emitting display panel. However, when the display panel 110 is implemented as the self-emissive type display panel, it is not necessarily limited to a case in which each of the pixels PX includes only an organic light-emitting diode. For example, the light-emitting element of each of the pixels PX may be an organic light-emitting diode, an inorganic light-emitting diode, a quantum dot/well light-emitting diode, etc. Each of the pixels PX may be provided with a plurality of light-emitting elements. In this case, the plurality of light-emitting elements may be connected in series, parallel, series-parallel, or the like. Alternatively, the display panel 110 may be implemented as a non-emissive type display panel such as a liquid crystal display panel. When the display panel 110 is implemented as the non-emissive type display panel, the display device 1 may additionally include a light source such as a backlight unit.

The sensor layer 120 may include a sensor substrate 121 and a plurality of sensors SC formed on the sensor substrate 121. The sensors SC may be disposed in a sensing area SA on the sensor substrate 121.

The sensor substrate 121 may include a sensing area SA which senses a touch input or the like, and a peripheral area NSA which is provided outside the sensing area SA. In some embodiments, the sensing area SA may be disposed to overlap at least one area of the display area DA. For instance, the sensing area SA may be an area corresponding to the display area DA (e.g., an area overlapping the display area DA), and the peripheral area NSA may be an area corresponding to the non-display area NDA (e.g., an area overlapping the non-display area NDA). In this case, when the touch input or the like is provided on the display area DA, the touch input may be detected through the sensor layer 120.

The sensor substrate 121 may be a rigid or flexible substrate, and may also include at least one insulating layer. The sensor substrate 121 may be a light-transmitting substrate made of transparent or translucent material, but embodiments are not limited thereto. For example, the material and physical properties of the sensor substrate 121 are not particularly limited. For example, the sensor substrate 121 may be a rigid substrate made of glass or reinforced glass. For example, the sensor substrate 121 may be a flexible substrate including a thin film made of plastic or metal. In addition, according to an embodiment, at least one substrate (e.g., the display substrate 111, an encapsulation substrate, and/or a thin-film encapsulation layer) of the display panel 110, or at least one insulating layer or functional layer disposed inside and/or outside the display panel 110 may be used as the sensor substrate 121.

The sensing area SA is an area which may respond to a touch input (i.e., an active area of the sensor). For example, sensors SC for sensing a touch input may be disposed in the sensing area SA. According to an embodiment, the sensors SC may include first sensors TX and second sensors RX.

For example, each of the first sensors TX may extend in a first direction DR1. The first sensors TX may be arranged in the second direction DR2. The second direction DR2 may be different from the first direction DR1. For example, the second direction DR2 may be perpendicular to the first direction DR1. In an embodiment, the extending direction and the arrangement direction of the first sensors TX may follow other conventional configurations. Each of the first sensors TX may have a form in which first cells (e.g., driving electrodes) having a relatively large area and first bridges having a relatively small area are connected to each other. Although FIG. 1 illustrates that each of the first cells has a diamond shape, it may be formed in various conventional shapes such as a circular shape, a square shape, a triangle shape, and a mesh shape. For example, first bridges may be integrally formed on the same layer as the first cells. In an embodiment, the first bridges may be formed as a layer different from the first cells to electrically connect adjacent first cells to each other.

For example, each of the second sensors RX may extend in a second direction DR2. The second sensors RX may be arranged in the first direction DR1. In an embodiment, the extending direction and the arrangement direction of the second sensors RX may follow other conventional configurations. Each of the second sensors RX may have a form in which second cells (e.g., sensing electrodes) having a relatively large area and second bridges having a relatively small area are connected to each other. Although FIG. 1 illustrates that each of the second cells has a diamond shape, it may be formed in various conventional shapes such as a circular shape, a square shape, a triangle shape, and a mesh shape. For example, second bridges may be integrally formed on the same layer as the second cells. In an embodiment, the second bridges may be formed as a layer different from the second cells to electrically connect adjacent second cells to each other.

In an embodiment, each of the first sensors TX and the second sensors RX may have conductivity by forming of at least one of a metal material, a transparent conductive material, and various other conductive materials. For example, each of the first sensors TX and the second sensors RX may be made of at least one of metals such as gold (Au), silver (Ag), aluminum (Al), molybdenum (Mo), chrome (Cr), titanium (Ti), nickel (Ni), neodymium (Nd), copper (Cu), or platinum (Pt), or an alloy thereof. In this case, the first sensors TX and the second sensors RX may be formed in a mesh shape. Furthermore, the first sensors TX and the second sensors RX may include at least one of various transparent conductive materials, such as silver nano wires (AgNWs), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide (SnO2), carbon nano tubes (CNTs), or grapheme. In addition, the first sensors TX and the second sensors RX may include at least one of various conductive materials to have conductivity. In addition, each of the first sensors TX and the second sensors RX may be formed of a single layer structure or a multilayer structure, and a cross-sectional structure thereof is not particularly limited thereto.

In the peripheral area NSA of the sensor layer 120, sensor lines for electrically connecting the first and second sensors TX and RX to the sensor driver 220 and the like may be intensively disposed.

The driver circuit 20 may include a display driver 210 for driving the display panel 110 and a sensor driver 220 for driving the sensor layer 120. In an embodiment, the display driver 210 and the sensor driver 220 may be formed as separate integrated chips (ICs). In an embodiment, at least a portion of the display driver 210 and the sensor driver 220 may be integrated together in one IC.

The display driver 210 may be electrically connected to the display panel 110 to drive the pixels PX. For example, the display driver 210 may include a data driver 12 and a timing controller 11, and the scan driver 13 may be separately mounted in the non-display area NDA of the display panel 110 (see FIG. 29). In an embodiment, the display driver 210 may include all or at least a portion of the data driver 12, the timing controller 11, and the scan driver 13.

The sensor driver 220 may be electrically connected to the sensor layer 120 to drive the sensor layer 120. The sensor driver 220 may include a sensor transmitter and a sensor receiver. According to an embodiment, the sensor transmitter and the sensor receiver may be integrated in one IC, but embodiments are not limited thereto.

An application processor 30 may be electrically connected to the display driver 210, and may provide gray scales and timing signals to the display driver 210 during the display frame periods. Further, the application processor 30 may be electrically connected to the sensor driver 220, and may receive a sensing signal from the sensor driver 220. The application processor 30 may determine whether the object is close thereto based on the sensing signal, and may measure biometric information (e.g., skin hydration or fingerprint) of the object.

The application processor 30 may include at least one of a graphics processing unit (GPU), a central processing unit (CPU), and an application processor (AP).

Figure 2:
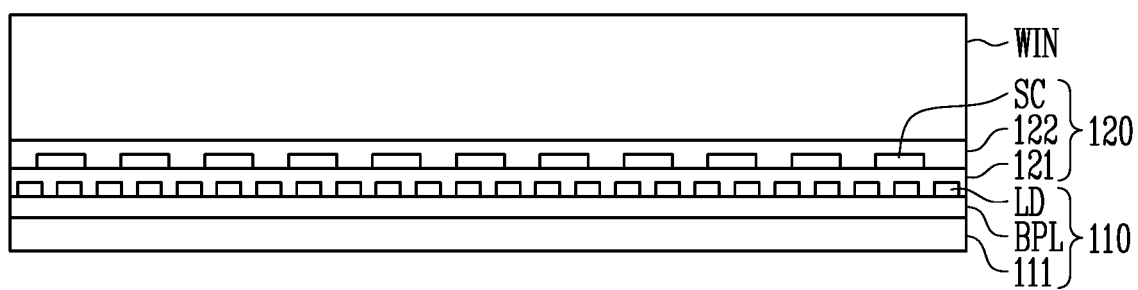
FIG. 2 is a sectional view of the display device of FIG. 1.

FIG. 2 is a sectional view illustrating an embodiment of the display device of FIG. 1.

Referring to FIGS. 1 and 2, the sensor layer 120 may be stacked on the display panel 110, and a window WIN may be stacked on the sensor layer 120.

The display panel 110 may include a display substrate 111, a circuit element layer BPL formed on the display substrate 111, and light-emitting elements LD formed on the circuit element layer BPL. The circuit element layer BPL may include pixel circuits (e.g., a transistor and a capacitor) for driving the light-emitting elements LD of the pixels PX, scan lines SL, data lines DL, and the like.

The sensor layer 120 may include a sensor substrate 121, sensors SC formed on the sensor substrate 121, and a protective layer 122 covering the sensors SC. Referring to FIG. 2, the sensor substrate 121 is illustrated in the form of an encapsulation layer covering the pixels PX. In another embodiment, the sensor substrate 121 may be formed separately from the encapsulation layer which covers the pixels PX.

The window WIN may be a protective member which is disposed on the uppermost surface of a module of the display device 1, and may be a substantially transparent light transmitting substrate. Such a window WIN may have a multilayer structure including at least one selected from among a glass substrate, a plastic film, and a plastic substrate. The window WIN may include a rigid or flexible substrate, and the constituent material of the window WIN is not limited to a specific material.

For example, the display device 1 may further include a polarizer (e.g., another type of reflection prevention layer) for preventing reflection of external light between the window WIN and the sensor layer 120.

Figure 3:
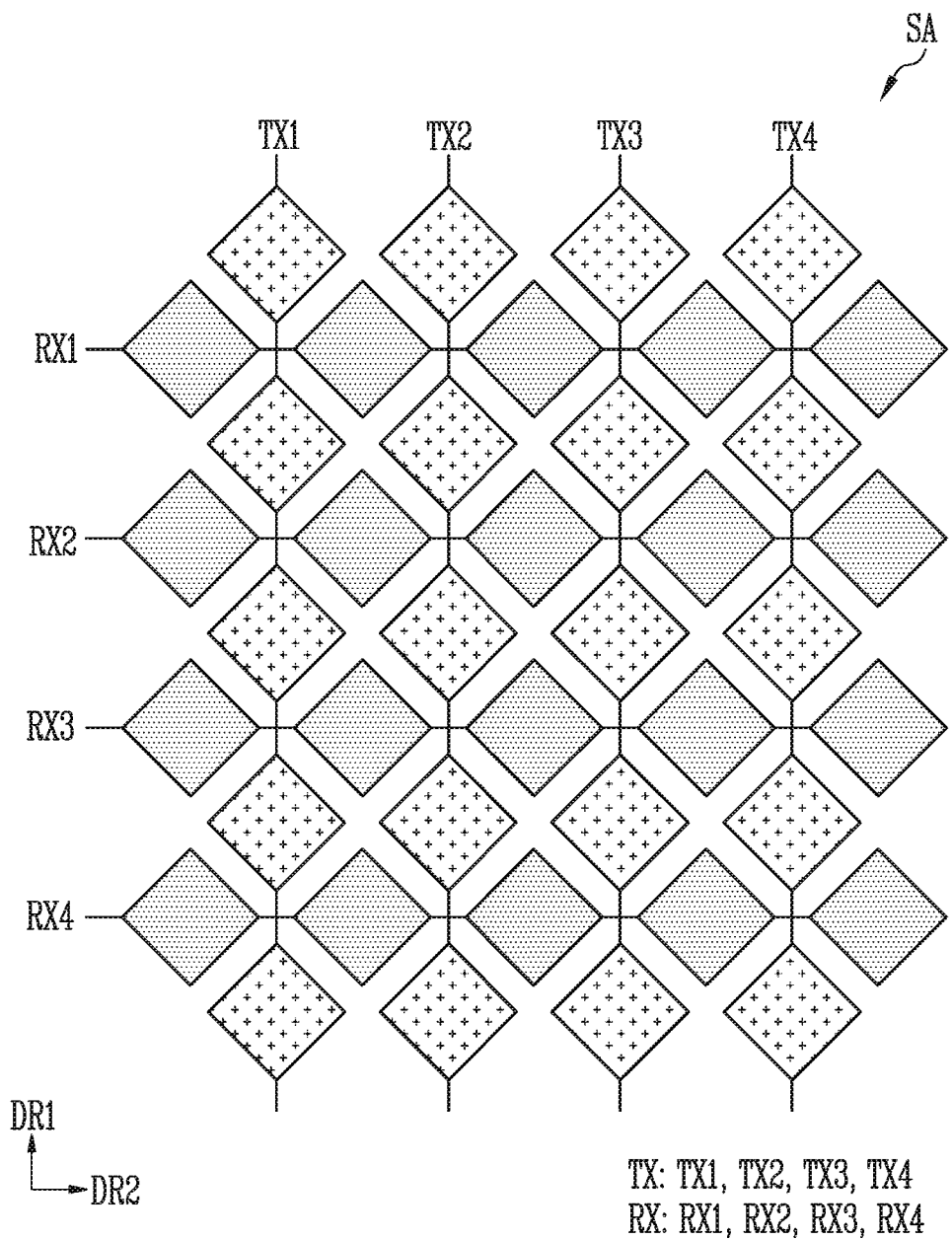
FIG. 3 is a diagram of an embodiment of sensors included in the display device of FIG. 2.

FIG. 3 is a diagram illustrating an embodiment of sensors included in the display device of FIG. 2.

Referring to FIGS. 1, 2, and 3, first sensors TX1, TX2, TX3, and TX4 and second sensors RX1, RX2, RX3, and RX4 positioned in the sensing area SA are exemplarily shown. For the convenience of description, it is assumed that four first sensors TX1 to TX4 are disposed in the sensing area SA, and four second sensors RX1 to RX4 are disposed in the sensing area SA. In embodiments, tens to hundreds of first and second sensors TX and RX may be disposed in the sensing area SA.

Since the descriptions of the first sensors TX1 to TX4 and the second sensors RX1 to RX4 are the same as the descriptions of the first sensors TX and the second sensors RX of FIG. 1, a redundant description thereof is omitted for descriptive convenience.

Figure 4:
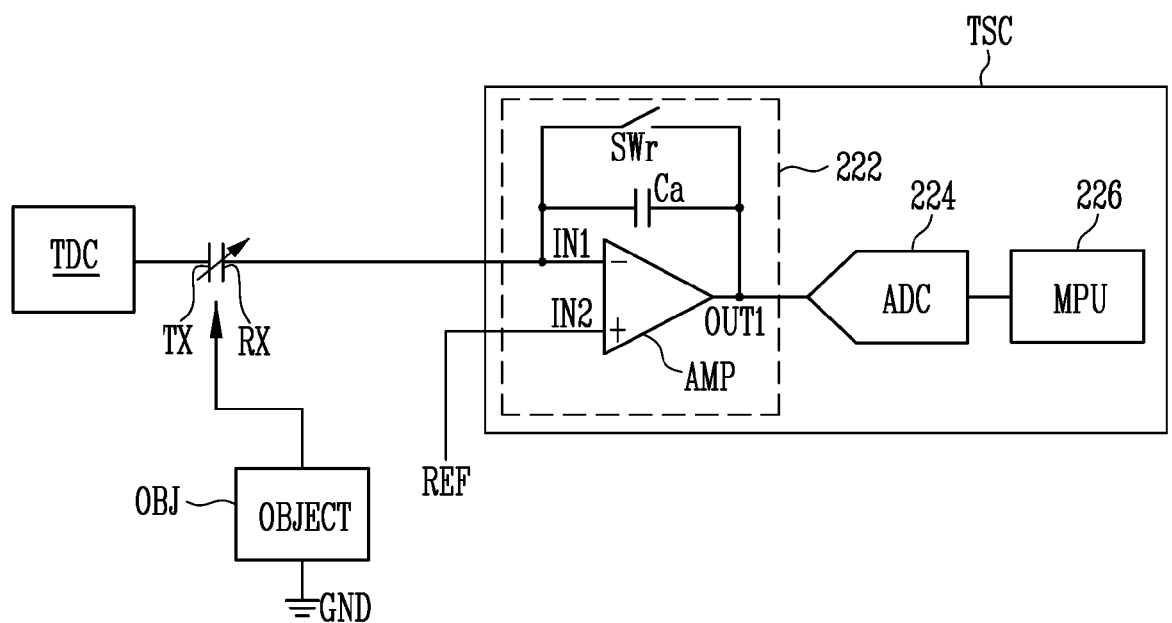
FIGS. 4 and 5 are diagrams for explaining an operation of a sensing driver of FIG. 1 in a mutual sensing period in a first mode.
Figure 5:
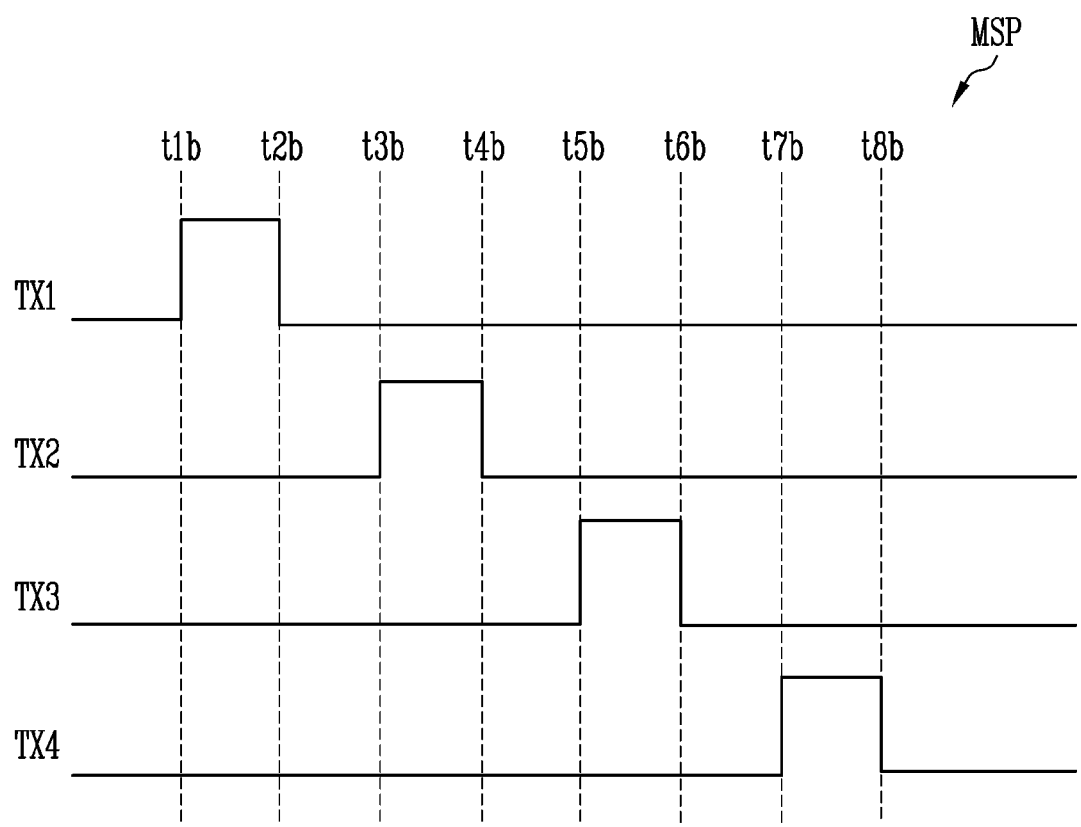

FIGS. 4 and 5 are diagrams for explaining an operation of a sensing driver of FIG. 1 in a mutual sensing period in a first mode.

Referring to FIGS. 1, 2, 3, 4, and 5, the mutual sensing period MSP may be a period in which the sensor layer 120 and the sensor driver 220 are driven in a mutual capacitance mode. In FIG. 4, the configuration of the sensor layer 120 and the sensor driver 220 is illustrated with respect to any one sensor channel 222.

The sensor driver 220 may include a sensor receiver TSC and a sensor transmitter TDC. In the mutual sensing period MSP, the sensor transmitter TDC may be connected to the first sensors TX, and the sensor receiver TSC may be connected to the second sensors RX.

The sensor receiver TSC may include an operational amplifier AMP, an analog-to-digital converter (ADC) 224, and a processor (MPU) 226. For example, each sensor channel 222 may be implemented as an analog front-end AFE including at least one operational amplifier AMP. The analog-to-digital converter 224 and the processor 226 may be provided for each sensor channel 222, or may be shared by a plurality of sensor channels 222.

A first input terminal IN1 of the operational amplifier AMP may be connected to a corresponding second sensor RX, and a second input terminal IN2 of the operational amplifier AMP may be connected to a reference signal REF. For example, the first input terminal IN1 may be an inverting terminal, and the second input terminal IN2 may be a non-inverting terminal. The reference signal REF may be a ground voltage or a voltage having a specific level. According to an embodiment, the reference signal REF may be a signal provided through a second sensor RX different from the corresponding second sensor RX.

The analog-to-digital converter 224 may be connected to an output terminal OUT1 of the operational amplifier AMP. The analog-to-digital converter 224 may convert the output of the operational amplifier AMP into a digital sensing value and then output the converted value. The capacitor Ca and a switch SWr may be connected in parallel between the first input terminal IN1 and the output terminal OUT1.

Referring to FIG. 5, during the mutual sensing period MSP, the sensor driver 220 (e.g., the sensor transmitter TDC) may sequentially supply first driving signals (e.g., signals for sensing) to the first sensors TX1 to TX4. For example, the first driving signals may be supplied to the first sensor TX1 once during the time t1$b$ to the time t2$b$, the first driving signals may be supplied to the first sensor TX2 once during the time t3$b$ to the time t4$b$, the first driving signals may be supplied to the first sensor TX3 once during the time t5$b$ to the time t6$b$, and the first driving signals may be supplied to the first sensor TX4 once during the time t7$b$ to the time t8$b$. The number of times of supplying the first driving signals to the first sensors TX1 to TX4 may be two times and more according to an embodiment.

Each of the first driving signals may include a rising transition and/or a falling transition. For example, the first driving signal at the time t1$b$ may correspond to the rising transition. For example, at the time t1$b$, the first driving signal may rise from a low level to a high level. The first driving signal at the time t2$b$ may correspond to the falling transition. For example, at the time t2$b$, the first driving signal may fall from a high level to a low level.

The sensor receiver TSC may include a plurality of sensor channels 222 connected to the plurality of second sensors RX. Each of the sensor channels 222 may receive first sensing signals (e.g., first sampling signals) corresponding to the first driving signals from the corresponding second sensor RX. For example, in response to the first driving signal applied the first sensor TX1 at the time t1$b$, the sensor channels 222 connected to the second sensors RX1 to RX4 may independently receive the first sensing signals. Further, in response to the first driving signal applied to the first sensor TX1 at the time t2$b$, the sensor channels 222 connected to the second sensors RX1 to RX4 may independently receive the first sensing signals.

On the sensing area SA, the mutual capacitance between the first sensors TX1 to TX4 and the second sensors RX1 to RX4 may vary according to the position of an object OBJ such as a user's finger. For example, the first sensing signals received by the sensor channels 222 may also be different from each other. The touch position of the object OBJ may be detected based on the difference between the first sensing signals.

The sensor channel 222 may generate an output signal corresponding to a voltage difference between the first and second input terminals IN1 and IN2. For instance, the sensor channel 222 may amplify the differential voltage between the first and second input terminals IN1 and IN2 by a predetermined gain, and output the amplified differential voltage.

In an embodiment, the sensor channel 222 may be implemented as an integrator. In this case, the capacitor Ca and the switch SWr may be connected in parallel between the first input terminal IN1 and the output terminal OUT1 of the operational amplifier AMP. For example, charges of the capacitor Ca may be initialized by turning on the switch SWr before receiving the first sampling signal. When the first sampling signal is received, the switch SWr may be in a turned-off state.

The analog-to-digital converter 224 may convert an analog signal input from each of the sensor channels 222 into a digital signal. The processor 226 may analyze the digital signal to detect the user input. The processor 226 may be included in the application processor 30.

Figure 6:
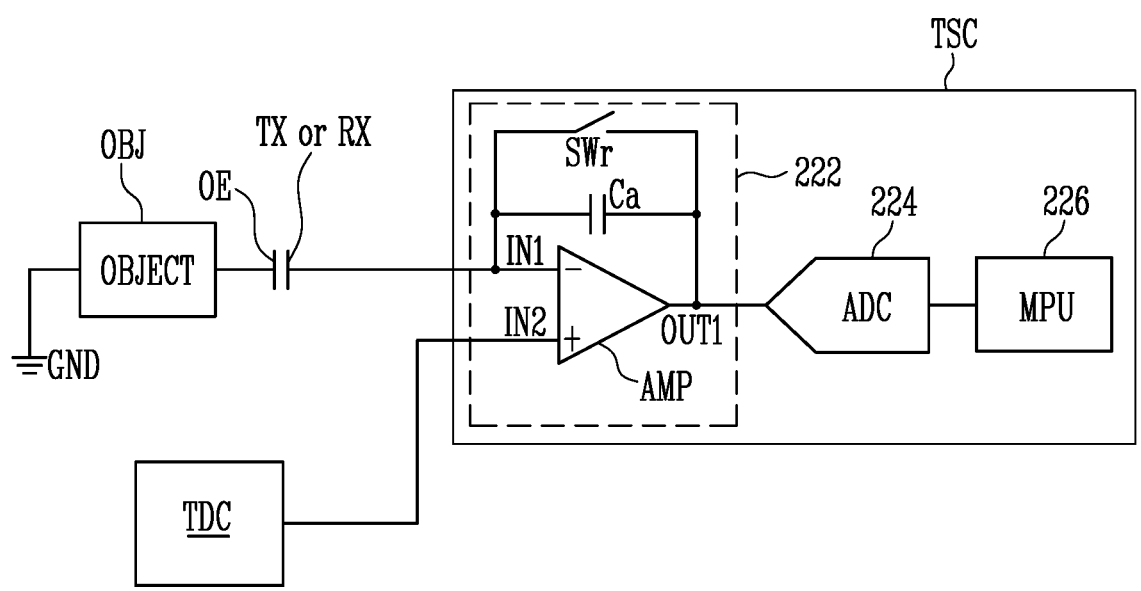
FIGS. 6, 7, and 8 are diagrams for explaining operations of the sensing driver of FIG. 1 in a first self-sensing period and a second self-sensing period in the first mode.
Figure 7:
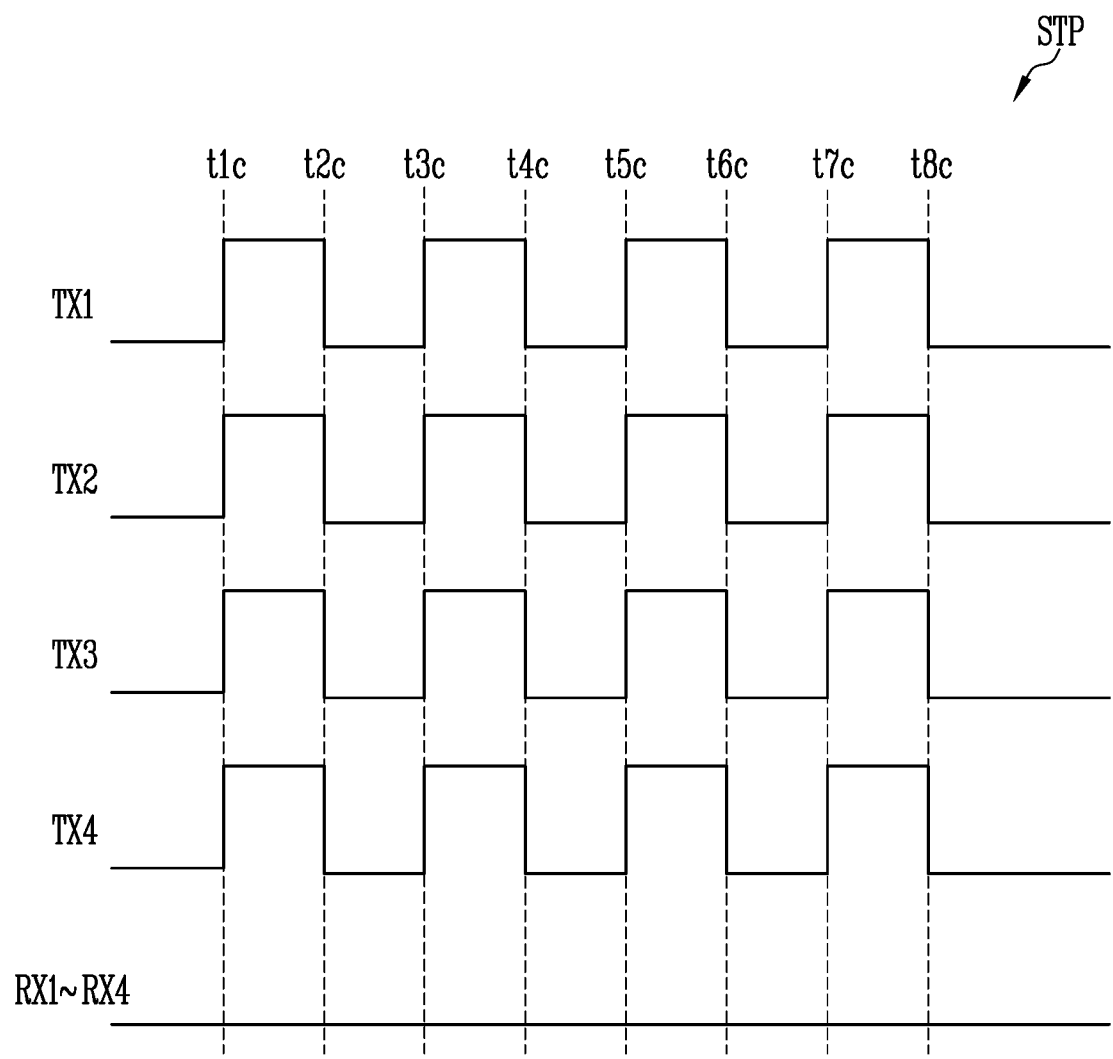
Figure 8:
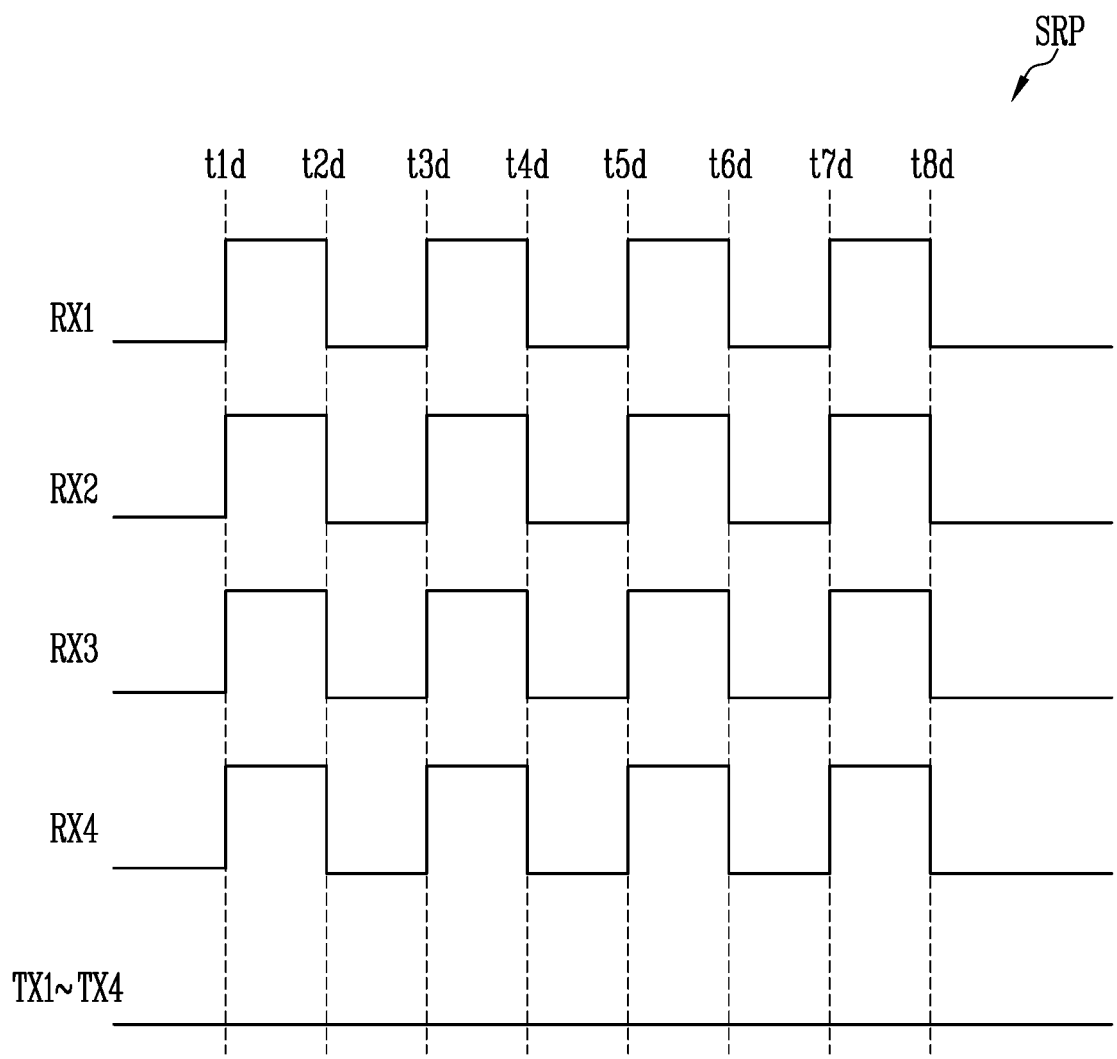

FIGS. 6, 7, and 8 are diagrams for explaining operations of the sensing driver of FIG. 1 in a first self-sensing period and a second self-sensing period in the first mode. In FIG. 6, the configuration of the sensor layer 120 and the sensor driver 220 is illustrated with respect to any one sensor channel 222. Internal configurations of the sensor receiver TSC and the sensor transmitter TDC may be substantially the same as those of FIG. 4. A redundant description thereof will be omitted, and differences will be mainly described below.

Referring to FIGS. 6, 7, and 8, the first self-sensing period STP may be a period in which the sensor layer 120 and the sensor driver 220 are driven in a self-capacitance mode. In the first self-sensing period STP, the sensor transmitter TDC may be connected to the second input terminal IN2 of each sensor channel 222, and a corresponding first sensor TX may be connected to the first input terminal IN1 of each sensor channel 222. In an embodiment, the sensor transmitter TDC may be connected to the first input terminal IN1. In this case, the reference signal REF (see FIG. 4) may be applied to the second input terminal IN2.

Referring to FIG. 7, for example, during the first self-sensing period STP, the sensor transmitter TDC may supply the second driving signal to the second input terminal IN2 of each sensor channel 222. In this case, the second driving signal may be supplied to the first sensor connected to the first input terminal IN1 according to the characteristics of the operational amplifier AMP. In an embodiment, the sensor driver 220 may simultaneously supply the second driving signals to the first sensors TX1 to TX4 during the first self-sensing period STP. For example, referring to FIG. 7, at times t1$c$, t2$c$, t3$c$, t4$c$, t5$c$, t6$c$, t7$c$, and t8$c$, the second driving signals may be simultaneously supplied to the first sensors TX1 to TX4. In this case, the second sensors RX1 to RX4 may receive a separate reference signal (e.g., a ground voltage) or may be in a floating state. Each of the second driving signals may include the rising transition and/or the falling transition.

The first sensors TX1 to TX4 may have self-capacitance. In this case, when the object OBJ such as a user's finger is close to the first sensors TX1 to TX4, the self-capacitance of the first sensors TX1 to TX4 may change according to an object surface OE and the formed capacitance. The second driving signal to which the self-capacitance is reflected may be referred to as a second sensing signal (e.g., a second sampling signal). The touch position of the object OBJ in the second direction DR2 may be detected based on the difference between the second sensing signals of the first sensors TX1 to TX4 (see FIG. 3).

Referring to FIG. 8, the second self-sensing period SRP may be a period in which the sensor layer 120 and the sensor driver 220 are driven in the self-capacitance mode. In the second self-sensing period SRP, the sensor transmitter TDC may be connected to the second input terminal IN2 of each sensor channel 222, and a corresponding second sensor RX may be connected to the first input terminal IN1 of each sensor channel 222.

For example, during the second self-sensing period SRP, the sensor transmitter TDC may supply the third driving signal to the second input terminal IN2 of each sensor channel 222. In this case, the third driving signal may be supplied to the second sensor RX connected to the first input terminal IN1 according to the characteristics of the operational amplifier AMP. In an embodiment, the sensor driver 220 may simultaneously supply the third driving signals to the second sensors RX1 to RX4 during the second self-sensing period SRP. For example, referring to FIG. 8, at times t1d, t2d, t3d, t4d, t5d, t6d, t7d, and t8d, the third driving signals may be simultaneously supplied to the second sensors RX1 to RX4. In this case, the first sensors TX1 to TX4 may receive a separate reference signal (e.g., a ground voltage) or may be in a floating state. Each of the third driving signals may include the rising transition and/or the falling transition.

The second sensors RX1 to RX4 may have self-capacitance. In this case, when the object OBJ such as a user's finger is close to the second sensors RX1 to RX4, the self-capacitance of the second sensors RX1 to RX4 may change according to an object surface OE and the formed capacitance. The third driving signal to which the self-capacitance is reflected may be referred to as a third sensing signal (e.g., a third sampling signal). The touch position of the object OBJ in the first direction DR1 may be detected based on the difference between the third sensing signals of the second sensors RX1 to RX4 (see FIG. 3).

Figure 9:
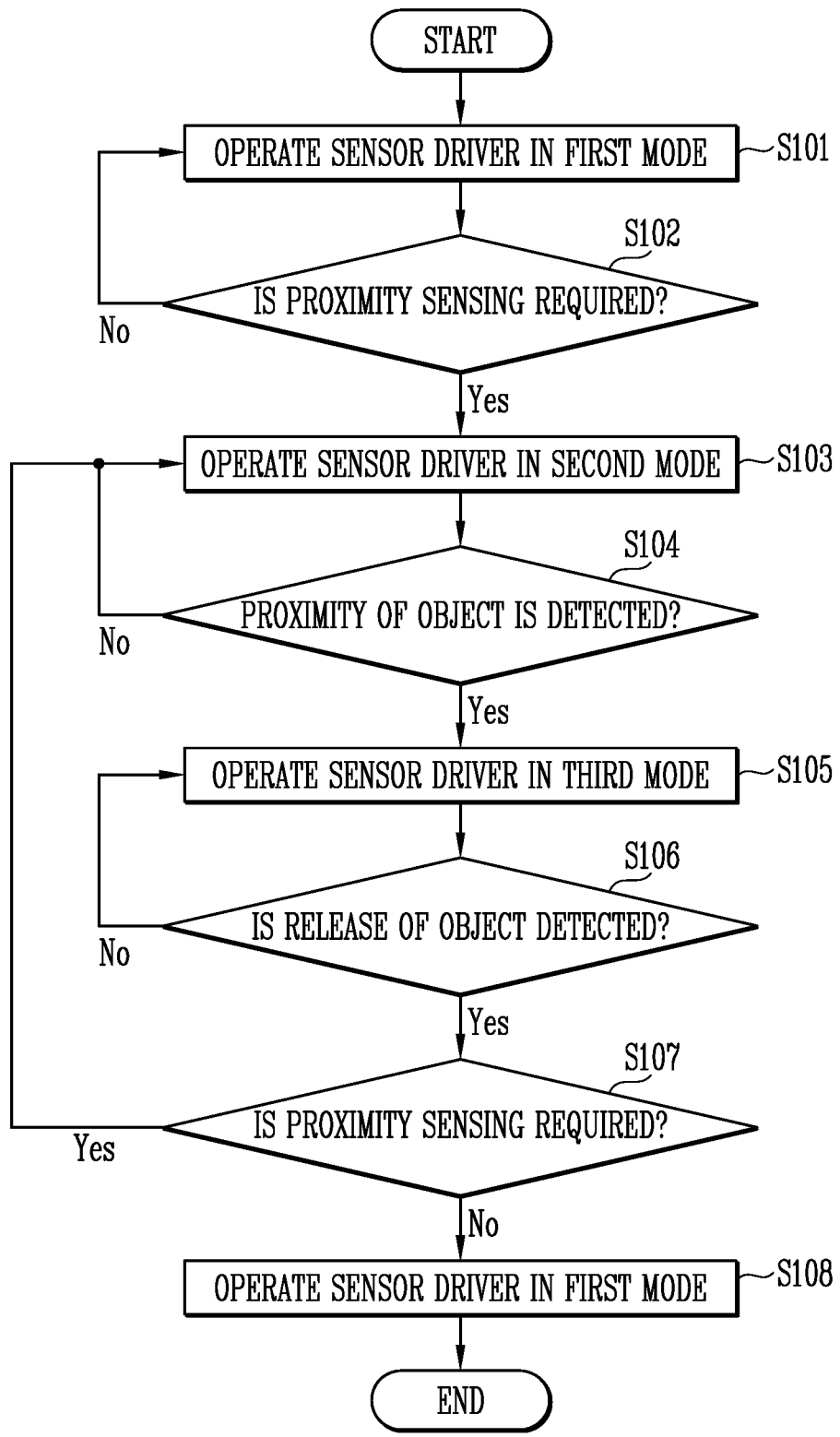
FIG. 9 is a flowchart illustrating an embodiment of a method of driving the display device of FIG. 1 according to the principles of the invention.
Figure 10:
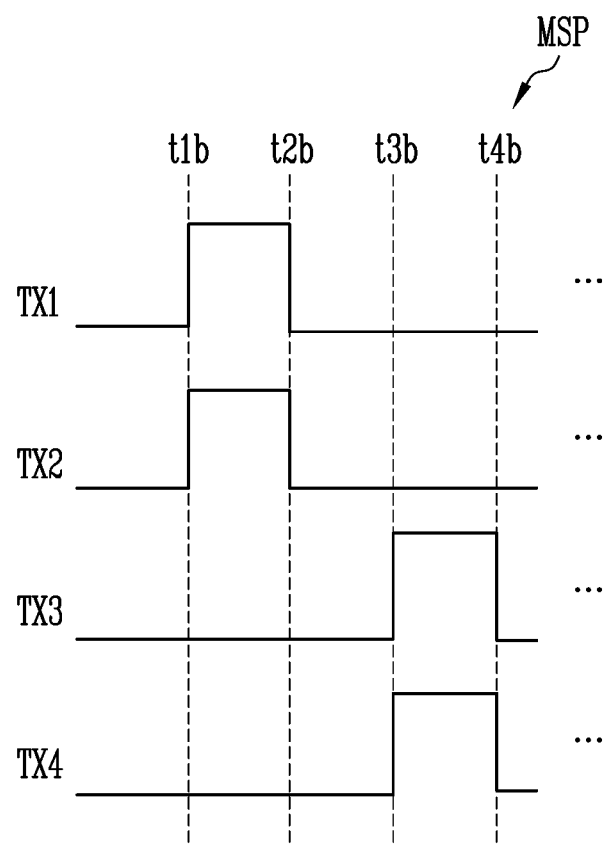
FIGS. 10 and 11 are diagrams for explaining a sensing method in a second mode and a third mode.
Figure 11:
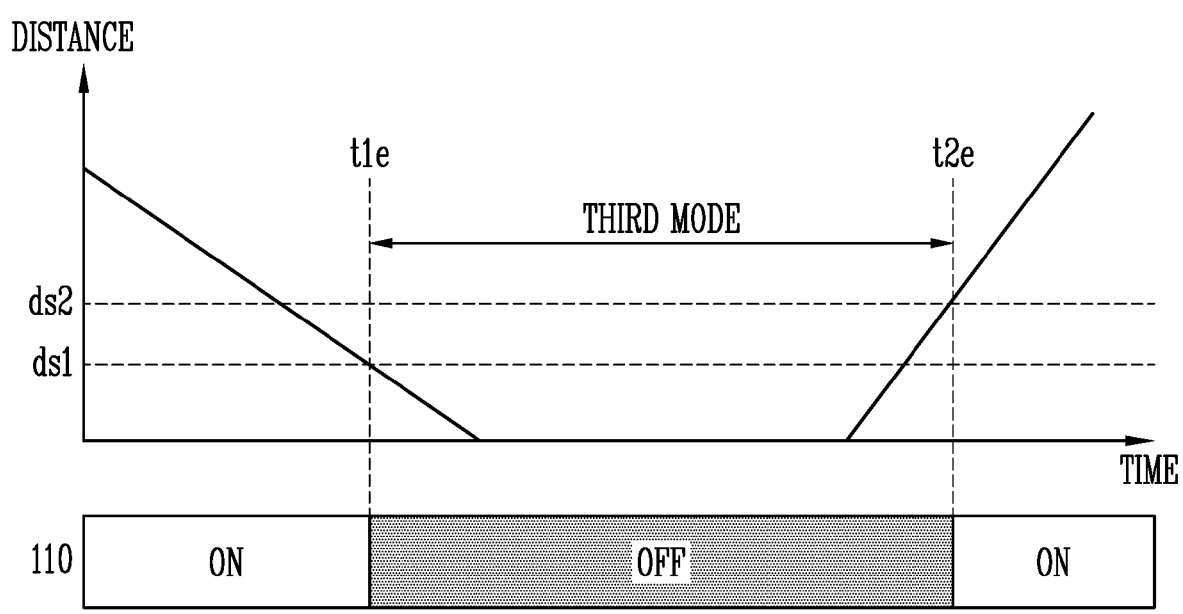

FIG. 9 is a flowchart illustrating a method of driving a display device in accordance with embodiments. FIGS. 10 and 11 are diagrams for explaining a sensing method in a second mode and a third mode.

Referring to FIGS. 1 and 9 to 11, the sensor driver 220 (or the display device 1) may be operated in the first mode (S101). The first mode may be a mode for general touch position sensing. For example, the sensor driver 220 may determine at which position (e.g., coordinate) of the sensor layer 120 the touch of the object OBJ occurs according to the sensing frequency (e.g., sensing rate or report rate). For example, when the sensing frequency is 120 Hz, the sensor driver 220 may generate touch coordinates (e.g., sensing results) 120 times per second. The sensing frame period is a period for generating one touch coordinate, which may correspond to a reciprocal of a sensing frequency. For example, when the sensing frequency is 120 Hz, the sensing frame period may be 1/120 second.

In the first mode, the sensor driver 220 may be driven according to at least one of the mutual sensing period MSP, the first self-sensing period STP, and the second self-sensing period SRP for the entire sensing area SA of the sensor layer 120 (see FIGS. 5, 7, and 8). For example, in the first mode, each sensing frame period may include at least one of a mutual sensing period (MSP), a first self-sensing period (STP), and a second self-sensing period (SRP).

The sensor driver 220 may transmit a driving signal on the basis of p number of sensors to the sensing area SA of the sensor layer 120 in the first mode, where p is a positive integer. For example, the sensor driver 220 may transmit a driving signal on the basis of the p number of sensors to the entire sensing area SA of the sensor layer 120 in the first mode.

For example, referring to FIG. 5, since the driving signal is transmitted at a different timing to each of the first sensors in the mutual sensing period MSP, P may be 1. In the display device including tens to hundreds of first sensors TX, P may be approximately 4. For example, the driving signals may be simultaneously supplied to the four first sensors TX1 to TX4, and then the driving signals may be simultaneously supplied to the next four first sensors.

While the display device 1 is operating in the first mode, a case in which proximity sensing is required may occur (S102). For example, a case in which a user presses a call button in a phone application of the display device 1 may be a case in which proximity sensing is required. For example, when the call button is pressed in the phone application, it may be expected that a user's ear or cheek is in touch therewith. In this case, it may be unnecessary to provide an image to the user. For example, the proximity sensing may be required to determine when an image is not to be displayed through the display panel 110.

When it is determined that proximity sensing is necessary, the sensor driver 220 may be operated in the second mode (S103). The second mode may be a mode for detecting that the object OBJ approaches during proximity sensing.

In an embodiment, the sensor driver 220 may perform proximity sensing on at least a portion of the sensing area SA in a second mode. As will be described later with reference to FIGS. 17 and 18, the sensor driver 220 may perform proximity sensing on a portion of the sensing area SA except for the area (i.e., the touch area) where the touch input is generated. This is because the touch input may affect proximity sensing. For example, a change in capacitance may occur in the touch area by the touch input, and such a change in capacitance may also be reflected in a change in capacitance for proximity sensing. For example, this is because, even though there is no proximity of the object OBJ (i.e., the additional proximity of the object OBJ other than the touch), it may be erroneously determined as the proximity of the object OBJ due to the influence of the touch input. In order to exclude the influence of touch input on proximity sensing, the sensor driver 220 may perform proximity sensing on only a remaining portion of the sensing area SA except for the touch area (i.e., the area where the touch input is generated).

In addition, since it is necessary to sense the touch input even in the second mode, it is necessary to sense a touch by a finger or the like rather than a large-area conductor such as a user's face, for example. For example, after the user presses the call button in the phone application of the display device 1, the user may press a call cancel button or the like instead of bringing the user's face close to the display device 1. Therefore, the sensor driver 220 may sense a touch input or sense a touch position with respect to the entire sensing area SA, even in the second mode. For example, the sensor driver 220 may alternately perform proximity sensing of a portion of the sensing area SA and touch position sensing of the entire sensing area SA, in the second mode. In the second mode, touch position sensing and proximity sensing may be temporally/spatially combined in various ways according to embodiments. A more specific operation of the sensor driver 220 in the second mode will be described later with reference to FIGS. 17 and 18.

The sensor driver 220 may transmit a driving signal on the basis of q number of sensors for proximity sensing in the second mode, where q is a positive integer. In the proximity sensing, it is more important to determine a separation distance between the object OBJ and the sensor layer 120 than to determine the touch position. Of course, even in the case of proximity sensing, the sensor driver 220 may determine the touch position more roughly compared to the touch position sensing. q may be an integer greater than p. For example, referring to FIG. 10, q may be 2. Referring to FIG. 10, first, driving signals may be supplied to two first sensors TX1 and TX2 (t1b and t2b), and then driving signals may be supplied to two first sensors TX3 and TX4 (t3b, t4b). The proximity sensing according to an embodiment, referring to FIG. 10, may be stronger in electric field at each time than the touch position sensing as described referring to FIG. 5. For example, even in a state in which the object OBJ is hovered, the distance between the sensor layer 120 and the object OBJ may be calculated. In the display device including tens to hundreds of first sensors TX, q may be approximately 10. For example, the driving signals may be simultaneously supplied to the ten first sensors TX, and then the driving signals may be simultaneously supplied to the next ten first sensors TX. In an embodiment, the mutual capacitance mode may be used in proximity sensing. In an embodiment, the self-capacitance mode may be used in proximity sensing.

The sensor driver 220 may detect the proximity of the object OBJ while operating in the second mode (S104). Referring to FIG. 11, an exemplary graph showing a distance per time between the sensor layer 120 and the object OBJ, detected by the sensor layer 120, is illustrated. For example, at time t1e when the distance between the sensor layer 120 and the object OBJ corresponds to a first threshold distance ds1 (or a first reference distance), the sensor driver 220 may determine that the object OBJ sufficiently approaches. Before the time t1e, the display panel 110 may display an image or the pixel PX may emit light in a display state (ON). After the time t1e, the display panel 110 may not display an image or the pixel PX may not emit light in a non-display state (OFF). For example, when the user's ear or cheek approaches the sensing area SA, the user cannot see the display panel 110, so there is no problem when the display panel 110 does not display an image.

In the case of detecting the proximity of the object OBJ, the sensor driver 220 may be operated in the third mode (S105). For example, the sensor driver 220 may be operated by changing the mode from the second mode to the third mode in response to the object OBJ approaching the sensor layer 120 by the first threshold distance ds1.

The third mode may be a mode for detecting that the object OBJ releases during proximity sensing. For example, the sensor driver 220 may perform proximity sensing on at least a portion of the sensing area SA in the third mode (see FIG. 10). According to some embodiments, in the third mode, the sensor driver 220 may perform proximity sensing only on the area (i.e., the area in which proximity occurs at the time t1e) in which proximity occurs in the sensing area SA, and may not perform any sensing operation on the remaining areas. For example, this is because it is expected that no interaction will occur until the end of the call since the user continues to talk by putting his or her ear or cheek on the display device 1, in the third mode. However, embodiments are not limited thereto. For example, even in the third mode, the sensor driver 220 may perform touch position sensing on the entire sensing area SA. Similarly to the second mode, touch position sensing and proximity sensing may be temporally/spatially combined in various ways according to embodiments.

In an embodiment, the third mode may be a mode for detecting the biometric information of the object OBJ. For example, the sensor driver 220 may measure the biometric information on at least a portion of the sensing area SA in the third mode. The biometric information may be the hydration of the object OBJ. Hereinafter, the biometric information will be described as the hydration.

For reference, various techniques for measuring the skin hydration have been disseminated, and a skin hydration sensor (e.g., Corneometer™) for measuring the skin hydration by using a change in the capacitive type is present. In case that the object OBJ such as the skin approaches or contacts the display device 1 within a specific distance (e.g., the first threshold distance ds1), the hydration may be measured based on a change in capacitance between the first and second sensors TX and RX. In other words, the hydration may be measured by using different changes in capacitance according to the hydration. The technique for measuring the hydration based on the change in capacitance may be implemented as separate software to be embedded in the application processor 30.

In the third mode, the sensor driver 220 may measure biometric information on the area (i.e., the area in which proximity occurs at the time t1e) in which proximity occurs in the sensing area SA.

In particular, even when the object OBJ does not contact the display device 1 (e.g., the sensor layer 120), the sensor driver 220 may automatically measure the biometric information of the object OBJ in response to the object OBJ approaching within the first threshold distance ds1. For example, the biometric information of the object OBJ may be measured without a separate request for approval for the biometric information measurement.

Further, the sensor driver 220 may acquire a sensing signal (e.g., sensing data or information) for measuring the biometric information, even in a state where the object OBJ is in contact with the display device 1 (e.g., the sensor layer 120) as well as a state where the object OBJ and the display device 1 (e.g., the sensor layer 120) do not contact each other. In comparison with a case of measuring the biometric information only when the object OBJ contacts the display device 1 (e.g., the sensor layer 120), more sensing data for measuring the biometric information may be obtained, and thereby the biometric information of the object OBJ may be more accurately measured. For example, a difference may occur in biometric information (e.g., hydration) of the object OBJ according to the contact condition of the object OBJ with the display device 1. Such a difference may be corrected based on sensing data acquired in a non-contact state of the object OBJ.

In the third mode, proximity sensing and biometric information measurement may be temporally/spatially combined in various ways according to embodiments.

As a charge quantity charged between the first and second sensors TX and RX increases, the resolution of the hydration measurement may be increased or improved.

The sensor driver 220 may transmit a driving signal to a first sensing area PSA1 on the basis of r number of sensors in the third mode. Here, r may be an integer greater than p. For example, referring to FIG. 10, r may be 2. Referring to FIG. 10, first, driving signals may be supplied to two first sensors TX1 and TX2 (t1b and t2b), and then driving signals may be supplied to two first sensors TX3 and TX4 (t3b, t4b).

q in the second mode and r in the third mode may be different from each other. For example, r may be greater than q. Thus, the release of the object OBJ in the third mode may be detected more quickly and accurately than the proximity of the object OBJ in the second mode. However, embodiments are not limited thereto. According to some embodiments, q and r may be equal to each other.

The sensor driver 220 may detect the release of the object OBJ while operating in the third mode (S106). For example, referring to FIG. 11, at time t2e when the distance between the sensor layer 120 and the object OBJ corresponds to a second threshold distance ds2 (e.g., a second reference distance), the sensor driver 220 may determine that the object OBJ sufficiently releases. In an embodiment, the second threshold distance ds2 may be greater than the first threshold distance ds1. Thus, the third mode may not be released when the user unintentionally comes his/her body away from the display device 1 for a while during a call, thereby helping the user's convenience. After the time t2e, the display panel 110 may display an image in a display state.

After the time t2e, the sensor driver 220 may be operated in the first mode (S107, S108) or be operated in the second mode (S107, S103) according to the scenario of the display device 1. For example, the sensor driver 220 may be switched from the third mode to the second mode (or the first mode) to be operated in response to the object OBJ releasing from the sensor layer 120 by the second threshold distance ds2.

In embodiments, the sensor driver 220 may differently set the characteristics of the driving signal in the first, second, and third modes. Here, the characteristics of the driving signal may include at least one of a voltage magnitude, a frequency (e.g., toggling frequency of the driving signal), and the number of simultaneous transmission lines (i.e., the number of lines or sensors to which the driving signal is simultaneously applied). Also, the sensor driver 220 may differently set the sensing frequency (e.g., sensing rate or report rate) or the number of sensing per sensing frame period in the first, second, and third modes. This will be described below in detail with reference to FIGS. 12 to 33.

Figure 13:
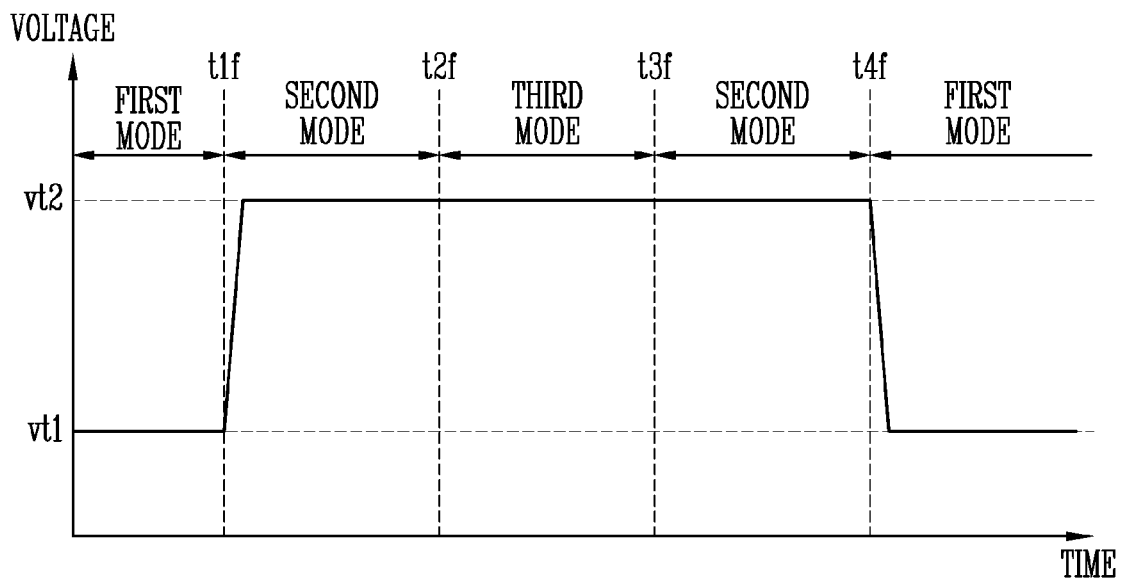
FIG. 13 is a diagram for explaining a voltage magnitude of the driving signal which is set in each of the first, second, and third modes.

FIG. 12 is a diagram for explaining characteristics of a driving signal which is set in each of the first, second, and third modes. FIG. 13 is a diagram for explaining a voltage magnitude of the driving signal which is set in each of the first, second, and third modes.

Referring to FIGS. 1 to 12, a target of touch sensing (e.g., touch position sensing) in the first mode may be a user's finger. In the second mode and/or the third mode, a target of proximity sensing may be a large-area conductor such as a user's cheek or face. Similarly, in the third mode, the target of biometric information measurement may be a large-area conductor such as the user's cheeks and face.

In embodiments, the sensor driver 220 may differently set the voltage magnitude of the driving signal in the first, second, and third modes.

For example, in the first mode (or in the first, second, and third modes), the driving signal (e.g., the first driving signal) for touch sensing may have a first voltage V1 (e.g., the maximum voltage of the driving signal is a first voltage level). In the second mode (or in the second and third modes), the driving signal (e.g., the second driving signal) for proximity sensing may have a second voltage V2 (e.g., a second voltage level). In the third mode, the driving signal (e.g., a third driving signal) for measuring biometric information may have a third voltage V3 (e.g., a third voltage level).

The second voltage V2 may be greater than or equal to the first voltage V1, and the third voltage V3 may be greater than or equal to the second voltage V2. Since the voltage magnitude of the driving signal for the touch position sensing is less than or equal to the voltage magnitude of the driving signal for the proximity sensing, unnecessary proximity sensing may be excluded, and only a touch position with the object OBJ contacting the display device 1 may be accurately detected. Since the voltage magnitude of the driving signal for the proximity sensing is greater than or equal to the voltage magnitude of the driving signal for the touch position sensing, the proximity of the object OBJ or a distance between the sensor layer 120 and the object OBJ may be more accurately detected even though the object OBJ is spaced apart from the display device 1 (e.g., even though the change in capacitance due to the object OBJ is not large in a state where the object OBJ is spaced apart from the display device 1). Similarly, since the voltage magnitude of the driving signal for the biometric information measurement is greater than or equal to the voltage magnitude of the driving signal for the proximity sensing, the biometric information (e.g., the hydration) of the object OBJ may be more accurately detected.

Referring to FIG. 13, for example, the sensor driver 220 may be set such that the voltage magnitude vt2 of the driving signal (e.g., the driving signals for the proximity sensing and the biometric information measurement) of the second and third modes is greater than the voltage magnitude vt1 of the driving signal (e.g., the driving signal for the touch position sensing) of the first mode.

In embodiments, the sensor driver 220 may differently set the frequency (e.g., the toggling frequency) of the driving signal in the first, second, and third modes. The frequency of the driving signal may be kHz, but embodiments are not limited thereto.

For example, the driving signal for the touch sensing may have a first frequency F1 in the first mode (or the first, second, and third modes), the driving signal for the proximity sensing may have a second frequency F2 in the second mode (or the second and third modes), and the driving signal for the biometric information measurement may have a third frequency F3 in the third mode. The second frequency F2 may be less than or equal to the first frequency F1, and the third frequency F3 may be less than or equal to the second frequency F2. According to the relationship of the first, second, and third frequencies F1, F2, and F3, touch position sensing, proximity sensing, and biometric information measurement may be more accurately performed in each of the first, second, and third modes.

In embodiments, the sensor driver 220 may differently set the number of the simultaneous transmission lines of the driving signal in the first, second, and third modes.

For example, the driving signal for the touch sensing may be simultaneously supplied to p number of first sensors TX in the first mode (or the first, second, and third modes), the driving signal for the proximity sensing may be simultaneously supplied to q number of first sensors TX in the second mode (or the second and third modes), and the driving signal for the biometric information measurement may be simultaneously supplied to r number of first sensors TX in the third mode. As described above, q may be greater than or equal to p, and r may be greater than or equal to q. Since the electric field in the second mode is stronger than the electric field in the first mode, the distance between the sensor layer 120 and the object OBJ may be calculated. Similarly, since the electric field in the third mode is stronger than the electric field in the second mode, the biometric information of the object OBJ may be measured.

Figure 14:
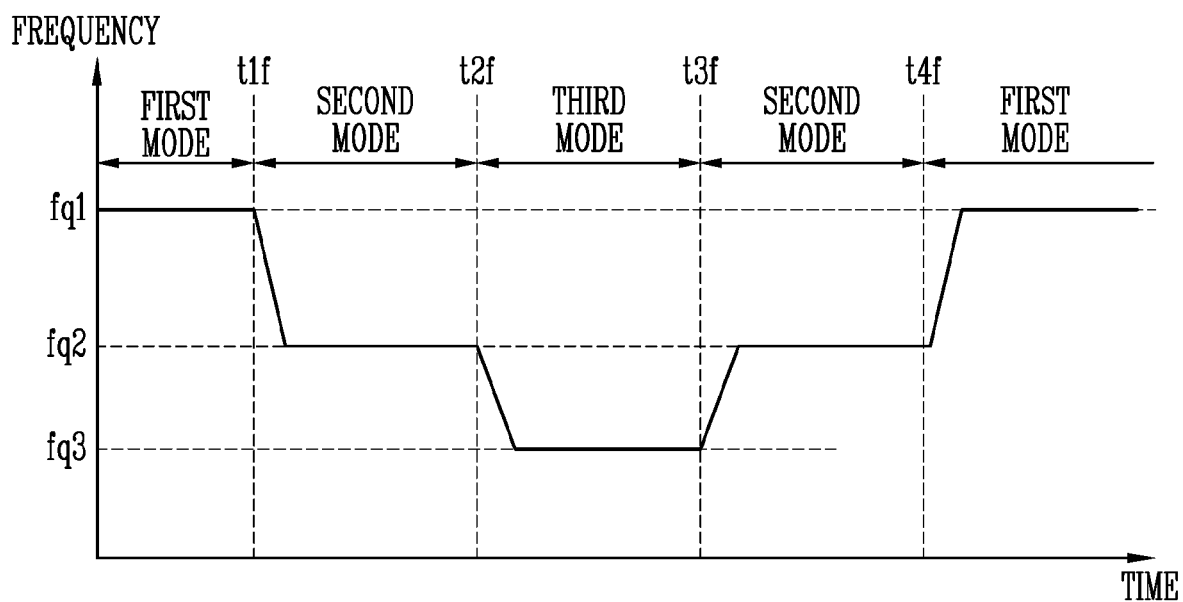
FIGS. 14, 15, and 16 are diagrams for explaining a frequency of the driving signal which is set in each of the first, second, and third modes.
Figure 15:
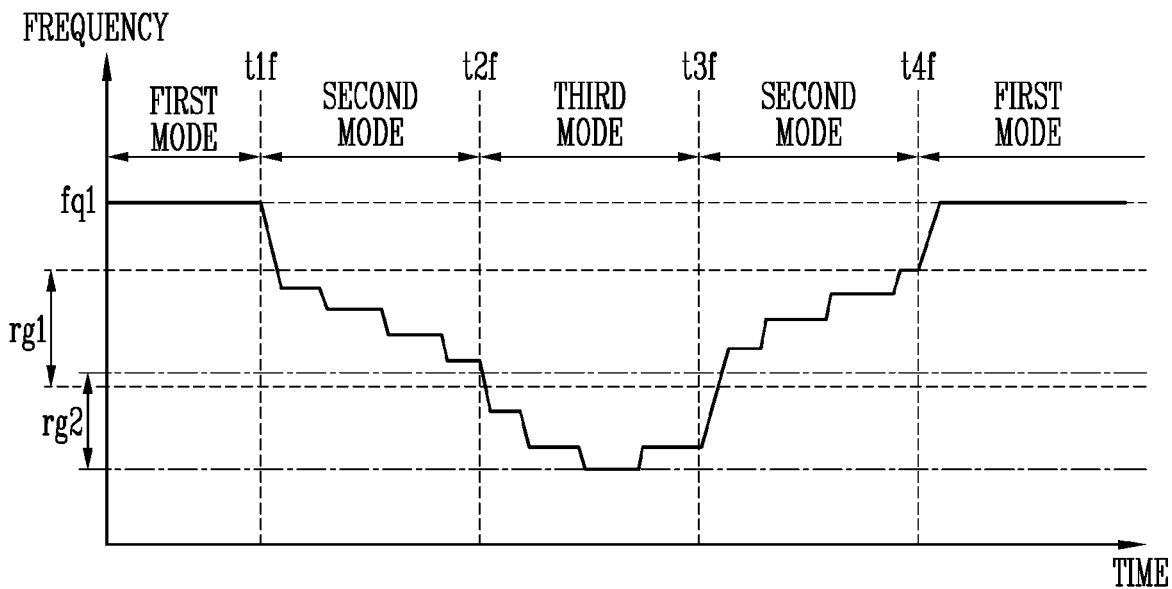
Figure 16:
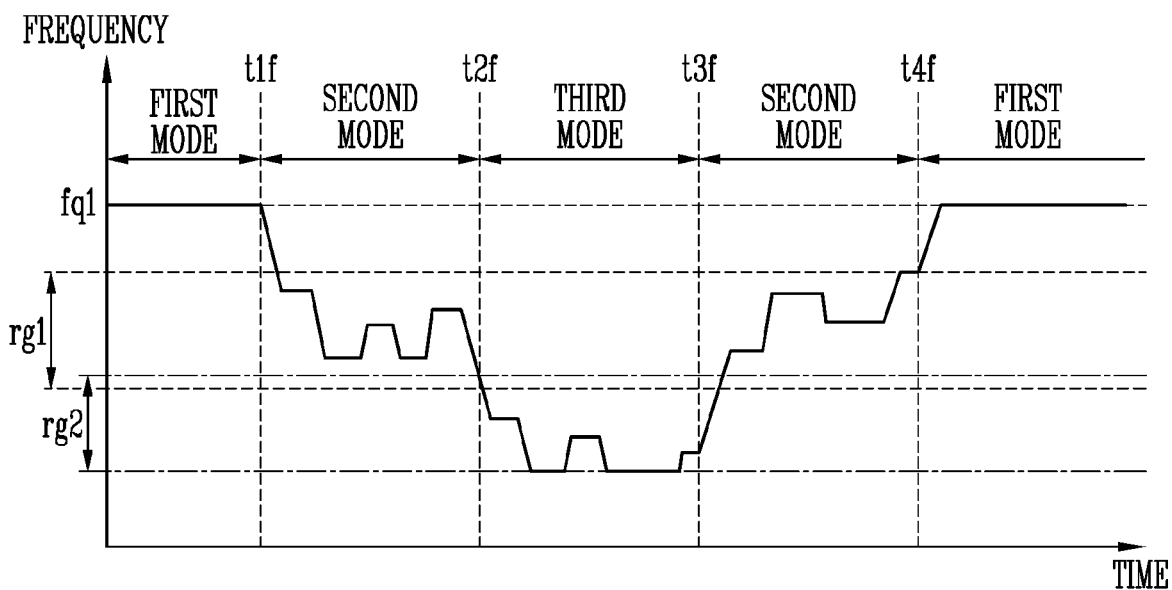

FIGS. 14, 15, and 16 are diagrams for explaining a frequency of the driving signal which is set in each of the first, second, and third modes.

Referring to FIGS. 1, 12, 14 to 16, the frequency (e.g., the toggling frequency) of the driving signal set in each of the first, second, and third modes is illustrated.

In an embodiment, the sensor driver 220 may be set such that a frequency fq2 of the driving signal (e.g., the driving signal for the proximity sensing) in the second mode is lower than a frequency fq1 of the driving signal (e.g., the driving signal for the touch position sensing) in the first mode.

Therefore, the touch position and the separation distance between the sensor layer 120 and the object OBJ may be more accurately detected.

Further, a frequency fq3 of the driving signal (e.g., the driving signal for the proximity sensing and the biometric information measurement) in the third mode may be set to be lower than the frequency fq2 of the driving signal in the second mode. Thus, the biometric information of the object OBJ may be measured more accurately. Further, the release of the object OBJ in the third mode may be detected more quickly and accurately than the proximity of the object OBJ in the second mode.

Referring to FIG. 15, in an embodiment, the sensor driver 220 may be set such that the frequency of the driving signal is gradually changed within a first frequency range rg1 in the second mode, and the frequency of the driving signal is gradually changed within a second frequency range rg2 in the third mode. For example, the sensor driver 220 may be set such that the frequency of the driving signal is changed step by step within the first frequency range rg1 in the second mode, and the frequency of the driving signal is changed step by step within the second frequency range rg2 in the third mode.

A lower limit frequency of the second frequency range rg2 may be lower than a lower limit frequency of the first frequency range rg1. An upper limit frequency of the first frequency range rg1 may be higher than an upper limit frequency of the second frequency range rg2. The upper limit frequency of the first frequency range rg1 may be lower than the frequency fq1 of the first mode. According to an embodiment, the first frequency range rg1 and the second frequency range rg2 may partially overlap. In an embodiment, the first frequency range rg1 and the second frequency range rg2 may not overlap each other.

Referring to FIG. 16, in an embodiment, the sensor driver 220 may be set such that the frequency of the driving signal is irregularly changed within the first frequency range rg1 in the second mode, and the frequency of the driving signal is irregularly changed within the second frequency range rg2 in the third mode. For example, the sensor driver 220 may be set such that the frequency of the driving signal is repeatedly reduced and increased within the first frequency range rg1 in the second mode (e.g., frequency hopping), and the frequency of the driving signal is repeatedly reduced and increased within the second frequency range rg2 in the third mode.

According to an embodiment of FIGS. 15 and 16, the sensor driver 220 may find an optimal frequency for the current environment in each of the first, second, and third modes. For example, the sensor driver 220 may find the optimal frequency by avoiding main noise frequencies of the current environment in each of the first, second, and third modes.

Although FIGS. 14, 15, and 16 illustrate embodiments in which the sensor driver 220 sets the frequency (e.g., the toggling frequency) of the driving signal, embodiments are not limited thereto. For instance, the sensor driver 220 may also apply the frequency shown in FIGS. 14, 15, and 16 to the sensing frequency (e.g., sensing rate or report rate).

Referring to FIG. 14, for example, the sensor driver 220 may be set the sensing frequency (e.g., fq2) of the second mode to be lower than the sensing frequency (e.g., fq1) of the first mode. Therefore, the sensing frame period in the second mode is longer than the sensing frame period in the first mode. Thus, the sensor driver 220 may use data based on sensing signals more than those of the first mode in each sensing frame period of the second mode, and may more accurately detect the separation distance between the sensor layer 120 and the object OBJ in the second mode. Also, the sensor driver 220 may set the sensing frequency (e.g., fq3) of the third mode to be lower than the sensing frequency (e.g., fq2) of the second mode. Therefore, the sensing frame period in the third mode is longer than the sensing frame period in the second mode. Thus, the sensor driver 220 may more accurately detect the biometric information of the object OBJ in the third mode, and may more accurately detect the separation distance between the sensor layer 120 and the object OBJ.

Referring to FIGS. 15 and 16, for example, the sensor driver 220 may be set such that the sensing frequency of the second mode is gradually or irregularly changed within a specific range (e.g., the first frequency range rg1), and the sensing frequency of the third mode is gradually or irregularly changed within a specific range (e.g., the second frequency range rg2). Thereby, the sensor driver 220 may find an optimal sensing frequency for the current environment in each of the first, second, and third modes. For example, the sensor driver 220 may find the optimal sensing frequency by avoiding main noise frequencies of the current environment in each of the first, second, and third modes.

Figure 17:
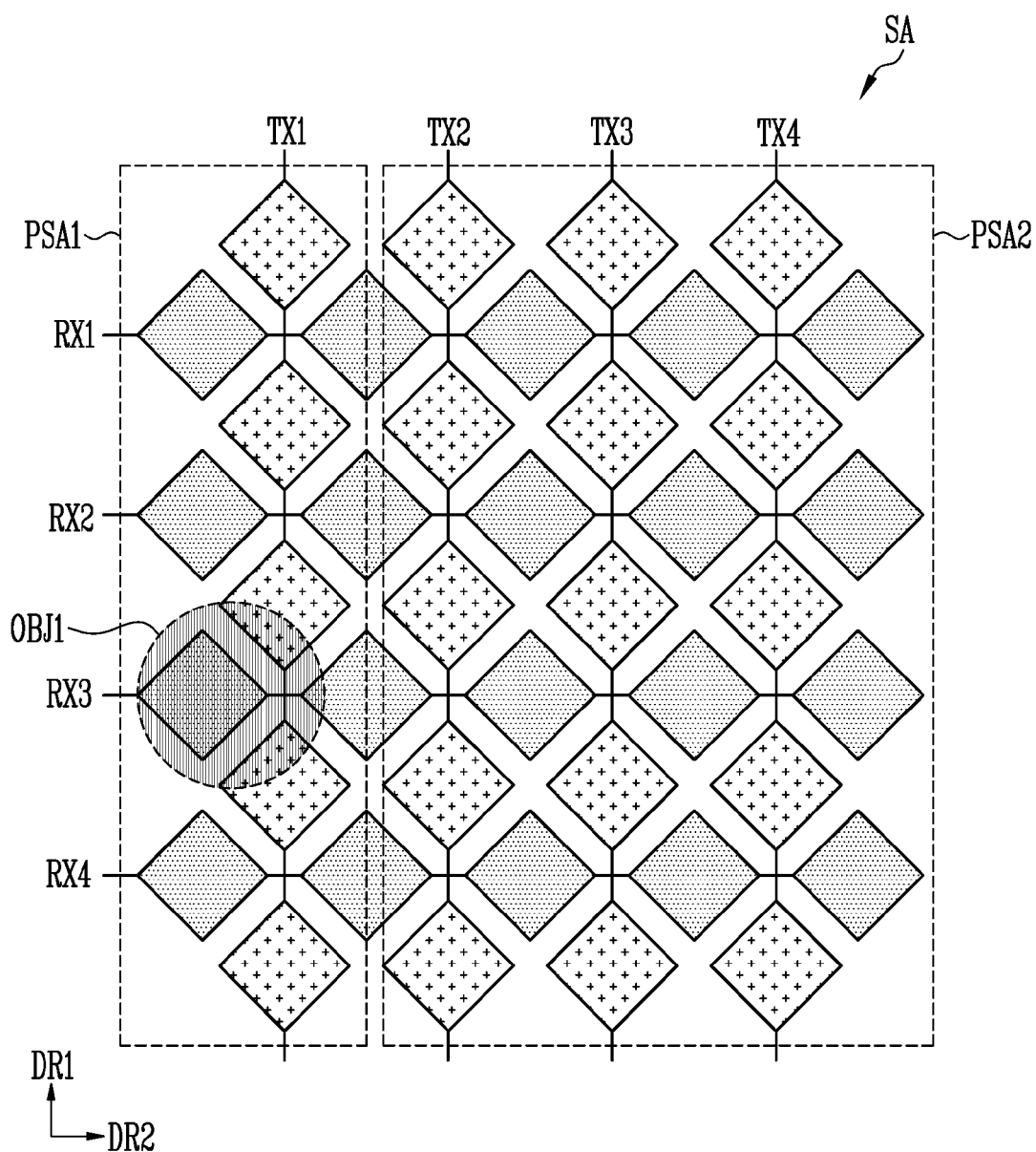
FIG. 17 is a diagram for explaining a sensing area in the second mode and the third mode.
Figure 18:
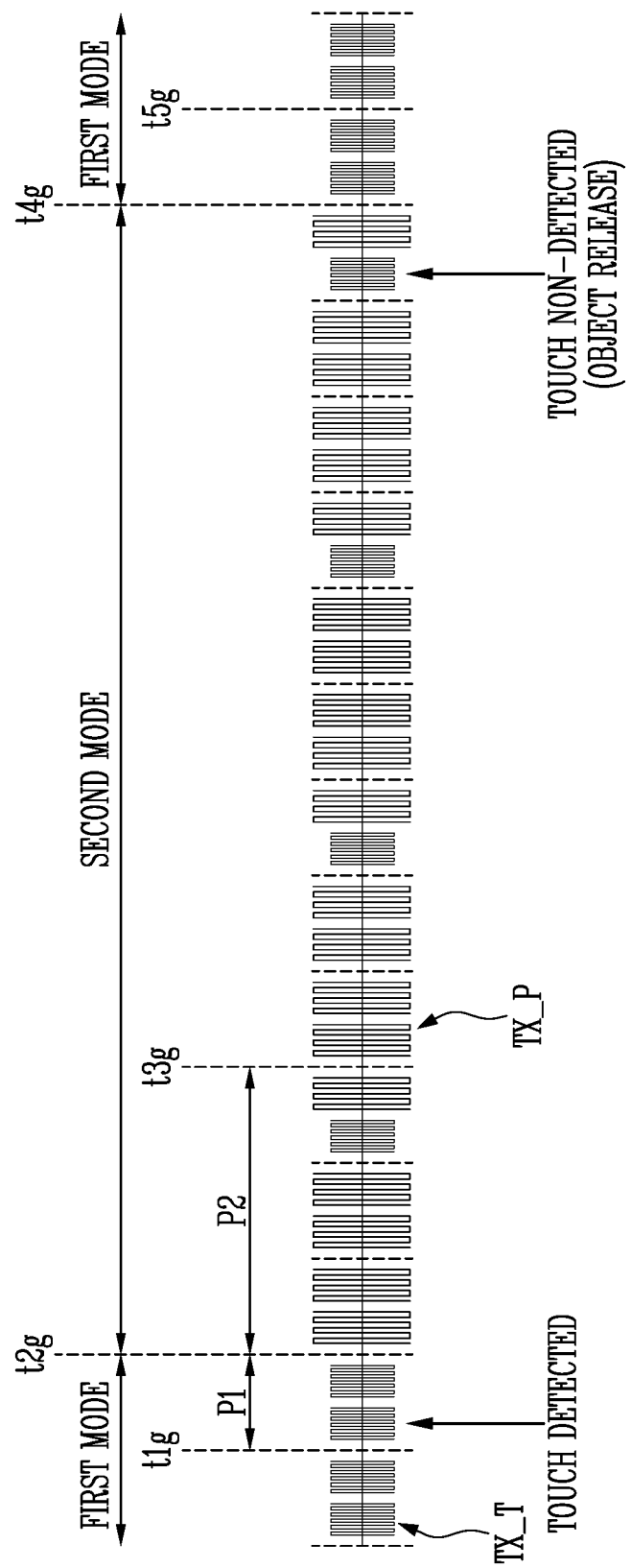
FIG. 18 is a waveform diagram illustrating an example of a driving signal which is set in the second mode.
Figures 19, 20:
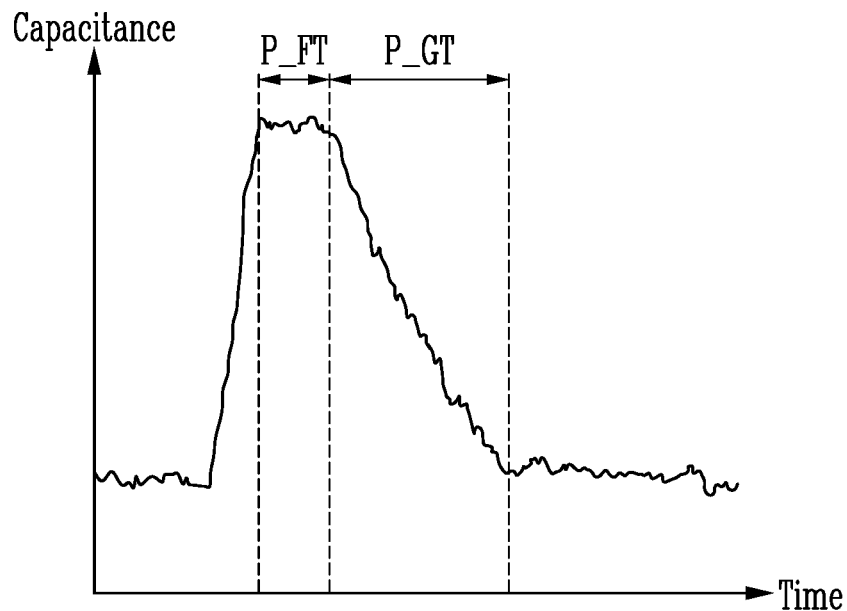
FIG. 19 is a diagram for explaining a change in capacitance according to a touch input.
FIG. 20 is a diagram illustrating signal processing performed in each of the first, second, and third modes and elements for performing the signal processing.

FIG. 17 is a diagram for explaining a sensing area in second and third modes. FIG. 18 is a waveform diagram illustrating an embodiment of a driving signal which is set in the second mode. FIG. 19 is a diagram for explaining a change in capacitance according to a touch input.

Referring to FIGS. 1 to 3 and FIGS. 17 to 19, the sensing area SA may be divided into a first sensing area PSA1 and a second sensing area PSA2 based on the touch position.

For example, when a touch input occurs at a position corresponding to the first sensor TX1 by the first object OBJ1 (e.g., a finger), the first sensing area PSA1 may be an area corresponding to the first sensor TX1 in the sensing area SA, and the second sensing area PSA2 may be an area other than the first sensing area PSA1. For example, the second sensing area PSA2 may be an area corresponding to the remaining first sensors TX2 to TX4 except for the first sensor TX1.

As described above, when a change in capacitance occurs by the first object OBJ1, the change in capacitance may also affect proximity sensing. Thus, during proximity sensing, by excluding the area where the touch is generated by the first object OBJ1, (e.g., the first sensing area PSA1), in other words, by performing proximity sensing only on the second sensing area PSA2, an erroneous determination of proximity sensing due to the first object OBJ1 may be prevented.

As shown in FIG. 18, the sensor driver 220 may operate in the first mode, and may provide the driving signal TX_T (e.g., the first driving signal) for sensing the touch position to the first sensors TX1 to TX4.

The sensor driver 220 may detect a touch by the first object OBJ1 in the first period P1. In this case, the sensor driver 220 may operate by switching the mode from the first mode to the second mode, and apply the driving signal TX_P (e.g., the second driving signal) to at least some of the first sensors TX1 to TX4 in the proximity sensing. For example, the sensor driver 220 may the driving signal TX_P for the proximity sensing to the remaining first sensors TX2 to TX4 other than the first sensor TX1 (i.e., the first sensor TX1 corresponding to the first object OBJ1).

In the first mode, the sensing frame period may correspond to the first period P1 (i.e., the period between the first time t1g and the second time t2g). In the second mode, the sensing frame period may correspond to the second period P2 (i.e., the period between the second time t2g and the third time t3g). The second period P2 may be longer than the first period P1. For example, for more accurate proximity sensing using data based on more sensing signals, the second period P2 (i.e., the sensing frame period in the second mode) may be set to be longer than the first period P1 (i.e., the sensing frame period in the first mode).

Further, as will be described with reference to FIG. 12, the characteristics of the driving signal TX_P for proximity sensing in the second mode may be different from characteristics of the driving signal TX_T for touch-position sensing in the first mode (and the second mode). For example, the voltage magnitude of the driving signal TX_P for proximity sensing may be greater than the voltage magnitude of the driving signal TX_T for touch-position sensing. For example, the frequency (e.g., toggling frequency) of the driving signal TX_P for proximity sensing may be lower than the frequency of the driving signal TX_T for touch-position sensing.

In some embodiments, the sensor driver 220 may alternate the driving signal TX_P for proximity sensing and the driving signal TX_T for touch-position sensing in the second mode at least once to transmit it to at least some of the first sensors TX1 to TX4.

In an embodiment, the sensor driver 220 may provide the driving signal TX_T for touch-position sensing in the second mode to the first sensors TX1 to TX4. The transmission rate and/or the number of transmissions (i.e., the number of transmissions per sensing frame period) of the driving signal TX_T in the second mode may be different from the transmission rate and/or the number of transmissions of the driving signal TX_T in the first mode. For example, the sensor driver 220 may provide the driving signal TX_T for touch-position sensing in the second mode to the first and second sensing areas PSA1 and PSA2 (or to the entire sensing area SA). For example, the transmission rate and the number of transmissions of the driving signal TX_T in the second mode may be less than the transmission rate and the number of transmissions of the driving signal TX_T in the first mode, respectively.

As shown in FIG. 19, when a touch input is generated by the first object OBJ1, capacitance may be changed during a predetermined period in which the touch input is generated. For example, in the touch period P_FT, a larger capacitance (e.g., change in capacitance) may be detected compared to before the touch period P_FT. However, this change in capacitance may be maintained for a specific time (e.g., a ghost period P_GT) after the touch period P_TF. For example, the ghost period P_GT may be several milliseconds. For example, even when the first object OBJ1 contacts and separates from the display device 1 in the touch period P_FT, a change in capacitance due to the first object OBJ1 may remain in the ghost period P_GT. In consideration of this, the sensor driver 220 may reduce the transmission rate and the number of transmissions of the driving signal TX_T for touch sensing in the second mode. Further, as the transmission rate of the driving signal TX_T is lowered, the sensing frequency (i.e., sensing rate or report rate) may also be lowered.

For example, as shown in FIG. 18, the sensor driver 220 may transmit the driving signal TX_T twice during the (single) first period P1 in the first mode. For example, the sensor driver 220 may transmit the driving signal TX_T to the entire sensing area SA twice during the (single) first period P1 in the first mode. For example, the sensor driver 220 may transmit the driving signal TX_T once during the (single) second period P2 in the second mode.

For example, by reducing the transmission rate and/or the number of transmissions of the driving signal TX_T for touch-position sensing in the second mode, power consumption for touch-position sensing may be reduced. At the same time, by increasing the transmission number of proximity sensing for the second sensing area PSA2 and increasing the sensing frame period (or decreasing the sensing frequency), the accuracy of proximity sensing may be improved.

Although FIG. 18 shows that the fifth of the six driving signals TX_T and TX_P is the driving signal TX_T for touch-position sensing in one sensing frame period (e.g., the second period P2) of the second mode, the sequence of the driving signal TX_T is not limited thereto. For example, the driving signal TX_T may be positioned at the end of one sensing frame period of the second mode. The transmission time of the driving signal TX_T may be variously changed within one sensing frame period. Further, FIG. 18 shows that the driving signal TX_T for touch-position sensing is transmitted once, in one sensing frame period (e.g., second period P2) of the second mode, but embodiments are not limited thereto. For example, the number of transmissions of the driving signal TX_T in the second mode may be variously changed, within a range less than or equal to the transmission rate of the driving signal TX_T in the first mode.

As shown in FIG. 18, when a touch is not detected (e.g., the touch of the first object OBJ1 is released) or the release of an object that has approached is detected near a specific time t4g, the sensor driver 220 may operate by switching the mode from the second mode (or the third mode) to the first mode. In case that the mode is switched from the second mode to the first mode, the sensing frame period (i.e., the sensing frame period in the first mode) may correspond to the period between the fourth time t4g and the fifth time t5g, and the sensor driver 220 may transmit only the driving signal TX_T for sensing the touch position as in the first period P1.

As described above, the sensor driver 220 may perform proximity sensing only on the second sensing area PSA2 in which the touch input has not occurred in the second mode, thereby excluding an influence due to the touch input and improving accuracy of proximity sensing. Further, the sensor driver 220 may also perform proximity sensing and touch position sensing using the driving signals TX_T and TX_P in the second mode. The sensor driver 220 may provide the driving signal TX_T for touch-position sensing to the second sensing area PSA2 as well as the first sensing area PSA1 to perform touch-position sensing for the entire sensing area SA.

The sensor driver 220 may decrease the transmission rate and/or the number of transmissions of the driving signal TX_T for touch-position sensing, and also decrease the sensing frequency (e.g., sensing rate or report rate), thereby reducing power consumption for touch-position sensing, and further improving the accuracy of proximity sensing.

The operation of the sensor driver 220 described with reference to FIGS. 17 and 18 may also be applied to the third mode. For example, even in the third mode, the sensor driver 220 may perform proximity sensing and biometric information measurement only for the second sensing area PSA2, and may perform touch-position sensing for the entire sensing area SA.

FIG. 20 is a diagram for explaining elements which perform signal processing in each of the first, second, and third modes.

Referring to FIGS. 1, 9, 12, and 20, in the first mode and the second mode (also in the third mode), data preprocessing of the sensing signal may be performed by the sensor driver 220. For example, as described with reference to FIG. 4, the sensor driver 220 may perform data preprocessing for converting the sensing signal into a digital sensing value (e.g., sensing data).

In the first mode, an operation for sensing the touch position based on the sensing signal that has been preprocessed data may be performed by the sensor driver 220. For example, the sensor driver 220 may calculate or sense the touch position based on the data preprocessed sensing signal, i.e., the sensing data.

In addition, the final determination of the touch position in the first mode may also be performed by the sensor driver 220. In other words, the sensor driver 220 may determine a touch input and a location where the touch input is generated based on the sensing data. The touch position and only information on whether the touch is input may be provided to the application processor 30 (see FIG. 1). Since only information on whether the touch is input in relation to the touch-position sensing and the touch position is transmitted from the sensor driver 220 to the application processor 30, unnecessary data transmission between the sensor driver 220 and the application processor 30 may be prevented or minimized.

In the second mode, the operation for proximity sensing based on the data preprocessed sensing signal may be performed by the application processor 30. Since proximity sensing is a noisy environment compared to touch position sensing, a relatively larger amount of data processing may be required. Thus, an artificial intelligence algorithm for the data processing may be required. To this end, the sensing data for proximity sensing may be transmitted from the sensor driver 220 to the application processor 30.

As described with reference to FIGS. 17 and 18, since proximity sensing is performed not on the entire sensing area SA but only on the second sensing area PSA2, sensing data for proximity sensing may be reduced, compared to a case where proximity sensing is performed on the entire sensing area SA. Thus, only the sensing data on the second sensing area PSA2 (i.e., the area other than the first sensing area PSA1 in the sensing area SA), which is not the sensing area SA, may be transmitted from the sensor driver 220 to the application processor 30, and a data transmission amount between the sensor driver 220 and the application processor 30 may be reduced. In other words, only the sensing signal (e.g., sensing data) corresponding to the driving signal provided to the second sensing area PSA2 for proximity sensing may be transmitted from the sensor driver 220 to the application processor 30.

In FIG. 20, it has been described that the data transmission amount between the sensor driver 220 and the application processor 30 is reduced in the second mode. However, embodiments are not limited thereto. For example, even when sensing data is generated only for the second sensing area PSA2 instead of the entire sensing area SA to measure biometric information in the third mode, the data transmission amount between the sensor driver 220 and the application processor 30 may be reduced.

Figure 21:
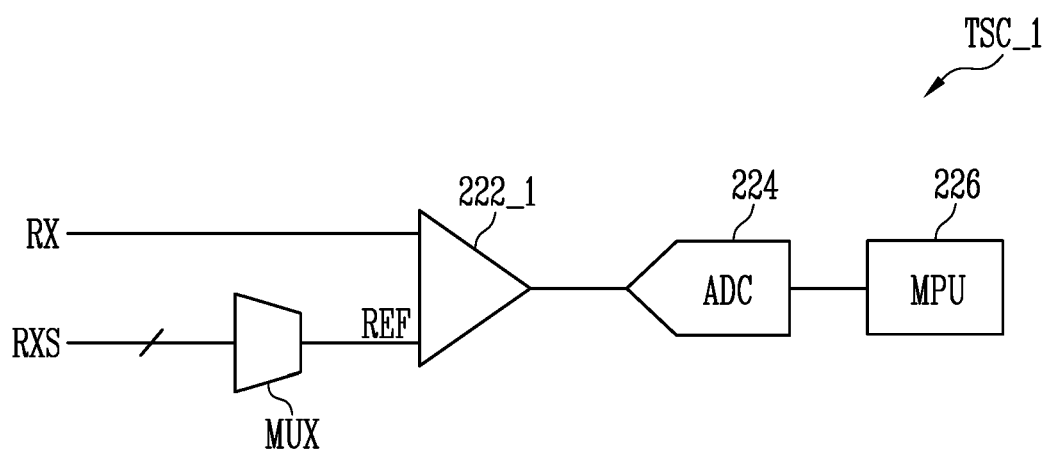
FIG. 21 is a diagram of an embodiment of a sensor receiver.
Figure 22:
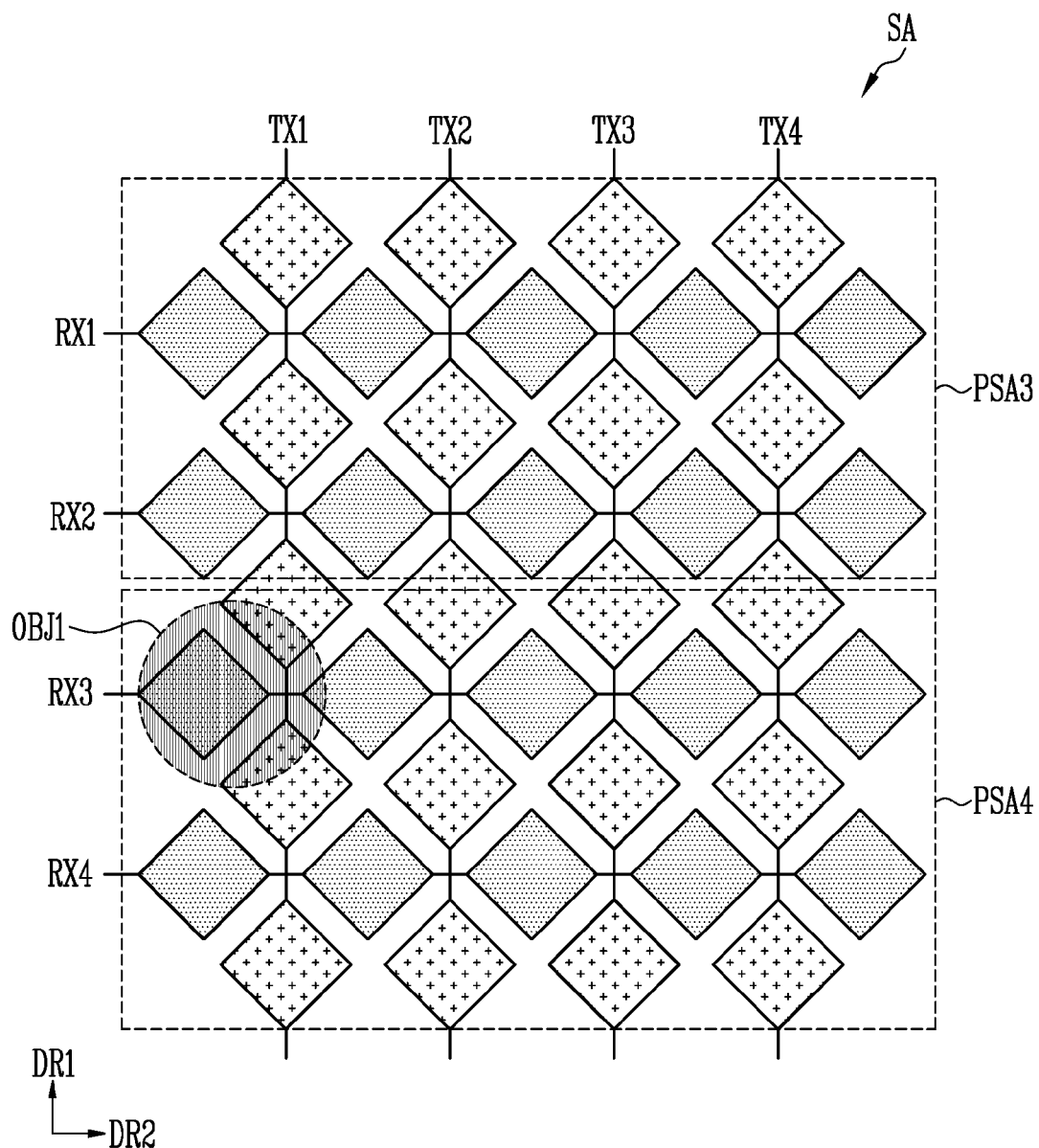
FIG. 22 is a diagram illustrating an operation of the sensor receiver of FIG. 21.
Figure 23:
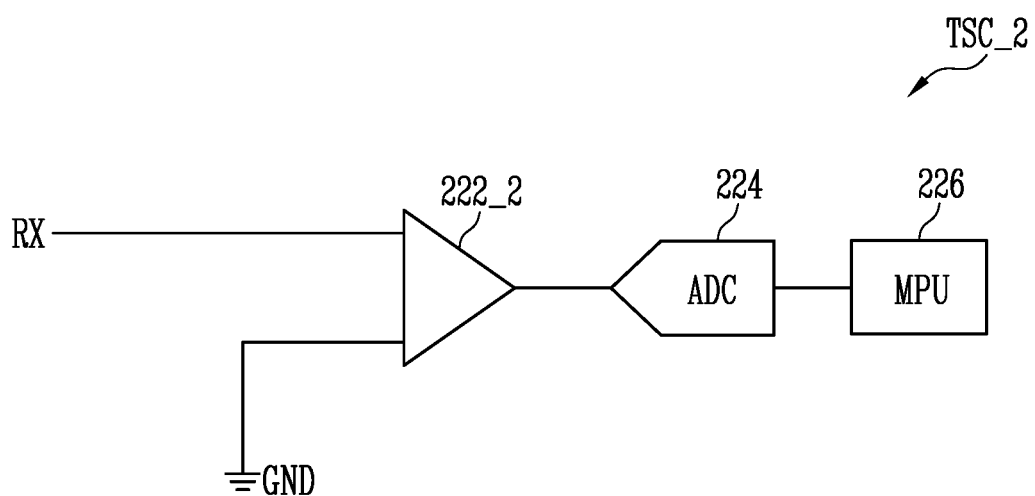
FIG. 23 is a diagram illustrating an embodiment of the sensor receiver.

FIG. 21 is a diagram illustrating an embodiment of a sensor receiver. FIG. 21 shows the configuration of a sensor receiver TSC_1 (e.g., the sensor driver 220 in FIGS. 1 and 4) with respect to any one sensor channel 222_1. Since the internal configuration of the sensor receiver TSC_1 is substantially the same as or similar to that of FIG. 4, a redundant description will be omitted and differences will be mainly described for descriptive convenience. FIG. 22 is a diagram illustrating the operation of the sensor receiver of FIG. 21. FIG. 23 is a diagram illustrating an embodiment of the sensor receiver.

First, referring to FIGS. 1, 4, 17, 21, and 22, the sensor receiver TSC_1 may include a sensor channel 222_1, and the sensor channel 222_1 may be implemented as a differential analog front-end. The differential analog front-end can more easily remove noise contained in the sensing signal in a noisy environment For example, the differential analog front-end may be implemented to include a differential operational amplifier. In this case, the differential operational amplifier may differentially amplify two sensing signals received from two sensors among the second sensors RX1 to RX4, thus removing noise included in one sensing signal (i.e., the sensing signal provided from the corresponding second sensor RX) using noise included in another sensing signal (e.g., the reference signal REF).

In an embodiment, the sensor receiver TSC_1 may further include a multiplexer MUX, and the multiplexer MUX may select one of the sensing signals provided from the second sensors RXS and provide the selected one of the sensing signals to the sensor channel 222_1 as the reference signal REF.

Referring to FIG. 22, the sensing area SA may be divided into a third sensing area PSA3 and a fourth sensing area PSA4, based on the second sensors RX1 to RX4. For example, the third sensing area PSA3 may include two second sensors RX1 and RX2, and the fourth sensing area PSA4 may include two second sensors RX3 and RX4.

For example, the sensor receiver TSC_1 for the second sensor RX2 of the third sensing area PSA3 may select the sensing signal for the second sensor RX1 as the reference signal REF using the multiplexer MUX. The sensor receiver TSC_1 for the second sensor RX2 may differentially amplify the sensing signal for the second sensor RX2 and the reference signal REF (i.e., the sensing signal for the second sensor RX1) to obtain a sensing value. Similarly, the sensor receiver TSC_1 for the second sensor RX4 of the fourth sensing area PSA4 may select the sensing signal for the second sensor RX3 as the reference signal REF using the multiplexer MUX. The sensor receiver TSC_1 for the second sensor RX4 may differentially amplify the sensing signal for the second sensor RX4 and the reference signal REF (i.e., the sensing signal for the second sensor RX3) to obtain a sensing value. For example, the sensor receiver TSC_1 may select a sensing signal provided from another sensor in the area including the corresponding second sensor RX as the reference signal REF, or may set another sensor as a reference sensor (e.g., noise antenna) for noise removal.

However, as shown in FIG. 22, when the first object OBJ1 corresponds to the second sensor RX3, the sensing signal of the second sensor RX3 may include a change in capacitance due to a touch of the first object OBJ1, and the change in capacitance may act as noise on other second sensors RX (e.g., the second sensor RX4 that does not correspond to a touch).

Therefore, in order to remove noise due to the touch, the sensor receiver TSC_1 may select the reference signal REF (e.g., the noise antenna) in the third sensing area PSA3 (i.e., the area where the touch does not occur). For example, the sensor receiver TSC_1 for the second sensor RX4 of the fourth sensing area PSA4 may select the sensing signal for the second sensor RX1 of the third sensing area PSA3 instead of the second sensor RX3 of the fourth sensing area PSA4, as the reference signal REF. As described above, the sensor receiver TSC_1 for the second sensor RX2 of the third sensing area PSA3 may select the sensing signal for the second sensor RX1 of the third sensing area PSA3 as the reference signal REF.

As described above, when the sensor receiver TSC_1 is implemented to include the differential amplifier or the differential analog front-end, the sensor receiver TSC_1 may set a sensor included in a specific area as a noise antenna and use a sensing signal provided from the corresponding noise antenna as a reference signal REF. Further, in case that the touch input is generated, the sensor receiver TSC_1 may set the sensor included in an area where the touch input does not occur as the noise antenna and use a sensing signal provided from the corresponding noise antenna as a reference signal REF.

Although it has been described in FIGS. 21 and 22 that the sensor receiver TSC_1 includes the differential analog front-end, embodiments are not limited thereto. For example, as shown in FIG. 23, the sensor receiver TSC_2 may be implemented as a single analog front-end. The sensing signal of the corresponding second sensor RX may be provided to one of two inputs of the sensor channel 222_2 of the sensor receiver TSC_2, and the ground voltage may be applied to the other of the two inputs of the sensor channel 222_2. In other words, in a situation where a touch input occurs, there may be a limit to removing noise in a differential method. Thus, the single analog front-end may be provided in the sensor receiver TSC_2 instead of the differential analog front-end for noise removal.

Figure 24:
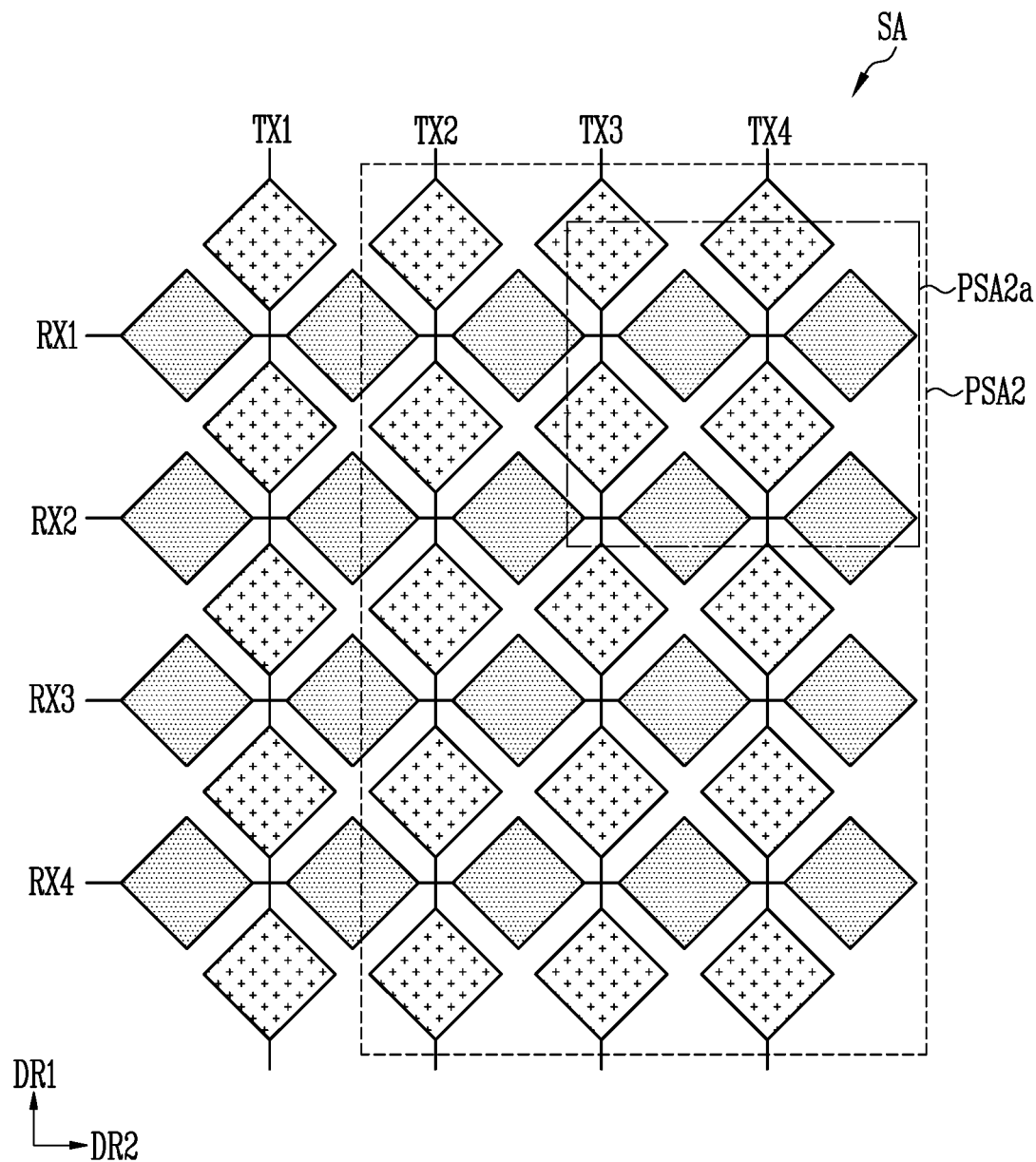
FIGS. 24, 25, and 26 are diagrams for explaining a difference between first sensing areas which are set in the second and third modes.
Figure 25:
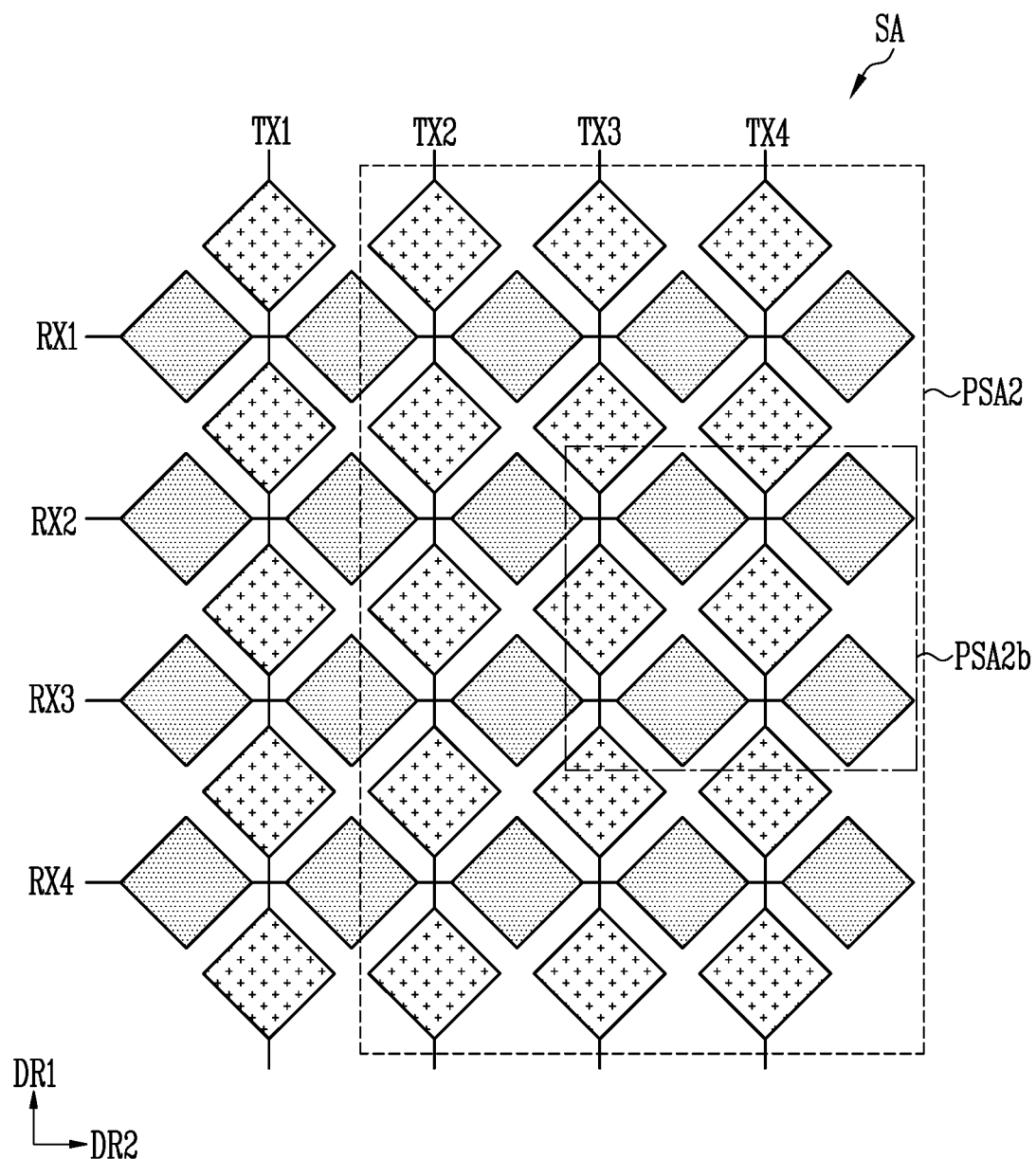
Figure 26:
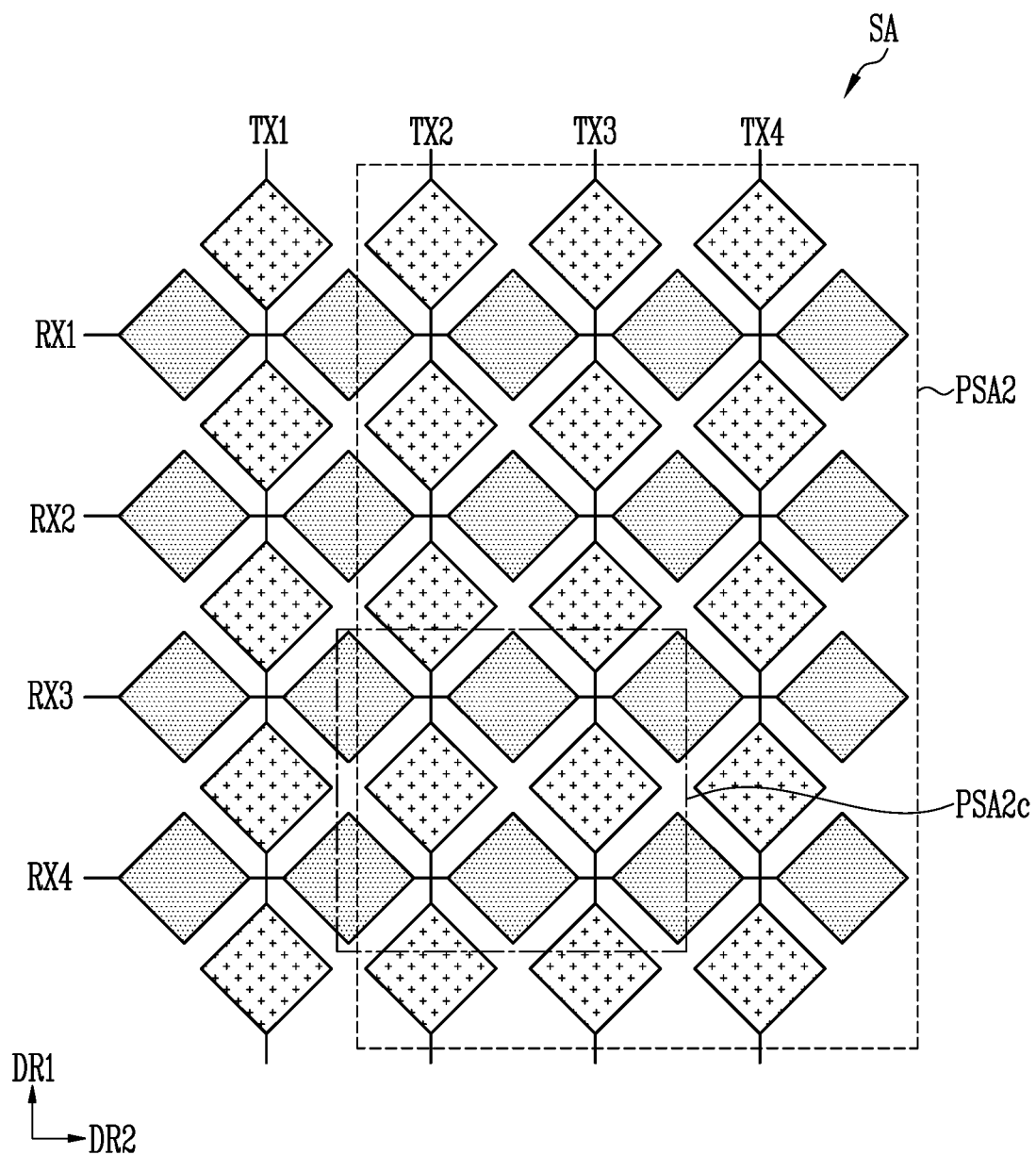

FIGS. 24, 25, and 26 are diagrams for explaining a difference between first sensing areas which are set in the second and third modes.

Referring to FIGS. 1 to 3, 9, 17, 24 to 26, the sensor driver 220 may use the second sensing area PSA2 as a proximity sensing area at an initial time of the second mode. This is because, at the initial time of the second mode, the object OBJ is in a hovering state, so a contact position between the object OBJ and the sensor layer 120 is unclear.

Thereafter, the sensor driver 220 may change the second sensing area PSA2 based on the position of the object OBJ during the third mode. When the position of the object OBJ is specified, as shown in FIG. 24, the sensor driver 220 may reduce the second sensing area PSA2 to set a new second sensing area PSA2a. For example, the sensor driver 220 may set the second sensing area PSA2a of the third mode to be smaller than the second sensing area PSA2 of the second mode.

The sensor driver 220 may set the second sensing area PSA2b of the third mode to partially overlap the second sensing area PSA2 of the second mode (see FIG. 25). Further, the sensor driver 220 may set the second sensing area PSA2c of the third mode not to overlap the second sensing area PSA2 of the second mode (see FIG. 26).

According to an embodiment, the sensor driver 220 may supply a driving signal for proximity sensing and/or a driving signal for measuring biometric information only to sensors corresponding to the second sensing areas PSA1, PSA2a, PSA2b, and PSA2c in the third mode. The sensor driver 220 needs to supply a driving signal for touch-position sensing to sensors corresponding to the outside of the second sensing areas PSA1, PSA2a, PSA2b, and PSA2c. For example, this is because general touch-position sensing should also be performed in the second mode.

According to this embodiment, in the third mode, it is not necessary to supply the sensing signal to the unnecessary first sensors TX, so power consumption may be reduced. For example, in FIGS. 24 and 25, it is not necessary to supply the driving signal for proximity sensing and/or the driving signal for measuring biometric information to the first sensors TX1 and TX2. Further, in FIG. 26, it is not necessary to supply the driving signal for proximity sensing and/or the driving signal for measuring biometric information to the first sensors TX1 and TX4.

In an embodiment, setting is performed not to receive sensing signals from unnecessary second sensors RX in the third mode, so power consumption may be further reduced. For example, in the case of FIG. 24, the sensing signal (e.g., the sensing signal for proximity sensing and/or the sensing signal for biometric information measurement) may not be received from the second sensors RX3 and RX4. In the case of FIG. 25, the sensing signal may not be received from the second sensors RX1 and RX4. In the case of FIG. 26, the sensing signal may not be received from the second sensors RX1 and RX2.

Figure 28:
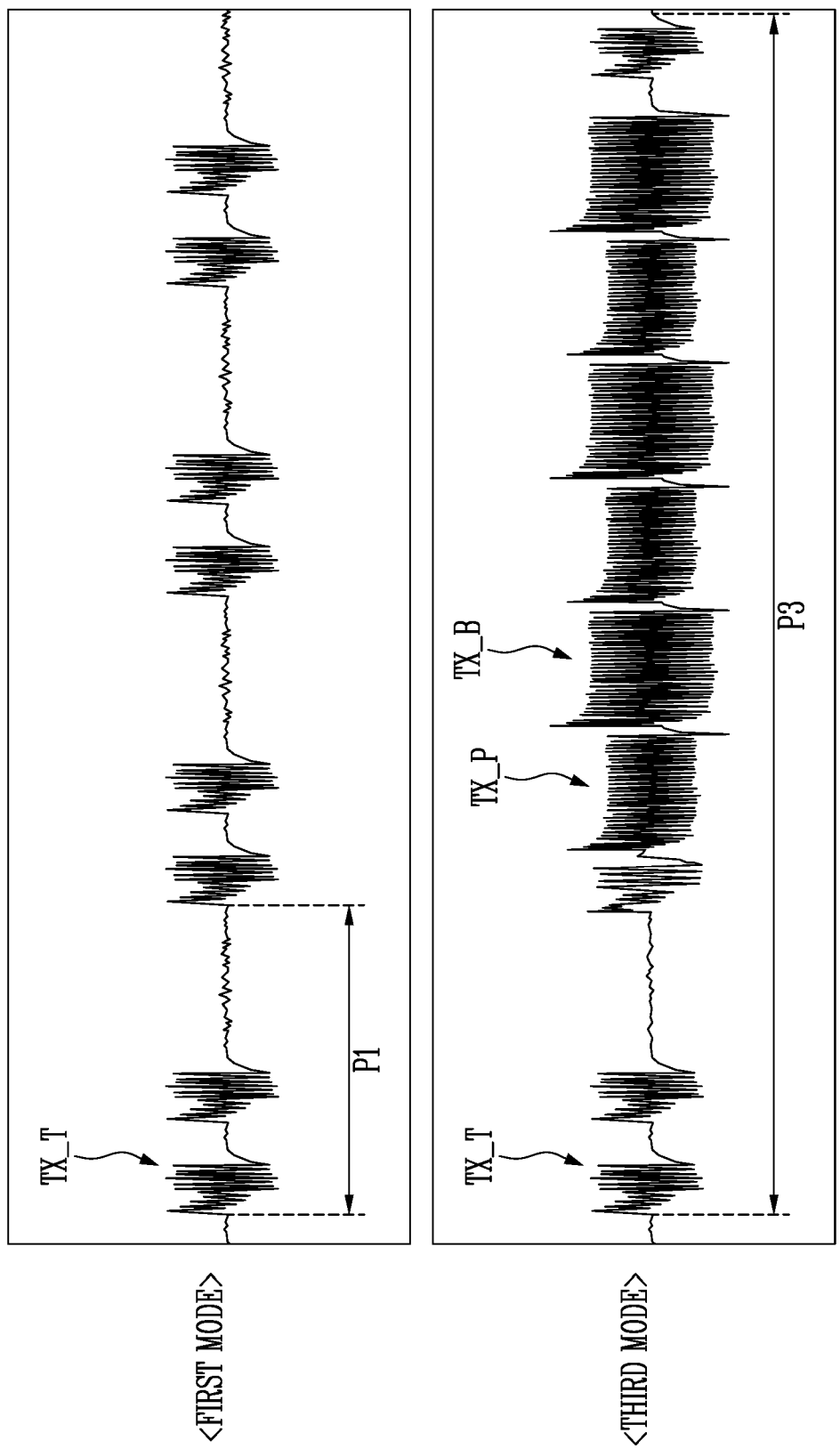

FIGS. 27 and 28 are waveform diagrams illustrating embodiments of a driving signal which is set in the third mode.

First, referring to FIGS. 1, 2, 3, 9, 24, 25, 26, and 27, the sensor driver 220 may provide the driving signal TX_P (e.g., the second driving signal) for proximity sensing in the second mode to the first sensors TX2 to TX4 corresponding to the second sensing area PSA2.

In the second mode, one sensing frame period may correspond to the second period P2. For example, the sensor driver 220 may provide the driving signal TX_P three times to the first sensors TX2 to TX4 corresponding to the second sensing area PSA2 in the (single) second period P2 of the second mode.

In the third mode, the sensor driver 220 may provide the driving signal TX_P for proximity sensing and the driving signal TX_B (e.g., the third driving signal) for biometric information measurement to the first sensors TX2 to TX4 corresponding to new second sensing areas PSA2a, PSA2b, and PSA2c. As described with reference to FIG. 12, the characteristics of the driving signal TX_B for biometric information measurement may be different from the characteristics of the driving signal TX_P for proximity sensing. For example, the voltage magnitude of the driving signal TX_B for biometric information measurement may be greater than the voltage magnitude of the driving signal TX_P for proximity sensing. For example, the frequency (e.g., toggling frequency) of the driving signal TX_B for biometric information measurement may be lower than the frequency of the driving signal TX_P for proximity sensing.

In some embodiments, the sensor driver 220 may alternate the driving signal TX_P for proximity sensing and the driving signal TX_B for biometric information measurement in the third mode at least once to transmit it to the first sensors TX2 to TX4.

For example, as shown in FIG. 27, in the third mode, the driving signal TX_B and the driving signal TX_P may alternate once during one sensing frame period (e.g., during the (single) third period P3). As another example, in the third mode, the driving signal TX_B and the driving signal TX_P may alternate twice during one sensing frame period. As another example, the driving signal TX_P may alternate with the driving signal TX_B once in the third mode. As another example, in the third mode, the driving signal TX_P and the driving signal TX_B may alternate twice during one sensing frame period. For example, the application order of the driving signals TX_P and TX_B may be changed in various ways.

In some embodiments, the sensor driver 220 may increase the number of transmissions of the driving signals TX_P and TX_B for proximity sensing and biometric information measurement in the third mode, compared to the number of transmissions in the second mode.

In an embodiment, in the third mode, one sensing frame period may correspond to the third period P3, and the third period P3 may be the same size as the second period P2. For example, the sensing frequency (e.g., sensing rate or report rate) in the third mode may be the same as the sensing frequency in the second mode. For example, the sensor driver 220 may provide the driving signals TX_P and TX_B four times to the first sensors TX2 to TX4 corresponding to the second sensing areas PSA2a, PSA2b, and PSA2c in the (single) third period P3 of the third mode.

As described with reference to FIG. 11, this is because the display panel 110 does not display an image in the third mode. As described with reference to FIG. 31, a change in a signal (e.g., a data signal) used for the operation of the display panel 110 may act as noise for the driving signal TX_P. In the second mode in which the display panel 110 displays an image, the driving signal TX_P may be provided to the first sensors TX2 to TX4 while avoiding the signal. In the third mode, since the display panel 110 does not display an image, it is unnecessary to consider the signal (e.g., the data signal) in transmission of the driving signals TX_P and TX_B. Even though the sensing frequency in the third mode remains the same as the sensing frequency in the second mode, a total number of transmissions per sensing frame period of the driving signals TX_P and TX_B in the third mode may be greater or more than a total number of transmissions per sensing frame period of the driving signal TX_P in the second mode.

Further, as described with reference to FIGS. 24, 25, and 26, the second sensing areas PSA2a, PSA2b, and PSA2c in the third mode may be smaller than the second sensing area PSA2 in the second mode. Thus, time when the driving signals TX_P and TX_B are applied once to the second sensing areas PSA2a, PSA2b, and PSA2c in the third mode may be shorter than time when the driving signal TX_P is applied to the second sensing area PSA2 once in the second mode. Thus, a total number of transmissions per sensing frame period of the driving signals TX_P and TX_B in the third mode may be greater or more than a total number of transmissions per sensing frame period of the driving signal TX_P in the second mode.

In an embodiment, in the third mode, one sensing frame period may correspond to the third period P3, and the third period P3_1 may be greater than the second period P2. For example, the third period P3_1 may be twice as long as the second period P2. In this case, the sensor driver 220 may provide the driving signals TX_P and TX_B eight times to the first sensors TX2 to TX4 corresponding to the second sensing areas PSA2a, PSA2b, and PSA2c in the (single) third period P3_1 of the third mode. In other words, one sensing frame period in the third mode may be greater than one sensing frame period in the second mode, and the sensing frequency (e.g., sensing rate or report rate) in the third mode may be lower than the sensing frequency in the second mode. The application order of the driving signals TX_P and TX_B in the third period P3_1 may be changed in various ways.

In embodiments, the sensor driver 220 may provide the driving signal TX_T for touch sensing in the third mode to the sensing area SA.

Referring to FIG. 28, the sensing frame period may correspond to the third period P3 in the third mode, and may be greater than the sensing frame period (e.g., the first period P1) in the first mode.

The sensor driver 220 may provide the driving signal TX_T for touch-position sensing to the sensing area SA (e.g., the first sensors TX1 to TX4) at least once in the sensing frame period of the third mode, and may alternately provide the driving signal TX_P for proximity sensing and the driving signal TX_B for biometric information measurement at least once to the second sensing areas PSA2a, PSA2b, and PSA2c. As shown in FIG. 28, in a period (e.g., a portion of the third mode) corresponding to the period when the driving signal TX_T is not applied in the first mode, the driving signal TX_P for proximity sensing and the driving signal TX_B for biometric information measurement may be provided to the second sensing areas PSA2a, PSA2b, and PSA2c.

As described above, the sensor driver 220 may increase the total number of transmissions of the driving signals TX_P and TX_B in the third mode, compared to the number of transmissions of the driving signals TX_P in the second mode. Further, the sensor driver 220 may decrease the sensing frequency in the third mode, compared to the sensing frequency in the second mode. The sensor driver 220 may also perform touch position sensing in the third mode.

Figure 29:
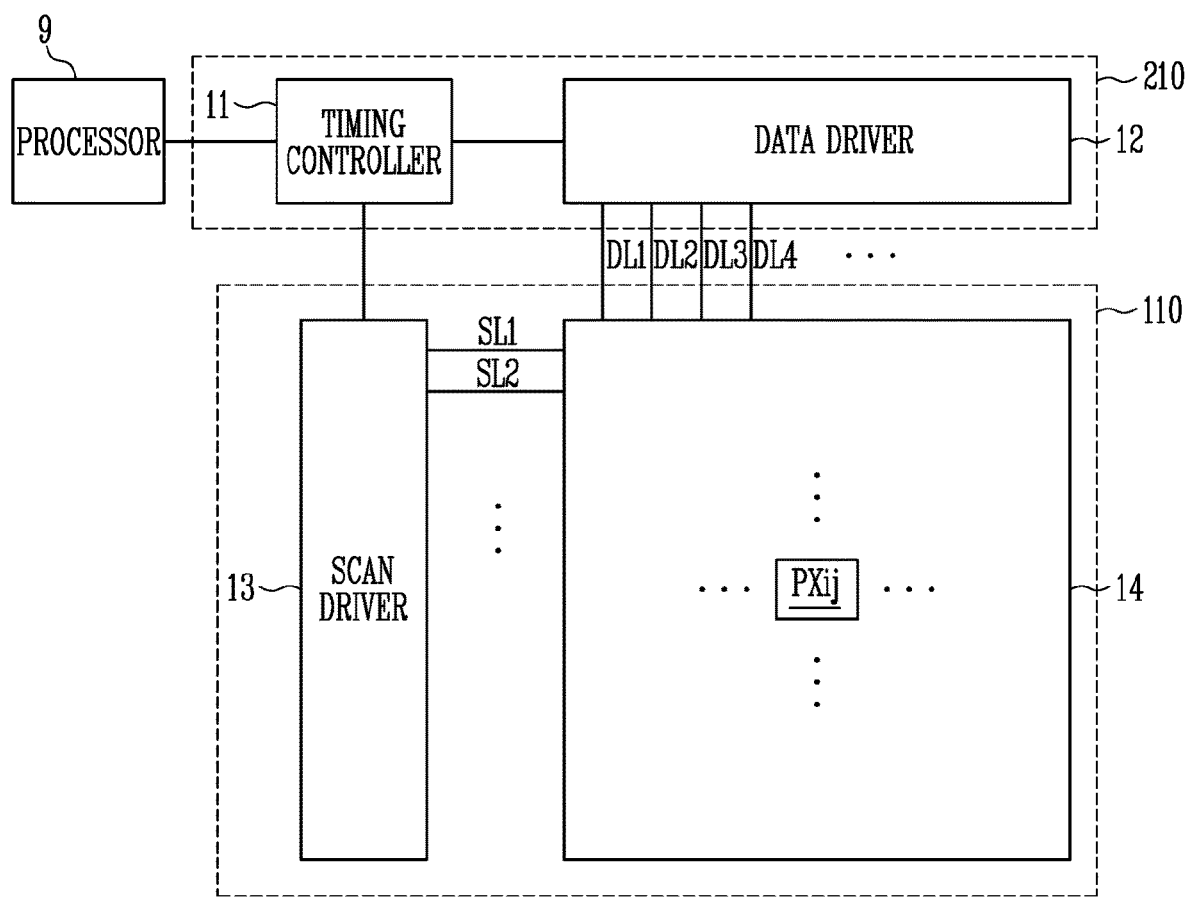
FIG. 29 is a diagram of an embodiment of a display panel and an embodiment of a display driver of the display device of FIG. 1.

FIG. 29 is a diagram illustrating a display panel and a display driver according to an embodiment.

Referring to FIGS. 1 and 29, the display driver 210 may include a data driver 12 and a timing controller 11, and the display panel 110 may include a scan driver 13. However, as described above, various configurations are possible according to the types of the display device 1, For example, each functional component may be integrated into one IC, may be integrated into a plurality of ICs, or may be mounted on the display substrate 111.

The timing controller 11 may receive gray scales and timing signals for each display frame period from a processor 9. Here, the processor 9 may include at least one of a graphics processing unit (GPU), a central processing unit (CPU), and an application processor (AP). For example, the processor 9 may be the application processor 30 of FIG. 1. The timing signals may include a vertical synchronization signal, a horizontal synchronization signal, a data enable signal, etc.

Each cycle of the vertical synchronization signal may correspond to each display frame period. Each cycle of the horizontal synchronization signal Hsync may correspond to each horizontal period. The gray scales may be supplied on the basis of the horizontal line in each horizontal period in response to a pulse of an enable level of a data enable signal. The horizontal line may mean pixels (e.g., a pixel row) connected to the same scan line.

The timing controller 11 may render the gray scales in response to specification of the display device 1 (e.g., the pixel component 14). For example, the processor 9 may provide a red gray scale, a green gray scale, and a blue gray scale for each unit dot (e.g., each sub-pixel). For example, when the pixel component 14 has an RGB stripe structure, one-to-one correspondence may be formed between respective gray scales and the pixels. In this case, rendering of the gray scales may be unnecessary. However, for example, in the case where the pixel component 14 has a PENTILE™ structure, because adjacent unit dots may share a pixel, the pixels may not one-to-one correspond to the respective gray scales. In this case, rendering of the gray scales may be necessary. Gray scales that have been rendered or have not been rendered may be provided to the data driver 12. Further, the timing controller 11 may provide a data control signal to the data driver 12. Further, the timing controller 11 may provide a scan control signal to the scan driver 13.

The data driver 12 may generate data voltages to be provided to data lines DL1, DL2, DL3, and DL4 using the gray scales and the data control signals that are received from the timing controller 11.

The scan driver 13 may use a clock signal, a scan start signal, or other signals received from the timing controller 11, and generate scan signals to be provided to the scan lines SL1 and SL2. The scan driver 13 may sequentially supply scan signals having a turn-on level pulse to the scan lines SL1 and SL2. For example, the scan driver 13 may supply turn-on level scan signals to the scan lines at a cycle corresponding to a cycle of the horizontal synchronization signal during an active period in which the gray scales are supplied. The scan driver 13 may include scan stages configured in the form of shift registers. The scan driver 13 may generate scan signals by sequentially transmitting a scan start signal having a turn-on level pulse shape to a subsequent stage under control of a clock signal.

The pixel component 14 may include pixels. Each pixel may be connected to a corresponding data line and a corresponding scan line. For example, the pixel PXij may be connected to an i-th scan line and a j-th data line, where i and j are integers. The pixels may include pixels emitting light of a first color, pixels emitting light of a second color, and pixels emitting light of a third color. The first color, the second color, and the third color may be different colors. For instance, the first color may be one of red, green, and blue, the second color may be one of red, green, and blue other than the first color, and the third color may be a remaining color other than the first color and the second color among red, green, and blue. Furthermore, the first color, the second color, and the third color may be magenta, cyan, and yellow in place of red, green, and blue.

Figure 30:
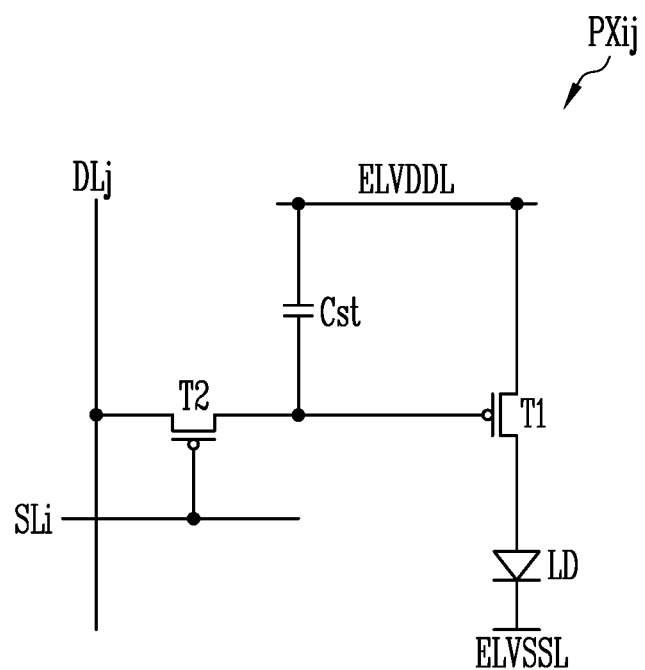
FIG. 30 is a diagram of a representative pixel of the display panel of FIG. 29.

FIG. 30 is a diagram illustrating an embodiment of a pixel included in the display panel.

Referring to FIGS. 29 and 30, an exemplary pixel PXij is illustrated. Since other pixels may also have substantially the same configuration, a redundant description thereof will be omitted for descriptive convenience.

The transistor T1 may be configured to have a gate electrode connected to a second electrode of the storage capacitor Cst, a first electrode connected to a first power line ELVDDL, and a second electrode connected to an anode of the light-emitting element LD. The transistor T1 may be referred to as a driving transistor.

The transistor T2 may be configured to have a gate electrode connected to an i-th scan line SLi, a first electrode connected to a j-th data line DLj, and a second electrode connected to a second electrode of the storage capacitor Cst. The transistor T2 may be referred to as a scan transistor.

A first electrode of the storage capacitor Cst may be connected to the power line ELVDDL, and a second electrode thereof may be connected to the gate electrode of the transistor T1.

The anode of the light-emitting element LD may be connected to the second electrode of the transistor T1, and a cathode thereof may be connected to the second power line ELVSSL. The light-emitting element LD may be a light-emitting diode. As described above, the light-emitting element of each pixel may include an organic light-emitting element, an inorganic light-emitting element, a quantum dot/well light-emitting element, and the like. Each pixel may be provided with a plurality of light-emitting elements. In this case, the plurality of light-emitting elements may be connected in series, parallel, series-parallel, or the like.

During the light emission period of the light-emitting element LD, the first supply voltage applied to the first power line ELVDDL may be greater than the second supply voltage applied to the second power line ELVSSL.

Although the transistors T1 and T2 are illustrated as P-type transistors, the transistors T1 and/or T2 may be implemented as an N-type transistor with reversing the polarity of a signal.

When the scan signal of the turn-on level is applied to the i-th scan line SLi, the transistor T2 may be turned on. In this case, the data voltage charged in the j-th data line DLj may be stored in the storage capacitor Cst. The transistor T1 may generate a driving current to flow in response to a gate-source voltage difference maintained by the storage capacitor Cst. The driving current may flow through the path of the first power line ELVDDL, the transistor T1, the light-emitting element LD, and the second power line ELVSSL. The light-emitting element LD may emit light at a luminance corresponding to the amount of the driving current.

Figure 31:
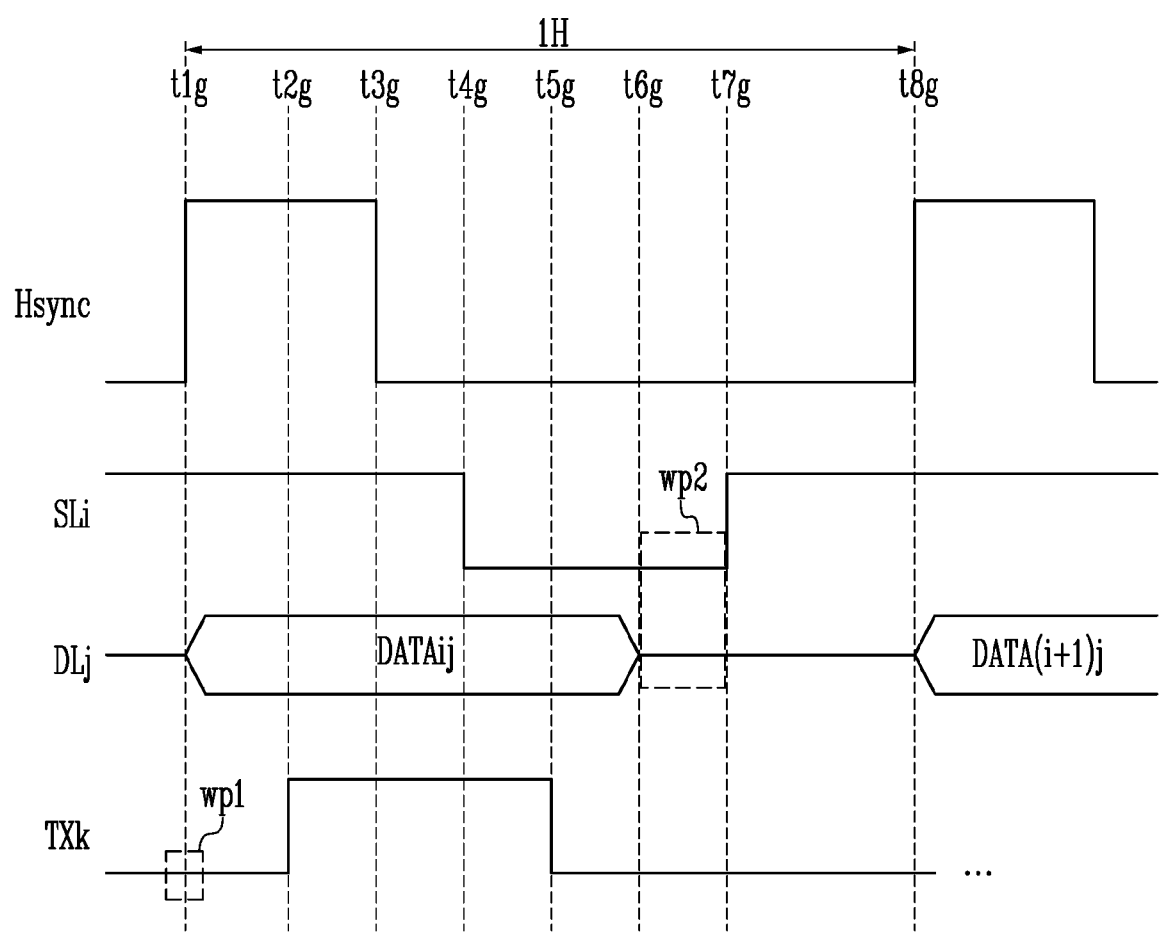
FIGS. 31, 32, and 33 are diagrams for explaining whether timing signals of the sensor driver and a pixel component are synchronized.
Figure 32:
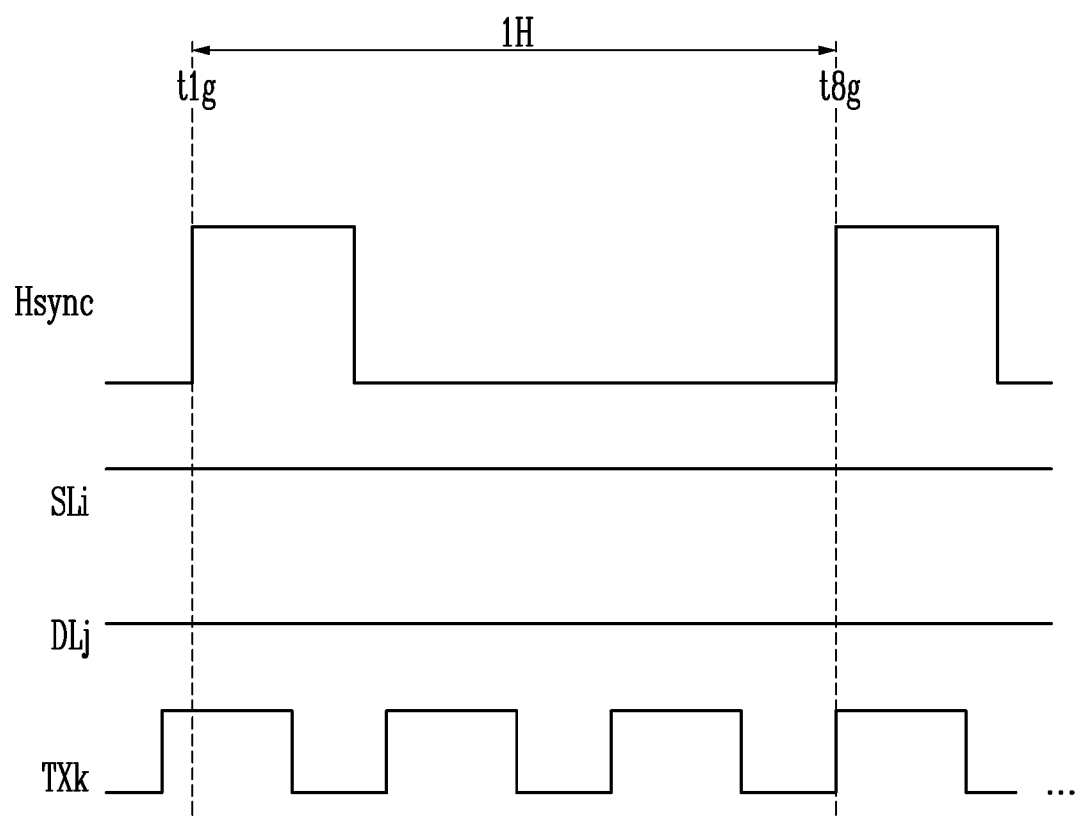
Figure 33:
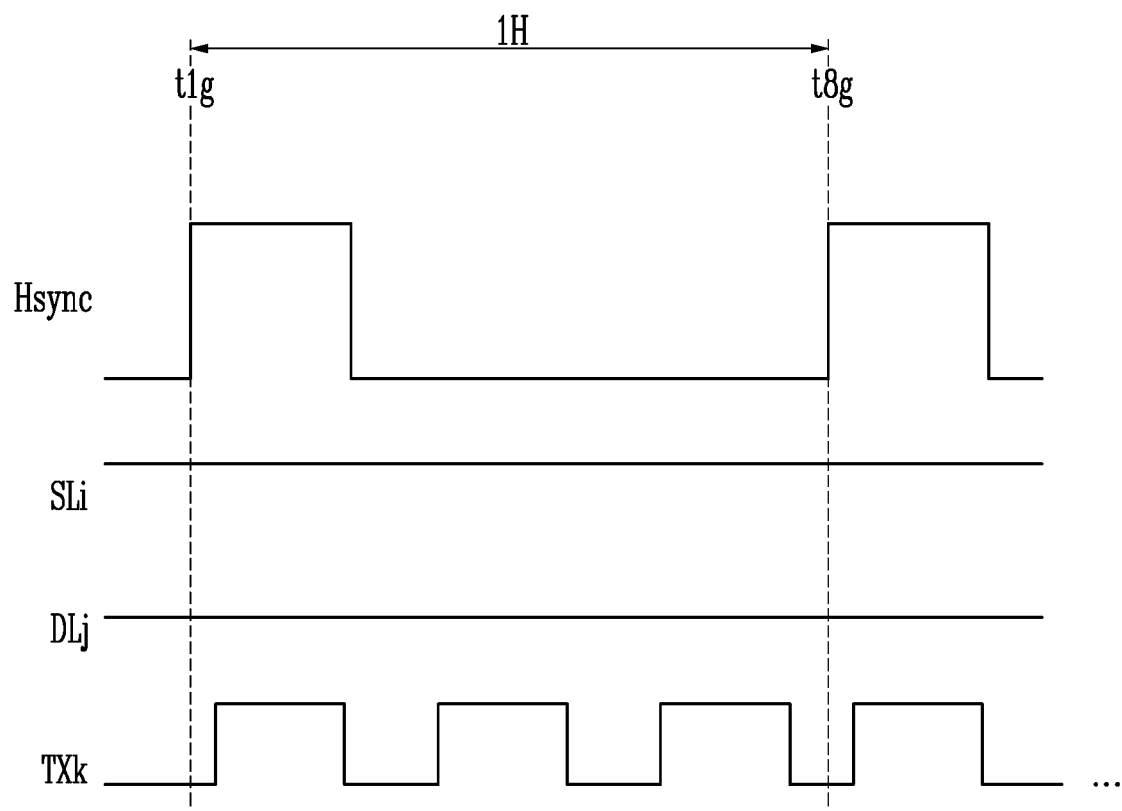

FIGS. 31, 32, and 33 are timing diagrams for explaining whether timing signals of the sensor driver and a pixel component are synchronized.

First, referring to FIGS. 1, 29, 30, and 31, signals of the i-th scan line SLi and the j-th data line DLj connected to the pixel PXij are illustrated as an example. Further, the signal of a k-th first sensor TXk is illustrated. A horizontal period 1H may include a data writing period (i.e., a data voltage storage period) of pixels (e.g., i-th pixel row) connected to the i-th scan line SLi.

As described above, the processor 9 may provide timing signals such as the horizontal synchronization signal Hsync to the timing controller 11 (e.g., the display driver 210). In an embodiment of FIG. 31, the sensor driver 220 may be configured to receive at least some of the timing signals. The sensor driver 220 may directly receive the timing signals from the processor 9, or may receive the timing signals from the timing controller 11 (e.g., the display driver 210). For example, the sensor driver 220 may receive the horizontal synchronization signal Hsync.

The horizontal period 1H may include time t1g, time t2g, time t3g, time t4g, time t5g, time t6g, time t7g, and time t8g. For example, the horizontal period 1H may be defined as a period from the time t1g when the horizontal synchronization signal Hsync is changed from a first logic level (e.g., a low logic level) to a second logic level (e.g., a high logic level) to the time t8g when the horizontal synchronization signal Hsync is changed from the first logic level to the second logic level.

The data driver 12 (e.g., the display driver 210) may start outputting data voltages DATAij for at least a portion (e.g., the i-th pixel row) of the pixels PX at the time t1g during the horizontal period 1H, and may finish outputting data voltages DATAij at the time t6g during the horizontal period 1H. For example, the data driver 12 may output the data voltage DATAij to the j-th data line DLj during the period from the time t1g to the time t6g.

The sensor driver 220 (e.g., the sensor transmitter TDC) may transmit the driving signal (e.g., the rising transition signal) to at least some of the sensors, at the time t2g different from the time t1g and the time t6g during the horizontal period 1H. For example, the sensor driver 220 may supply the driving signal (e.g., the falling transition signal) to the k-th first sensor TXk at the time t5g.

The time t1g when the data voltage DATAij is changed may correspond to a sensor weak period wp1. An unintended parasitic capacitance may exist between the k-th first sensor TXk and the pixel PXij, and a change in the data voltage DATAij at the time t1g may act on the sensor layer 120 as sensing noise. Therefore, the sensor driver 220 may perform a sensing operation while avoiding the sensor weak period wp1.

Further, in a state where the supply of the data voltage DATAij is terminated and the data line DLj is floated, the period from the time t6g to the time t7g when the scan transistor T2 is turned on may correspond to a display weak period wp2. In case that the driving signal is supplied during the display weak period wp2, an incorrect data voltage may be written in the pixel PXij. Therefore, the sensor driver 220 may perform a sensing operation while avoiding the display weak period wp2.

According to an embodiment, the scan driver 13 may output the scan signal of the turn-on level for at least a portion PXij of the pixels from the time t4g to the time t7g during the horizontal period 1H. In this case, the driving signal may not be supplied from the time t6g to the time t7g.

For example, in the second mode in which the pixel component 14 is in a display state, the sensor driver 220 may need to supply the driving signal while avoiding the sensor weak period wp1 and the display weak period wp2. Therefore, in the second mode, the sensor driver 220 may be synchronized with the horizontal synchronization signal Hsync.

On the other hand, in the third mode in which the pixel component 14 is in a non-display state, the sensor driver 220 may be asynchronous with the horizontal synchronization signal Hsync (see FIG. 32). This is because the sensor weak period wp1 and the display weak period wp2 are not present in the third mode. In this case, the sensor driver 220 may not receive timing signals such as the horizontal synchronization signal Hsync. When the sensor driver 220 is out of synchronization with the horizontal synchronization signal Hsync, the driving signals may be freely supplied, so that the frequency of supplying the driving signals may increase. For example, the sensor driver 220 may set the number of sensing per sensing frame period of the third mode to be greater than the number of sensing per sensing frame period of the second mode. Referring to the sensing frequency of FIG. 18, since the sensing frame period of the first mode is shorter than the sensing frame period of the second mode, the sensor driver 220 may set the number of sensing per sensing frame period in the first mode to be less than the number of sensing per sensing frame period in the second mode.

According to an embodiment, even in the third mode, the sensor driver 220 may be synchronized with the horizontal synchronization signal Hsync (see FIG. 33). Even in this case, since the sensor weak period wp1 and the display weak period wp2 do not exist, the driving signals may be freely supplied, and the driving signal supply frequency may be increased, as compared to the first mode and the second mode. However, compared to the case of FIG. 32 in which the sensor driver is asynchronous with the horizontal synchronization signal, the frequency of supplying the driving signal may be lower in the case of FIG. 33.

The sensor driver 220 may be asynchronous with the horizontal synchronization signal Hsync in the first mode. In an embodiment, the sensor driver 220 may be synchronized with the horizontal synchronization signal Hsync in the first mode.

FIGS. 34 to 40 are diagrams for explaining an exemplary configuration of a display device. Reference numerals in FIGS. 34 to 40 and reference numerals in FIGS. 1 to 33 are independent of each other.

Figure 34:
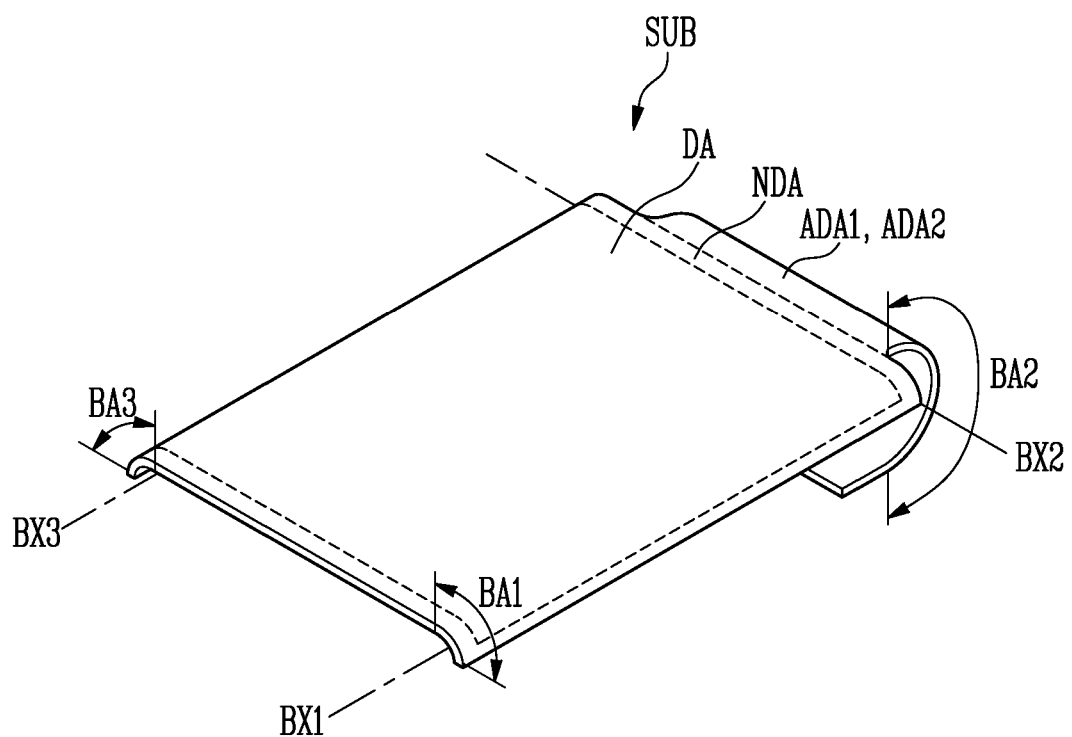
FIGS. 34 to 40 are diagrams of other embodiments of the display device of FIG.
Figure 35:
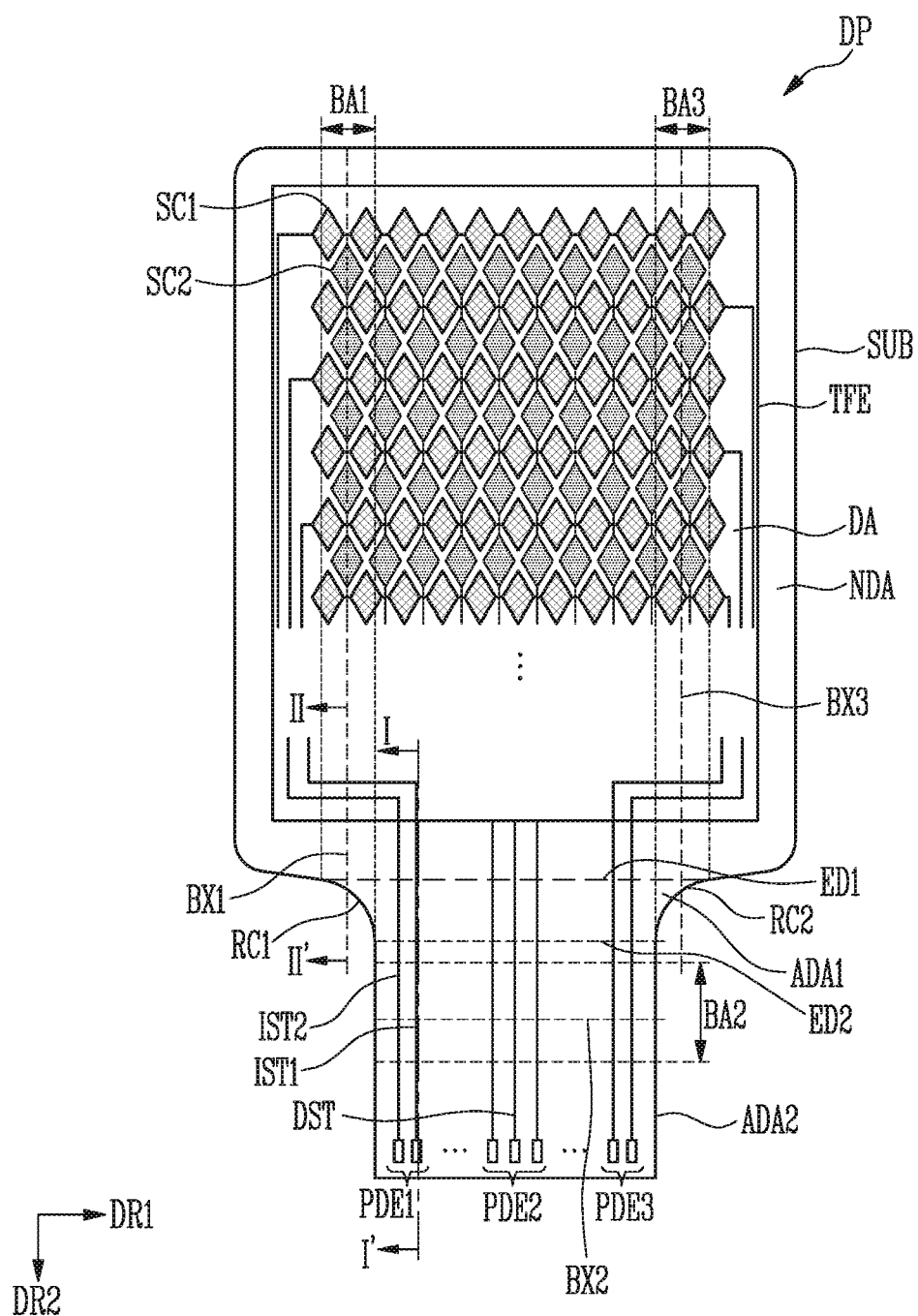

FIG. 34 is a diagram illustrating a substrate according to an embodiment, and FIG. 35 is a diagram illustrating a display device according to an embodiment.

In the following embodiments, a plane may define a position in a first direction DR1 and a second direction DR2, and a height may define a position in a third direction DR3 (see FIG. 36). The first direction DR1, the second direction DR2, and the third direction DR3 may be directions orthogonal to each other.

The substrate SUB may include a display area DA, a non-display area NDA, a first additional area ADA1, and a second additional area ADA2.

The display area DA may have a rectangular shape. Each corner of the display area DA may have an angular shape or a curved shape. In the case of a circular display, the display area DA may have a circular shape. Further, the display area DA may be formed of a polygon other than a quadrangle, an ellipse, or the like. As such, the shape of the display area DA may be set differently according to a product.

The pixels may be positioned on the display area DA. According to the type of the display device DP, each pixel may include a light-emitting diode or a liquid crystal layer.

The non-display area NDA may surround the periphery of the display area DA. For example, the non-display area NDA may have a rectangular shape. Each corner of the non-display area NDA may have an angular shape or a curved shape. FIG. 35 illustrates that each corner of the non-display area NDA has a curved shape. The non-display area NDA may have a circular shape. Since it is advantageous to minimize the non-display area NDA in a narrow bezel structure, the shape of the non-display area NDA may be similar to the shape of the display area DA.

The first additional area ADA1 may be positioned between the non-display area NDA and the second additional area ADA2. The first additional area ADA1 may be connected to the non-display area NDA at a first boundary ED1. The first additional area ADA1 may be connected to the second additional area ADA2 at a second boundary ED2. Each of the first boundary ED1 and the second boundary ED2 may extend in the first direction DR1.

The width of the first additional area ADA1 may become narrower from the first boundary ED1 to the second boundary ED2. For example, the width of the first additional area ADA1 in the first direction DR1 may become narrower in the second direction DR2. For example, the first additional area ADA1 may include curved first and second side surfaces RC1 and RC2. The side surfaces RC1 and RC2 may be convex toward the interior of the substrate (e.g., the center of the substrate).

FIG. 35 illustrates the first additional area ADA1 to include two side surfaces RC1 and RC2 in the first direction DR1 and an opposite direction thereof. In an embodiment, the first additional area ADA1 may include only the first side surface RC1 because a boundary positioned in the first direction DR1 coincides with a boundary of the non-display area NDA. In an embodiment, the first additional area ADA1 may include only the second side surface RC2 because a boundary positioned in a direction opposite to the first direction DR1 coincides with the boundary of the non-display area NDA.

The second additional area ADA2 may have a rectangular shape. Each corner disposed in the second direction DR2 of the second additional area ADA2 may have an angular shape or a curved shape. FIG. 35 illustrates that each corner positioned in the second direction DR2 of the second additional area ADA2 has an angular shape.

An encapsulation layer TFE may be positioned on the pixels. For example, the encapsulation layer TFE may cover the pixels in the display area DA, and the boundary of the encapsulation layer TFE may be disposed in the non-display area NDA. The encapsulation layer TFE may cover the light-emitting elements and circuit elements of the pixels of the display area DA, thereby preventing damage from external moisture or impact.

Sensing electrodes SC1 and SC2 may be positioned on the encapsulation layer TFE. The sensing electrodes SC1 and SC2 may sense a touch, hovering, gesture, proximity, etc. by the user's body. The sensing electrodes SC1 and SC2 may be configured in different shapes according to various methods such as a resistive type, a capacitive type, an electromagnetic induction type (EM), and an optical type. For example, when the sensing electrodes SC1 and SC2 are configured in the capacitive type, the sensing electrodes SC1 and SC2 may be configured in the self-capacitive type, the mutual-capacitive type, etc. Hereinafter, for the convenience of description, a case in which the sensing electrodes SC1 and SC2 are configured in the mutual capacitive type is illustrated.

When the sensing electrodes SC1 and SC2 are configured in the mutual capacitive type, the driving signal may be transmitted through the sensing line corresponding to the first sensing electrode SC1, and the sensing signal may be received through the sensing line corresponding to the second sensing electrode SC2 which forms mutual capacitance with the first sensing electrode SC1. When the user's body approaches, the mutual capacitance between the first sensing electrode SC1 and the second sensing electrode SC2 may change, and thereby the user's touch may be detected based on the difference in the sensing signal. In an embodiment, the driving signal may be transmitted through the sensing line corresponding to the second sensing electrode SC2, and the sensing signal may be received through the sensing line corresponding to the first sensing electrode SC1 forming mutual capacitance with the second sensing electrode SC2.

Pads PDE1, PDE2, and PDE3 may be disposed on the second additional area ADA2. The pads PDE1 and PDE3 may be connected to the sensing electrodes SC1 and SC2 positioned on the encapsulation layer through sensing lines IST1 and IST2. The pads PDE1 and PDE3 may be connected to an external touch integrated chip (IC). Further, the pads PDE2 may be connected to the pixels or the driver of the pixels positioned under the encapsulation layer TFE through the display lines DST. The driver may include a scan driver, a light emission driver, a data driving unit, and the like. The driver may be disposed under the encapsulation layer TFE or may be disposed on an external display IC connected through the pads PDE2.

When the display device DP is of the mutual capacitive type, the touch IC may transmit the driving signal through the first sensing line IST1, and may receive the sensing signal through the second sensing line IST2. In an embodiment, the driving signal may be transmitted through the second sensing line IST2, and the sensing signal may be received through the first sensing line IST1. For reference, when the display device DP is of the self-capacitive type, there may be no difference in driving method of the first sensing line IST1 and the second sensing line IST2. The display lines DST may include a control line, a data line, a power line, and the like, and may provide signals so that the pixels display an image. These signals may be transmitted from the driver connected to the display lines DST.

FIG. 34 shows a state in which the substrate SUB is bent, and FIG. 35 shows a state in which the substrate SUB is not bent. The display device DP may be bent as shown in FIG. 34 after elements are stacked on the substrate SUB in the non-bending state as shown in FIG. 35.

The substrate SUB may include a first bending area BA1 which extends from the first side surface RC1 of the first additional area ADA1 to overlap the non-display area NDA. Further, the first bending area BA1 may extend to overlap the display area DA. For example, each of the display area DA, the non-display area NDA, and the first additional area ADA1 may partially overlap the first bending area BA1. The first bending area BA1 may have a width in the first direction DR1, and may extend in the second direction DR2 to have a length. A first bending axis BX1 may be defined as a folding line extending in the second direction DR2 from the center of the first bending area BA1. According to some embodiments, the first bending area BA1 may be a portion in which stress is reduced by removing a portion of the insulating layer, unlike other portions in the vicinity of the first bending area. According to some embodiments, the first bending area BA1 may have the same configuration as other surrounding portions.

The substrate SUB may include a third bending area BA3 which extends from the second side surface RC2 of the first additional area ADA1 to overlap the non-display area NDA. Further, the third bending area BA3 may extend to overlap the display area DA. For example, each of the display area DA, the non-display area NDA, and the first additional area ADA1 may partially overlap the third bending area BA3. The third bending area BA3 may have a width in the first direction DR1, and may extend in the second direction DR2 to have a length. A third bending axis BX3 may be defined as a folding line extending in the second direction DR2 from the center of the third bending area BA3. According to some embodiments, the third bending area BA3 may be a portion in which stress is reduced by removing a portion of the insulating layer, unlike other portions in the vicinity of the third bending area. According to some embodiments, the third bending area BA3 may have the same configuration as other surrounding portions.

The second additional area ADA2 may include a second bending area BA2. The second bending area BA2 may have a width in the second direction DR2, and may extend in the first direction DR1 to have a length. A second bending axis BX2 may be defined as a folding line extending in the first direction DR1 from the center of the second bending area BA2. According to some embodiments, the second bending area BA2 may be a portion in which stress is reduced by removing a portion of the insulating layer, unlike other portions in the vicinity of the second bending area. According to some embodiments, the second bending area BA2 may have the same configuration as other surrounding portions.

The first bending area BA1, the second bending area BA2, and the third bending area BA3 may not overlap each other.

In this regard, the term "fold" refers to the fact that the display device may be changed from the original shape thereof to another shape without being fixed in shape, and has meanings including, being "folded" or "curved" along one or more bending axes, or "rolled" in a scroll manner. Due to the first bending area BA1 and the third bending area BA3, a side bezel width in a direction opposite to the first direction DR1 of the display device DP and in the first direction DR1 may be reduced. Further, the side bezel width in the second direction DR2 of the display device DP may be reduced by the second bending area BA2.

Figure 36:
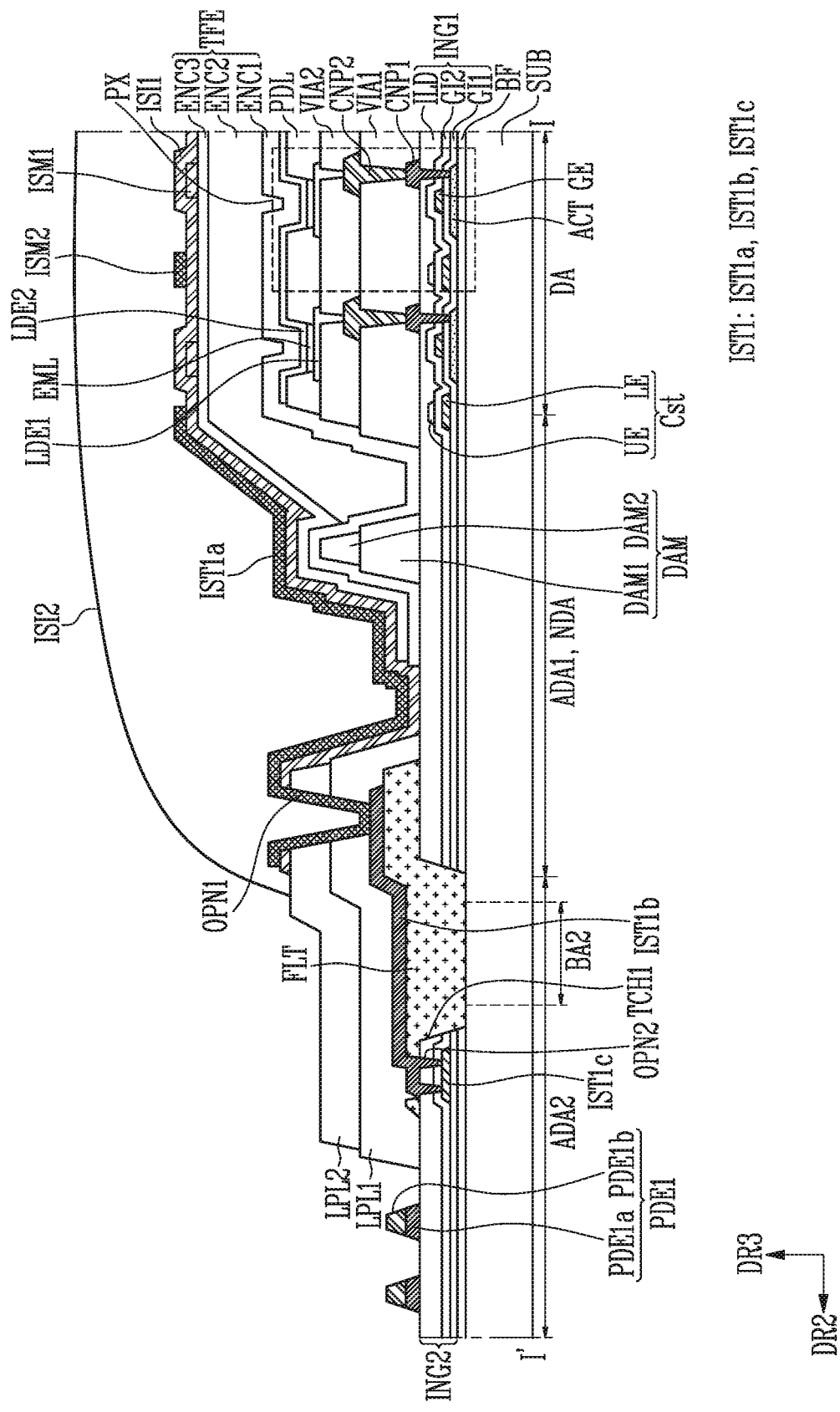

FIG. 36 is an embodiment of a cross-section taken along line I-I' of FIG. 35. It is assumed that the line I-I' of FIG. 35 passes through the first pad PDE1 and the first sensing line IST1.

First, the display area DA will be described. In an embodiment, the pixels PX are provided in the display area DA. Each pixel PX may include a transistor that is connected to a corresponding line of the display lines DST, a light-emitting element that is connected to the transistor, and a capacitor Cst. For the convenience of description, FIG. 36 illustrates one transistor, one light-emitting element, and one capacitor Cst for one pixel PX.

The substrate SUB may be made of insulating material such as glass or resin. Furthermore, the substrate SUB may be made of material having flexibility so as to be bendable or foldable, and have a single layer structure or a multi layer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be changed in various ways, and the substrate SUB may also be made of fiber reinforced plastic (FRP) or the like.

For example, in case that the substrate SUB has the multi layer structure, an inorganic material such as silicon nitride, silicon oxide, or silicon oxynitride may be interposed between the plurality of layers in a single layer or in multiple layers.

A buffer layer BF may cover the substrate SUB. The buffer layer BF may prevent impurities from diffusing into a channel CH of the transistor. The buffer layer BF may be an inorganic insulating layer formed of inorganic material. For example, the buffer layer BF may be formed of silicon nitride, silicon oxide, silicon oxynitride, etc. The buffer layer BF may be omitted according to the material of the substrate SUB and processing conditions. In some embodiments, a barrier layer may be further provided.

An active layer ACT may be positioned on the buffer layer BF. The active layer ACT may be patterned to form the channel of the transistor, a source electrode, and a drain electrode, or may form a line. The active layer ACT may be formed of semiconductor material. The active layer ACT may be a semiconductor pattern formed of polysilicon, amorphous silicon, an oxide semiconductor, etc. The channel of the transistor may be a semiconductor pattern undoped with impurities, and be an intrinsic semiconductor. Each of the source electrode, the drain electrode, and the line may be a semiconductor pattern doped with impurities. An impurity such as an n-type impurity, a p-type impurity or other metals may be used as the impurity.

A first gate insulating layer GI1 may cover the active layer ACT. The first gate insulating layer GI may be an inorganic insulating layer formed of inorganic material. For example, the inorganic material may include inorganic insulating material such as polysiloxane, silicon nitride, silicon oxide, or silicon oxynitride.

The gate electrode GE of the transistor and the lower electrode LE of the capacitor Cst may be positioned on the first gate insulating layer GI1. The gate electrode GE may overlap an area corresponding to the channel CH.

The gate electrode GE and the lower electrode LE may be made of metal. For example, the gate electrode GE may be made of at least one of metals such as gold (Au), silver (Ag), aluminum (Al), molybdenum (Mo), chrome (Cr), titanium (Ti), nickel (Ni), neodymium (Nd), copper (Cu), and an alloy of the metals. The gate electrode GE may have a single layer structure, but embodiments are not limited thereto, and it may have a multilayer structure formed by stacking two or more materials of metals and alloys.

The second gate insulating layer GI2 may cover the gate electrode GE and the lower electrode LE. The second gate insulating layer GI2 may be an inorganic insulating layer formed of inorganic material. For example, the inorganic material may include polysiloxane, silicon nitride, silicon oxide, silicon oxynitride, or the like.

An upper electrode UE of the capacitor Cst may be positioned on the second gate insulating layer GI2. The upper electrode UE of the capacitor Cst may be formed of metal. For example, the upper electrode UE may be made of at least one of metals such as gold (Au), silver (Ag), aluminum (Al), molybdenum (Mo), chrome (Cr), titanium (Ti), nickel (Ni), neodymium (Nd), copper (Cu), and an alloy of the metals. The upper electrode UE may have a single layer structure, but embodiments are not limited thereto, and it may have a multilayer structure formed by stacking two or more materials of metals and alloys.

The lower electrode LE and the upper electrode UE may form the capacitor Cst, with the second gate insulating layer GI2 interposed therebetween. Although FIG. 36 illustrates that the capacitor Cst has a two layer electrode structure of the lower electrode LE and the upper electrode UE, in an embodiment, the capacitor Cst may have a three layer electrode structure using the active layer ACT, a three layer electrode structure using an electrode of the same layer as a first connection pattern CNP1, or an electrode structure of four or more layers.

An interlayer insulating layer ILD may cover the upper electrode UE. The interlayer insulating layer ILD may be an inorganic insulating layer formed of inorganic material. For example, the inorganic material may include polysiloxane, silicon nitride, silicon oxide, silicon oxynitride, or the like.

In this embodiment, for the convenience of description, the first gate insulating layer GI1, the second gate insulating layer GI2, and the interlayer insulating layer ILD may be referred to as a first insulating layer group ING1. The first insulating layer group ING1 may cover a portion of the transistor. In some embodiments, the first insulating layer group ING1 may further include the buffer layer BF.

The first connection pattern CNP1 may be positioned on the interlayer insulating layer ILD. The first connection pattern CNP1 may contact the source electrode and the drain electrode of the active layer ACT through contact holes formed in the interlayer insulating layer ILD, the second gate insulating layer GI2, and the first gate insulating layer GI1, respectively.

The first connection pattern CNP1 may be formed of metal. For example, each of the source electrode SE and the drain electrode DE may be made of at least one of metals such as gold (Au), silver (Ag), aluminum (Al), molybdenum (Mo), chrome (Cr), titanium (Ti), nickel (Ni), neodymium (Nd), copper (Cu), and an alloy of the metals.

For example, according to an embodiment, a passivation layer may cover the first connection pattern CNP1. The passivation layer may be an inorganic insulating layer formed of inorganic material. For example, the inorganic material may include polysiloxane, silicon nitride, silicon oxide, silicon oxynitride, or the like.

A first via layer VIA1 may cover the passivation layer or the transistor. The first via layer VIA1 may be an organic insulating layer formed of organic material. For example, the organic material may include organic insulating material such as a polyacryl-based compound, a polyimide-based compound, a fluorocarbon compound such as Teflon, or a benzocyclobutene compound. The organic layer may be deposited by a method such as evaporation.

A second connection pattern CNP2 may be connected to the first connection pattern CNP1 through the opening of the first via layer VIA1. The second connection pattern CNP2 may be made of at least one of metals such as gold (Au), silver (Ag), aluminum (Al), molybdenum (Mo), chrome (Cr), titanium (Ti), nickel (Ni), neodymium (Nd), copper (Cu), or an alloy of the metals.

A second via layer VIA2 may cover the first via layer VIA1 and the second connection pattern CNP2. The second via layer VIA2 may be an organic insulating layer formed of organic material. For example, the organic material may include organic insulating material such as a polyacryl-based compound, a polyimide-based compound, a fluorocarbon compound such as Teflon, or a benzocyclobutene compound.

A first light-emitting-element electrode LDE1 may be connected to the second connection pattern CNP2 through the opening of the second via layer VIA2. Here, the first light-emitting-element electrode LDE1 may be an anode of the light-emitting element according to an embodiment.

In some embodiments, the configuration of the second via layer VIA2 and the second connection pattern CNP2 may be omitted, and the first light-emitting-element electrode LDE1 may be directly connected to the first connection pattern CNP1 through the opening of the first via layer VIA1.

The first light-emitting-element electrode LDE1 may be formed of a metal layer made of Ag, Mg, Al, Pt, Pd, Au, Ni, Nd, Ir, Cr, or an alloy of them, and/or indium tin oxide (ITO), indium zinc oxide (IZO), zinc oxide (ZnO), indium tin zinc oxide (ITZO), or the like. The first light-emitting-element electrode LDE1 may be formed of one kind of metal, but embodiments are not limited thereto, and it may be formed of two or more kinds of metals, e.g., an alloy of Ag and Mg.

The first light-emitting-element electrode LDE1 may be formed of a transparent conductive layer when an image is displayed in a direction toward a lower portion of the substrate SUB, or may be formed of a metal reflective layer and/or a transparent conductive layer when an image is displayed in a direction toward an upper portion of the substrate SUB.

A pixel defining layer PDL for defining an emission area of each pixel PX may be provided on the substrate SUB on which the first light-emitting-element electrode LDE1 and the like are formed. The pixel defining layer PDL may be an organic insulating layer made of organic material. For example, the organic material may include organic insulating material such as a polyacryl-based compound, a polyimide-based compound, a fluorocarbon compound such as Teflon, or a benzocyclobutene compound.

The pixel defining layer PDL may expose an upper surface of the first light-emitting-element electrode LDE1 and protrude from the substrate SUB along the perimeter of the pixel PX. An emission layer EML may be provided in the pixel (PX) area surrounded by the pixel defining layer PDL.

The emission layer EML may include low-molecular or high-molecular material. The low-molecular material may include copper phthalocyanine (CuPc), N,N'-Di(naphthalene yl)-N,N'-diphenyl-benzidine (NPB), tris-8-hydroxyquinoline aluminum (Alq3), etc. Such materials may be formed by a vacuum evaporation method. The high-molecular material may include PEDOT, PPV (poly-phenylenevinylene)-based material, polyfluorene-based material, etc.

The emission layer EML may be provided to have a single layer structure, or a multilayer structure including various functional layers. In case that the emission layer EML has a multilayer structure, it may have a structure in which a hole injection layer (HIL), a hole transport layer (HTL), an emission layer (EML), an electron transport layer (ETL), an electron injection layer (EIL), etc. are stacked in a single material structure or a multi material structure. The emission layer EML may be formed by screen printing, inkjet printing, laser induced thermal imaging (LITI), or the like.

In some embodiments, at least a portion of the emission layer EML may be integrally formed across the plurality of first light-emitting-element electrodes LDE1, or be individually provided to correspond to each of the plurality of first light-emitting-element electrodes LDE1.

A second light-emitting-element electrode LDE2 may be provided on the emission layer EML. The second light-emitting-element electrode LDE2 may be provided for each pixel PX. Alternatively, the second light-emitting-element electrode may be provided to cover most of the display area DA and be shared by the plurality of pixels PX.

According to an embodiment, the second light-emitting-element electrode LDE2 may be used as a cathode or an anode. When the first light-emitting-element electrode LDE1 is the anode, the second light-emitting-element electrode LDE2 may be used as the cathode. When the first light-emitting-element electrode LDE1 is the cathode, the second light-emitting-element electrode LDE2 may be used as the anode.

The second light-emitting-element electrode LDE2 may be formed of a metal layer made of Ag, Mg, Al, Pt, Pd, Au, Ni, Nd, Ir, Cr, or the like, and/or a transparent conductive layer made of indium tin oxide (ITO), indium zinc oxide (IZO), zinc oxide (ZnO), indium tin zinc oxide (ITZO), or the like. In an embodiment, the second light-emitting-element electrode LDE2 may be formed of a multilayer structure having two or more layers including a thin metal layer. For example, the second light-emitting-element electrode may be formed of a triple layer structure of ITO/Ag/ITO.

The second light-emitting-element electrode LDE2 may be formed of a metal reflective layer and/or a transparent conductive layer when an image is displayed in a direction toward a lower portion of the substrate SUB, or may be formed of a transparent conductive layer when an image is displayed in a direction toward an upper portion of the substrate SUB.

A group of the first light-emitting-element electrode LDE1, the emission layer EML, and the second light-emitting-element electrode LDE2 described above may be referred to as a light-emitting element.

The encapsulation layer TFE may be provided on the second light-emitting-element electrode LDE2. The encapsulation layer TFE may be formed of a single layer or multiple layers. In this embodiment, the encapsulation layer TFE may be composed of first, second, and third encapsulation layers ENC1, ENC2, and ENC3. The first, second, and third encapsulation layers ENC1, ENC2, and ENC3 may be made of organic material and/or inorganic material. The third encapsulation layer ENC3 disposed at the outermost position may be made of inorganic material. For example, the first encapsulation layer ENC1 may be an inorganic layer made of an inorganic material, the second encapsulation layer ENC2 may be an organic layer made of an organic material, and the third encapsulation layer ENC3 may be an inorganic layer made of an inorganic material. In the case of inorganic material, the resistance to penetration of water or oxygen is superior compared to that of the organic material, but the inorganic material is prone to a crack because it has low flexibility. Since the first encapsulation layer ENC1 and the third encapsulation layer ENC3 are made of inorganic material, and the second encapsulation layer ENC2 is made of organic material, the spread of a crack may be prevented. Here, the layer made of organic material, i.e., the second encapsulation layer ENC2 may be fully covered with the third encapsulation layer ENC3 so that an end of the second encapsulation layer is prevented from being exposed to the outside. For example, the organic material may include organic insulating material such as a polyacryl-based compound, a polyimide-based compound, a fluorocarbon compound such as Teflon, or a benzocyclobutene compound. For example, the inorganic material may include polysiloxane, silicon nitride, silicon oxide, or silicon oxynitride.

The emission layer EML forming the light-emitting element may be easily damaged by moisture or oxygen from the outside. The encapsulation layer TFE may cover the emission layer EML, thus protecting them. The encapsulation layer TFE may cover the display area DA and extend to the non-display area NDA which is the outside of the display area DA. However, in the case of an insulating layer made of organic material, there are advantages in terms of flexibility, elasticity, etc., but it is prone to penetration of water or oxygen compared to that of an insulation layer made of inorganic material. In an embodiment, to prevent water or oxygen from penetrating into the insulating layers made of organic material, the insulating layers made of organic material may be covered with the insulating layers made of inorganic material such that ends of the insulating layers made of organic material are not exposed to the outside. For example, the first via layer VIA1, the second via layer VIA2, and the pixel defining layer PDL made of an organic material may not continuously extend to the non-display area NDA, and may be covered by the first encapsulation layer ENC1. Thus, since the upper surface of the pixel defining layer PDL, the first via layer VIA1, the second via layer VIA2, and the side surface of the pixel defining layer PDL may be sealed by the encapsulation layer TFE including an inorganic material, exposure to the outside may be prevented.

The layer structure or material of the encapsulation layer TFE is not limited thereto, and may be changed in various manners. For example, the encapsulation layer TFE may include a plurality of organic material layers and a plurality of inorganic material layers that are alternately stacked.

A first sensing electrode layer ISM1 may be positioned on the encapsulation layer TFE. In some embodiments, an additional buffer layer may be positioned between the first sensing electrode layer ISM1 and the encapsulation layer TFE. The first sensing electrode layer ISM1 may be formed of a metal layer made of Ag, Mg, Al, Pt, Pd, Au, Ni, Nd, Ir, Cr, or the like, and/or a transparent conductive layer made of indium tin oxide (ITO), indium zinc oxide (IZO), zinc oxide (ZnO), indium tin zinc oxide (ITZO), or the like.

The first sensing insulating layer ISI1 may be present on the first sensing electrode layer IMS1. The first sensing insulating layer ISI1 may be an inorganic insulating layer formed of inorganic material. For example, the inorganic material may include inorganic insulating material such as polysiloxane, silicon nitride, silicon oxide, or silicon oxynitride.

A second sensing electrode layer ISM2 may be present on the first sensing insulating layer ISI1. The second sensing electrode layer ISM2 may be formed of a metal layer made of Ag, Mg, Al, Pt, Pd, Au, Ni, Nd, Ir, Cr, or the like, and/or a transparent conductive layer made of indium tin oxide (ITO), indium zinc oxide (IZO), zinc oxide (ZnO), indium tin zinc oxide (ITZO), or the like.

Various input sensing components may be configured using the first sensing electrode layer ISM1, the first sensing insulating layer ISI1, and the second sensing electrode layer ISM2, as described later with reference to FIGS. 38 to 40.

In the embodiment of FIG. 36, the second sensing electrode layer ISM2 may be patterned to form a first pattern IST1a of the first sensing line IST1.

The second sensing insulating layer ISI2 may be positioned on the second sensing electrode layer ISM2. The second sensing insulating layer ISI2 may be formed of an organic layer formed of organic material. For example, the organic material may include organic insulating material such as a polyacryl-based compound, a polyimide-based compound, a fluorocarbon compound such as Teflon, or a benzocyclobutene compound. For example, the second sensing insulating layer ISI2 may be formed of polymethyl methacrylate, polydimethylsiloxane, polyimide, acrylate, polyethylene terephthalate, polyethylene naphthalate, etc.

Next, the non-display area NDA, the first additional area ADA1, and the second additional area ADA2 will be described. Since a distinction between the non-display area NDA and the first additional area ADA1 is not a feature in the sectional view of FIG. 36, the non-display area NDA and the first additional area ADA1 will not be separately described. In the following description of the non-display area NDA and the second additional area ADA2, explanation of the same contents as that mentioned in the above description will be omitted or simplified to avoid redundancy of explanation.

A dam DAM may be positioned at the boundary of the second encapsulation layer ENC2. For example, the dam DAM may be positioned between the planarization layer FLT and the second encapsulation layer ENC2. The dam DAM may have a multi layer structure, and may include, for example, a first dam DAM1 and a second dam DAM2. For example, the first and second dams DAM1 and DAM2 may be formed of an organic material. Each of the first and second dams DAM1 and DAM2 may correspond to any one of the first via layer VIA1, the second via layer VIA2, and the pixel defining layer PDL. For example, when the first dam DAM1 is made of the same material through the same process as that of the first via layer VIA1, the second dam DAM2 may be formed of the same material through the same process as that of the second via layer VIA2 or the pixel defining layer PDL. For example, when the first dam DAM1 is made of the same material through the same process as that of the second via layer VIA2, the second dam DAM2 may be formed of the same material through the same process as that of the pixel defining layer PDL. In addition, when a spacer is formed on the pixel defining layer PDL of the display area DA, the dam DAM may be formed using the same material as the spacer.

The dam DAM prevents the organic material of the second encapsulation layer ENC2 having high fluidity from overflowing to the outside of the dam DAM during a process. The first and third encapsulation layers ENC1 and ENC3 made of inorganic material may extend to cover the dam DAM, thereby enhancing adhesion to the substrate SUB or other layers on the substrate SUB.

The first pad PDE1 may be positioned on the substrate SUB to be spaced apart from the planarization layer FLT. The first pad PDE1 may be supported by the second insulating layer group ING2. Each of the insulating layers of the second insulating layer group ING2 may correspond to each of the insulating layers of the first insulating layer group ING1. The first pad PDE1 may include a first pad electrode PDE1a and a second pad electrode PDE1b. The first pad electrode PDE1a may be formed of the same material as the first connection pattern CNP1. The second pad electrode PDE1b may be formed of the same material as the second connection pattern CNP2.

The planarization layer FLT may be positioned on the substrate SUB, but may be spaced apart from an area covered by the encapsulation layer TFE. The planarization layer FLT may be an organic insulating layer made of organic material. For example, the organic material may include organic insulating material such as a polyacryl-based compound, a polyimide-based compound, a fluorocarbon compound such as Teflon, or a benzocyclobutene compound.

In this embodiment, the planarization layer FLT may be formed after the interlayer insulating layer ILD is formed and before the first connection pattern CNP1 is formed. Thus, the planarization layer FLT and the first via layer VIA1 may be formed through different processes. According to an embodiment, the planarization layer FLT and the first via layer VIA1 may include different organic materials.

A first end of the planarization layer FLT may cover the first insulating layer group ING1. Further, a portion of the planarization layer FLT corresponding to the second bending area BA2 may fill a first trench TCH1 between the first insulating layer group ING1 and the second insulating layer group ING2.

Since inorganic insulating layers have higher hardness and less flexibility than organic insulating layers, the probability of cracking is relatively high. When cracks occur in the inorganic insulating layers, the cracks may propagate to the lines on the inorganic insulating layers, and consequently, defects such as line breakage may occur.

For example, as shown in FIG. 36, as the inorganic insulating layers are removed from the second bending area BA2, the first trench TCH1 may be formed, and the first insulating layer group ING1 and the second insulating layer group ING2 may be divided. In this embodiment, it is illustrated that all inorganic insulating layers corresponding to the area of the first trench TCH1 are removed. However, in an embodiment, some inorganic insulating layers may remain. In this case, the remaining inorganic insulating layers may include slits to disperse bending stress.

The second pattern IST1b of the first sensing line IST1 may extend on the planarization layer FLT, and may be electrically connected to the first pad PDE1. In this embodiment, the second pattern IST1b may be formed of the same material as the first connection pattern CNP1 through the same process.

A first line protective layer LPL1 may cover the planarization layer FLT and the second pattern IST1b. Further, a second line protective layer LPL2 may cover the first line protective layer LPL1. In some embodiments, the configuration of the second line protective layer LPL2 may be omitted. The first and second line protective layers LPL1 and LPL2 may be formed of an organic material. Each of the first and second line protective layers LPL1 and LPL2 may correspond to any one of the first via layer VIA1, the second via layer VIA2, and the pixel defining layer PDL. For example, when the first line protective layer LPL1 is made of the same material through the same process as that of the first via layer VIA1, the second line protective layer LPL2 may be formed of the same material through the same process as that of the second via layer VIA2 or the pixel defining layer PDL. For example, when the first line protective layer LPL1 is made of the same material through the same process as that of the second via layer VIA2, the second line protective layer LPL2 may be formed of the same material through the same process as that of the pixel defining layer PDL.

The first and second line protective layers LPL1 and LPL2, and the first sensing insulating layer ISI1 may include a first opening OPN1 which exposes the second pattern IST1b.

The first pattern IST1a may be connected to the second pattern IST1b through the first opening OPN1. According to this embodiment, the height of the second pattern IST1b disposed on the first insulating layer group ING1 and the first end of the planarization layer FLT may be greater than the height of the second pattern IST1b disposed on the planarization layer FLT corresponding to the first trench TCH1.

Therefore, the first pattern IST1a and the second pattern IST1b may be directly connected without another bridge line. Since there is no bridge line, the reliability of the connection between the first pattern IST1a and the second pattern IST1b is improved. In addition, since the length of the non-display area NDA may be reduced by the length of the bridge line, a dead space may be reduced and a thin bezel may be easily implemented.

The third pattern IST1c of the first sensing line IST1 may connect the first pad PDE1 and the second pattern ISTb. The third pattern IST1c may be formed of the same material by the same process as that of the gate electrode GE of the transistor. According to an embodiment, the third pattern IST1c may be formed of the same material by the same process as that of the upper electrode UE. According to an embodiment, an odd-numbered third pattern IST1c may be formed of the same material through the same process as that of the gate electrode GE of the transistor, and an even-numbered third pattern IST1c may be formed of the same material through the same process as that of the upper electrode UE. In contrast, the even-numbered third pattern IST1c may be formed of the same material through the same process as that of the gate electrode GE of the transistor, and the odd-numbered third pattern IST1c may be formed of the same material through the same process as that of the upper electrode UE. Thereby, a short-circuit problem between adjacent lines may be prevented more efficiently.

The second insulating layer group ING2 may include a second opening OPN2 which exposes the third pattern IST1c. Further, the planarization layer FLT may include an opening corresponding to the second opening OPN2. The second pattern IST1b may be connected to the third pattern IST1c through the second opening OPN2.

Figure 37:
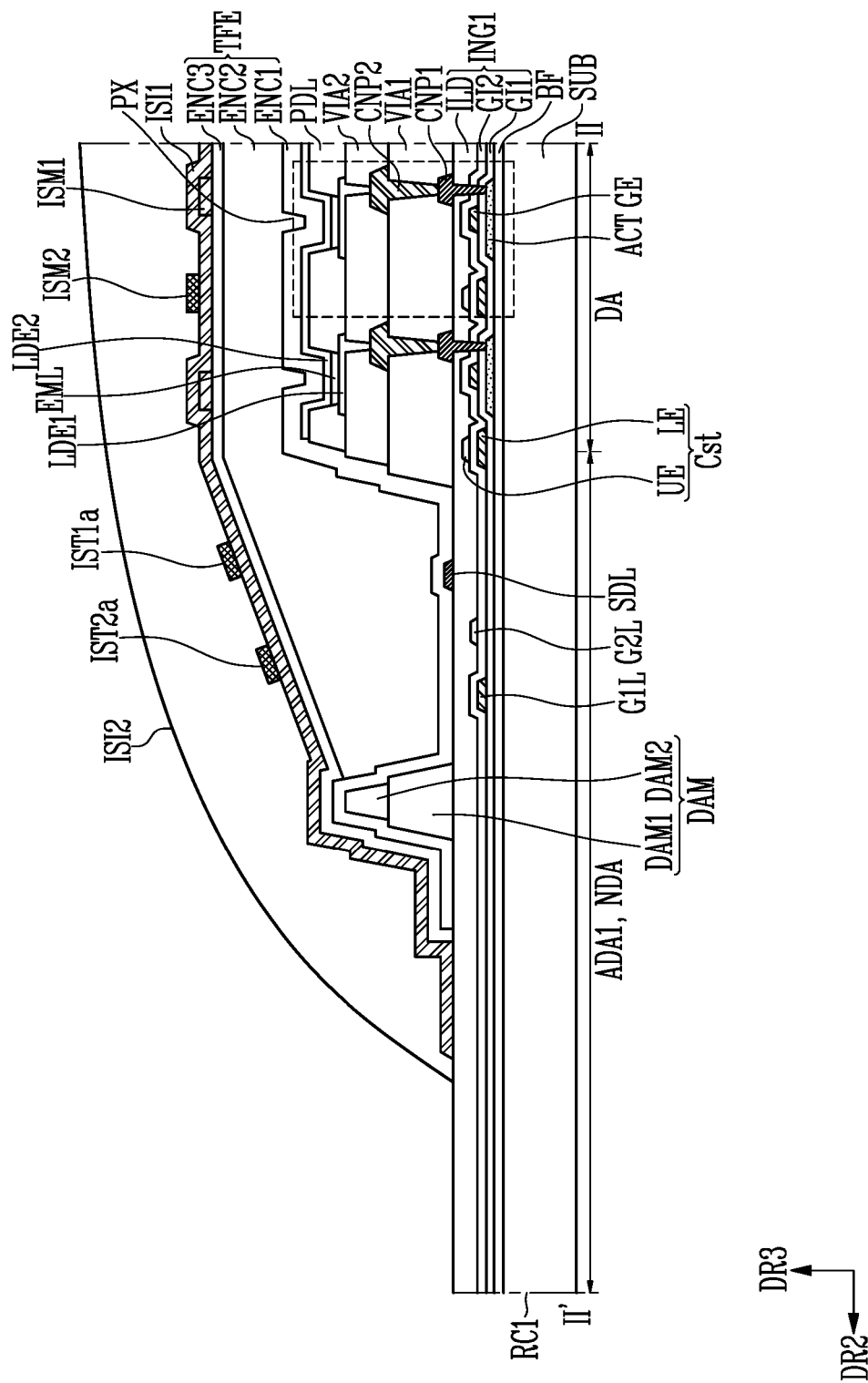

FIG. 37 is an embodiment of a cross-section taken along line II-II' of FIG. 35. Line II-II' of FIG. 35 may correspond to the first bending axis BX1. However, the same embodiment may be applied to the first side surface RC1 as well as the second side surface RC2.

The display lines DST may be configured as a single layer line or a multi layer line using at least one of lines G1L, G2L, and SDL. The line G1L may be formed of the same material through the same process as that of the gate electrode GE. The line G2L may be formed of the same material through the same process as that of the upper electrode UE. The line SDL may be formed of the same material through the same process as that of the first connection pattern CNP1.

The patterns IST1a and IST12a of the sensing lines IST1 and IST2 may be disposed on the encapsulation layer TFE and the first sensing insulating layer ISI1 (based on the third direction DR3), and be disposed between the dam DAM and the display area DA (based on the second direction DR2). The first sensing insulating layer ISI1 may be positioned between the encapsulation layer TFE and the sensing lines IST1 and IST2.

Figure 38:
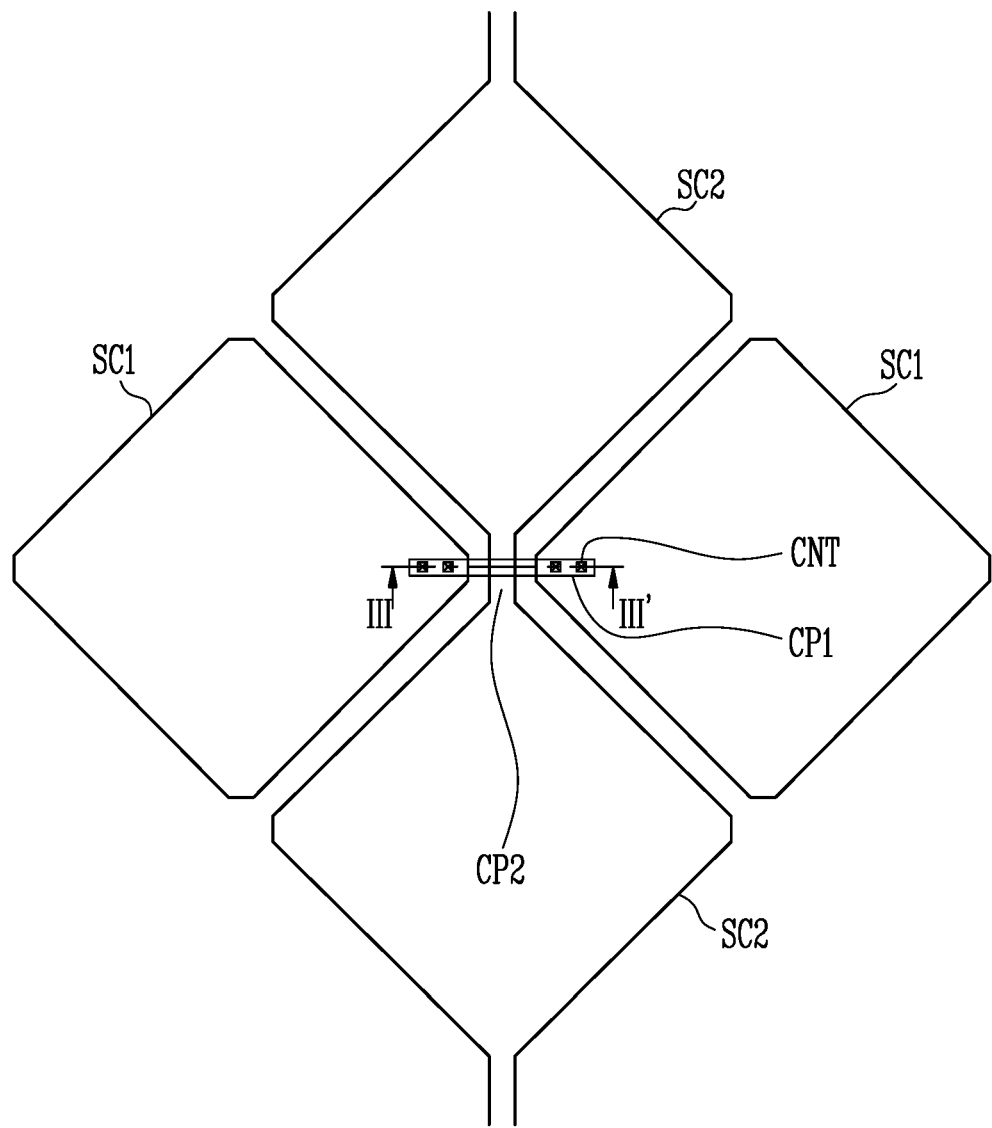
Figure 39:
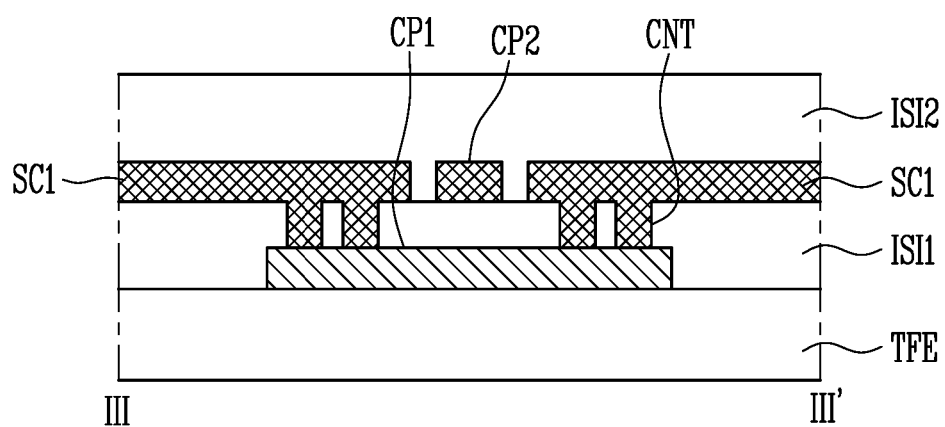

FIGS. 38 and 39 are diagrams for explaining sensing electrodes and bridge electrodes according to an embodiment. FIG. 39 is a sectional view taken along line of FIG. 38.

The bridge electrodes CP1 may be positioned on the encapsulation layer TFE by patterning the first sensing electrode layer ISM1.

The first sensing insulating layer ISI1 may cover the bridge electrodes CP1, and include contact holes CNT which expose a portion of the bridge electrodes CP1.

The first sensing electrodes SC1 and the second sensing electrodes SC2 may be formed on the first sensing insulating layer ISI1 by patterning the second sensing electrode layer ISM2. The first sensing electrodes SC1 may be connected to the bridge electrodes CP1 through the contact holes CNT.

The second sensing electrodes SC2 may have the connection pattern CP2 on the same layer by patterning the second sensing electrode layer ISM2. Therefore, a separate bridge electrode may be unnecessary when connecting the second sensing electrodes SC2.

In some embodiments, each of the sensing electrodes SC1 and SC2 may cover the plurality of pixels PX. In this case, when each of the sensing electrodes SC1 and SC2 is formed of an opaque conductive layer, a plurality of openings may be included to expose the plurality of pixels PX which are covered. For example, each of the sensing electrodes SC1 and SC2 may be formed in a mesh shape. When each of the sensing electrodes SC1 and SC2 is formed of a transparent conductive layer, each of the sensing electrodes SC1 and SC2 may have the shape of a plate which has no opening.

Figure 40:
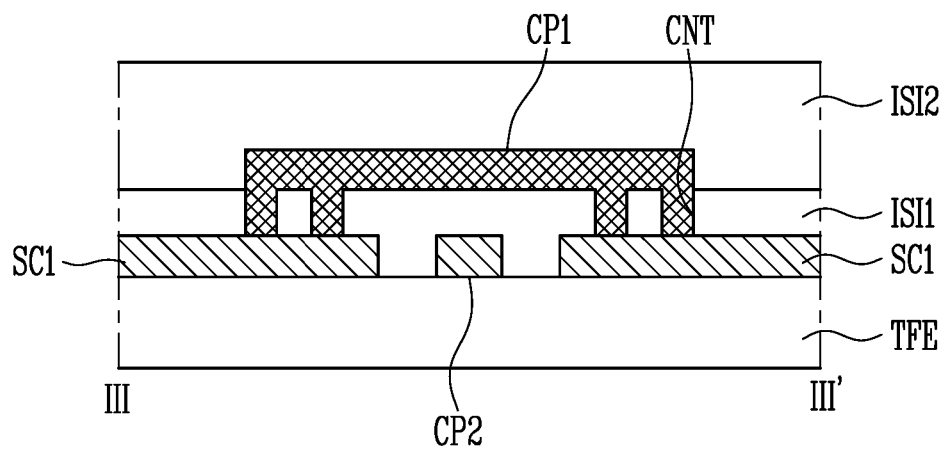

FIG. 40 is a view for explaining sensing electrodes and bridge electrodes according to an embodiment. FIG. 40 is a sectional view taken along line of FIG. 38.

The first sensing electrodes SC1 and the second sensing electrodes SC2 may be formed by patterning the first sensing electrode layer ISM1 to be positioned on the encapsulation layer TFE.

The first sensing insulating layer ISI1 may cover the first sensing electrodes SC1 and the second sensing electrodes SC2, and may include contact holes CNT which expose a portion of the first sensing electrodes SC1 and SC2.

The bridge electrodes CP1 may be formed by patterning the second sensing electrode layer ISM2 to be positioned on the first sensing insulating layer ISI1. The bridge electrodes CP1 may be connected to the first sensing electrodes SC1 through the contact holes CNT.

Figure 41:
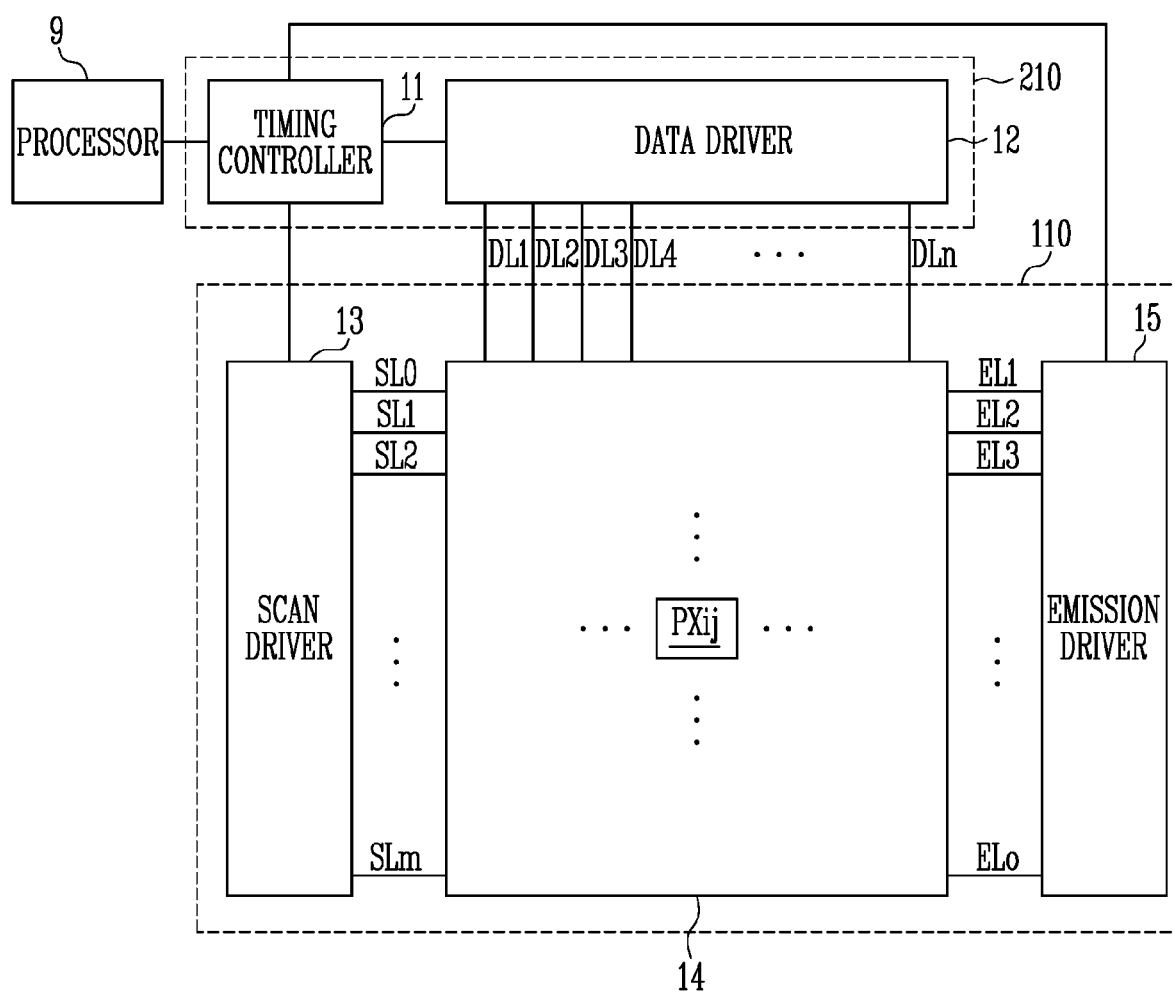
FIG. 41 is a diagram of another embodiment of the display panel and another embodiment of the display driver of the display device of FIG. 1.
Figure 42:
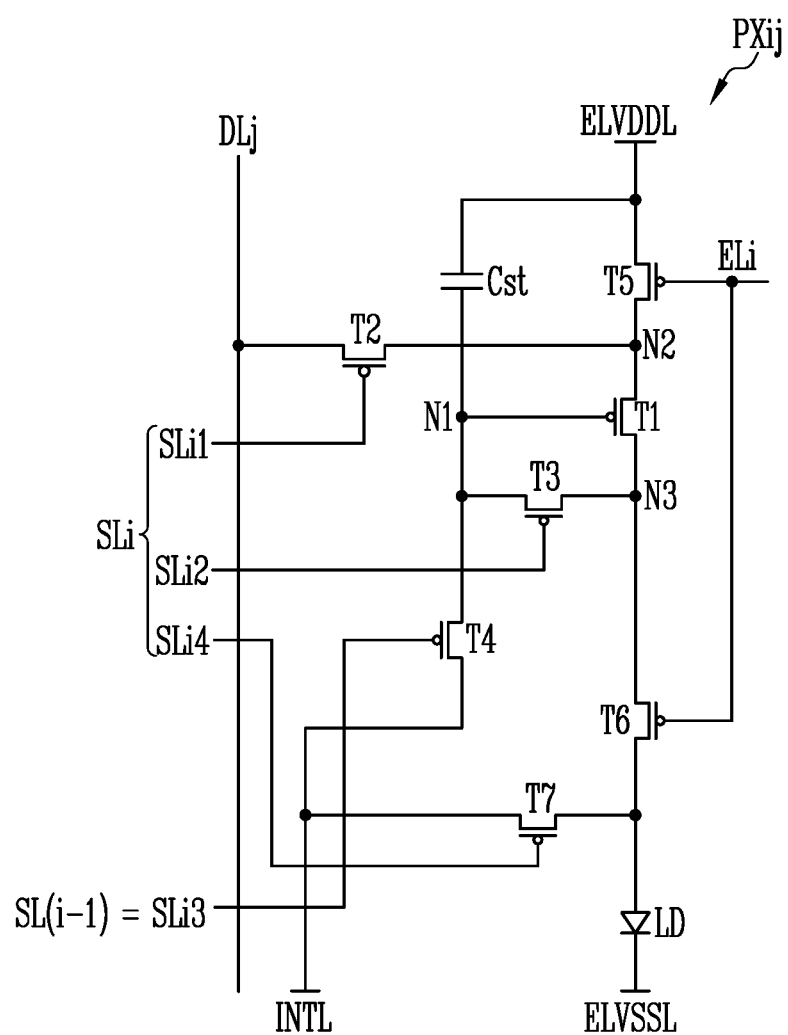
FIG. 42 is a diagram of a representative pixel of the display panel of FIG. 41.
Figure 43:
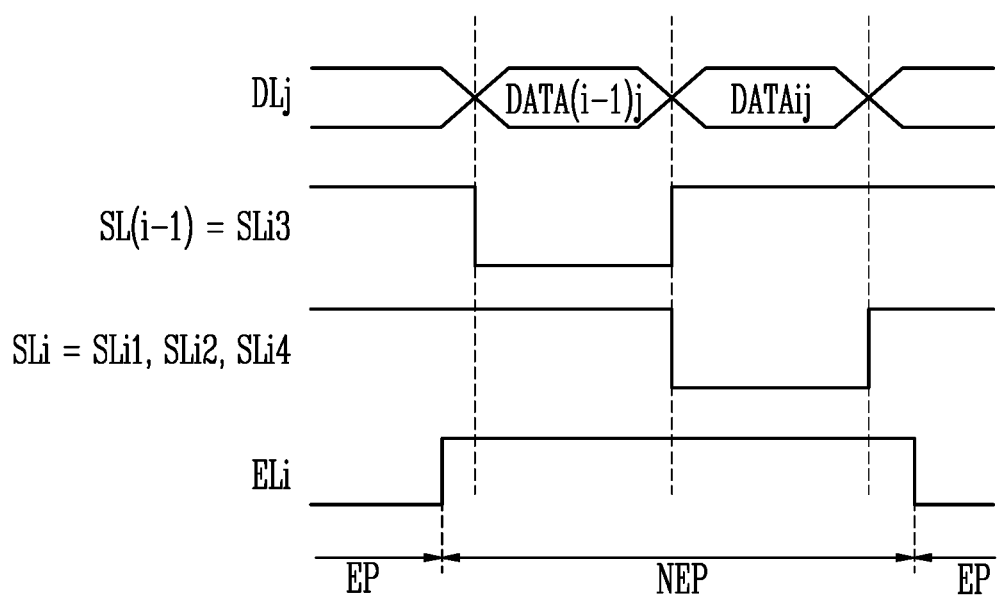
FIG. 43 is a diagram for describing an example of a method of driving the pixel of FIG. 42.

FIGS. 41, 42, and 43 are sectional views for explaining a display device including a pixel according to an embodiment.

FIG. 41 is a diagram illustrating a display panel and a display driver according to an embodiment.

Referring to FIG. 41, the display driver 210 may include a timing controller 11 and a data driver 12, and the display panel 110 may include a scan driver 13, a pixel component 14, and an emission driver 15. However, as described above, various configurations are possible according to the specification of the display device 1. For example, each functional component may be integrated into one IC, may be integrated into a plurality of Ics, or may be mounted on the display substrate 111.

The timing controller 11 may receive gray scales and timing signals for each display frame period from the processor 9. Here, the processor 9 may include at least one of a graphics processing unit (GPU), a central processing unit (CPU), and an application processor (AP). For example, the processor 9 may be the application processor 30 of FIG. 1. The timing signals may include a vertical synchronization signal, a horizontal synchronization signal, a data enable signal, etc.

Each cycle of the vertical synchronization signal may correspond to each display frame period. Each cycle of the horizontal synchronization signal may correspond to each horizontal period. The gray scales may be supplied on the basis of the horizontal line in each horizontal period in response to a pulse of an enable level of a data enable signal. The horizontal line may mean pixels (e.g., a pixel row) connected to the same scan line and emission line.

The timing controller 11 may render the gray scales in response to the specification of the display device 1. For example, the processor 9 may provide a red gray scale, a green gray scale, and a blue gray scale for each unit dot (e.g., each sub-pixel). For example, when the pixel component 14 has an RGB stripe structure, one-to-one correspondence may be formed between respective gray scales and the pixels. In this case, rendering of the gray scales may be unnecessary. However, for example, in the case where the pixel component 14 has a PENTILE™ structure, because adjacent unit dots may share a pixel, the pixels may not one-to-one correspond to the respective gray scales. In this case, rendering of the gray scales may be necessary. Gray scales that have been rendered or have not been rendered may be provided to the data driver 12. Further, the timing controller 11 may provide a data control signal to the data driver 12. Further, the timing controller 11 may provide a scan control signal to the scan driver 13, and may provide an emission control signal to the emission driver 15.

The data driver 12 may generate data voltages (i.e., data signals) to be provided to data lines DL1, DL2, DL3, DL4, DLn using the gray scales and the data control signals that are received from the timing controller 11. Here, n is an integer greater than 0.

The scan driver 13 may use a scan control signal (e.g., a clock signal, a scan start signal, etc.) received from the timing controller 11, and may generate scan signals to be provided to the scan lines SL0, SL1, SL2, . . . , SLm. The scan driver 13 may sequentially supply scan signals having a turn-on level pulse to the scan lines SL0 to SLm. The scan driver 13 may include scan stages configured in the form of shift registers. The scan driver 13 may generate scan signals by sequentially transmitting a scan start signal having a turn-on level pulse shape to a subsequent stage under control of a clock signal. Here, m may be an integer greater than 0.

The emission driver 15 may use an emission control signal (e.g., a clock signal, an emission stop signal, etc.) received from the timing controller 11, and generate emission signals to be provided to the emission lines EL1, EL2, EL3, . . . , ELo. The emission driver 15 may sequentially supply emission signals having a turn-off level pulse to the emission lines EL1 to ELo. The emission driver 15 may include emission stages configured in the form of a shift register. The emission driver 15 may generate emission signals by sequentially transmitting an emission stop signal having a turn-off level pulse shape to a subsequent emission stage under control of a clock signal. Here, o is an integer greater than 0.

The pixel component 14 may include pixels. Each pixel PXij may be coupled to a corresponding data line, a corresponding scan line, and a corresponding emission line. The pixels may include pixels emitting light of a first color, pixels emitting light of a second color, and pixels emitting light of a third color. The first color, the second color, and the third color may be different colors. For instance, the first color may be one of red, green, and blue, the second color may be one of red, green, and blue other than the first color, and the third color may be a remaining color other than the first and second colors among red, green, and blue. Furthermore, the first, second, and third colors may use magenta, cyan, and yellow in place of red, green, and blue.

FIG. 42 is a diagram illustrating a pixel according to an embodiment.

Referring to FIG. 42, the pixel PXij includes transistors T1, T2, T3, T4, T5, T6, and T7, a storage capacitor Cst, and a light-emitting element LD.

Hereinafter, a circuit configured of P-type transistors will be described by way of example. However, those skilled in this art may design a circuit configured of N-type transistors by switching the polarity of a voltage to be applied to the gate terminal of each transistor. Likewise, those skilled in this art may design a circuit configured of a combination of a P-type transistor and an N-type transistor. The term "P-type transistor" is a general name for transistors in which the amount of current increases when a voltage difference between a gate electrode and a source electrode increases in a negative direction. The term "N-type transistor" is a general name for transistors in which the amount of current increases when a voltage difference between a gate electrode and a source electrode increases in a positive direction. Each transistor may be configured in various forms such as a thin film transistor (TFT), a field effect transistor (FET), and a bipolar junction transistor (BJT).

A first transistor T1 may include a gate electrode connected to the first node N1, a first electrode connected to the second node N2, and a second electrode connected to the third node N3. The first transistor T1 may be referred to as a driving transistor.

A second transistor T2 may include a gate electrode connected to the scan line SLi1, a first electrode connected to the data line DLj, and a second electrode connected to the second node N2. The second transistor T2 may be referred to as a scan transistor.

The third transistor T3 may include a gate electrode connected to a scan line SLi2, a first electrode connected to the first node N1, and a second electrode connected to a third node N3. The third transistor T3 may be referred to as a diode connection transistor.

The fourth transistor T4 may include a gate electrode connected to a scan line SLi3, a first electrode connected to the first node N1, and a second electrode connected to an initialization line INTL. The fourth transistor T4 may be referred to as a gate initialization transistor.

A fifth transistor T5 may include a gate electrode connected to an i-th emission line ELi, a first electrode connected to the first power line ELVDDL, and a second electrode connected to the second node N2. The fifth transistor T5 may be referred to as an emission transistor. In an embodiment, the gate electrode of the fifth transistor T5 may be connected to an emission line different from the emission line connected to the gate electrode of the sixth transistor T6.

A sixth transistor T6 may include a gate electrode connected to the i-th emission line ELi, a first electrode connected to the third node N3, and a second electrode connected to the anode of the light-emitting element LD. The sixth transistor T6 may be referred to as an emission transistor. In an embodiment, the gate electrode of the sixth transistor T6 may be connected to an emission line different from the emission line connected to the gate electrode of the fifth transistor T5.

A seventh transistor T7 may include a gate electrode connected to the scan line SLi4, a first electrode connected to the initialization line INTL, and a second electrode connected to the anode of the light-emitting element LD. The seventh transistor T7 may be referred to as a "light-emitting-element initialization transistor".

A first electrode of the storage capacitor Cst may be connected to the first power line ELVDDL, and a second electrode thereof may be connected to the first node N1.

An anode of the light-emitting element LD may be connected to the second electrode of the sixth transistor T6, and a cathode thereof may be connected to the second power line ELVSSL. The light-emitting element LD may be a light-emitting diode. The light-emitting element LD may be an organic light-emitting diode, an inorganic light-emitting diode, a quantum dot/well light-emitting diode, etc. The light-emitting element LD may emit light having any one of a first color, a second color, and a third color. Further, in this embodiment, only one light-emitting element LD is provided in each pixel. However, in an embodiment, a plurality of light-emitting elements may be provided in each pixel. In this case, the plurality of light-emitting elements may be connected in series, parallel, series-parallel, or the like.

The first supply voltage may be applied to the first power line ELVDDL, the second supply voltage may be applied to the second power line ELVSSL, and the initialization voltage may be applied to the initialization line INTL. For example, the first supply voltage may be greater than the second supply voltage. For example, the initialization voltage may be equal to or greater than the second supply voltage. For example, the initialization voltage may correspond to a data voltage having the smallest level among data voltages that may be provided. In another example, the level of the initialization voltage may be smaller than levels of the data voltages that may be provided.

FIG. 43 is a diagram for describing an example of a method of driving the pixel of FIG. 42.

Hereinafter, for the convenience of description, it is assumed that the scan lines SLi1, SLi2, and SLi4 are the i-th scan line SLi and the scan line SLi3 is the (i−1)-th scan line SL(i−1). However, a connection relationship between the scan lines SLi1, SLi2, SLi3, and SLi4 may vary according to embodiments. For example, the scan line SLi4 may be an (i−1)-th scan line or an (i+1)-th scan line.

First, the emission signal of a turn-off level (logic high level) is applied to the i-th emission line ELi, the data voltage DATA(i−1)j for the (i−1)-th pixel is applied to the data line DLj, and the scan signal of a turn-on level (e.g., logic low level) is applied to the scan line SLi3. The high/low of the logic level may vary according to whether the transistor is the P-type or N-type.

Since the scan signal of the turn-off level is applied to the scan lines SLi1 and SLi2, the second transistor T2 is in the turned-off state, and the data voltage DATA(i−1)j for the (i−1)-th pixel is prevented from being introduced into the pixel PXij.

Since the fourth transistor T4 is turned on, the first node N1 is connected to the initialization line INTL, and the voltage of the first node N1 is initialized. Since the emission signal of the turn-off level is applied to the emission line ELi, the transistors T5 and T6 are in the turned-off state, and unnecessary light emission of the light-emitting element LD due to the initialization-voltage application process is prevented.

Next, the data voltage DATAij for the i-th pixel PXij is applied to the data line DLj, and the scan signal of the turn-on level is applied to the scan lines SLi1 and SLi2. For example, the transistors T2, T1, and T3 are in a conduction state, and the data line DLj and the first node N1 are electrically connected. Therefore, a compensation voltage obtained by subtracting the threshold voltage of the first transistor T1 from the data voltage DATAij is applied to the second electrode (i.e., the first node N1) of the storage capacitor Cst, and the storage capacitor Cst maintains a voltage corresponding to a difference between the first supply voltage and the compensation voltage. This period may be referred to as a threshold-voltage compensation period or a data writing period.

Further, when the scan line SLi4 is the i-th scan line, the seventh transistor T7 is in the turned-on state. For example, the anode of the light-emitting element LD is connected to the initialization line INTL, and the light-emitting element LD is initialized with a charge amount corresponding to a voltage difference between the initialization voltage and the second supply voltage.

Thereafter, as the emission signal of the turn-on level is applied to the i-th emission line ELi, current may flow through the transistors T5 and T6. Therefore, a driving-current path connecting the first power line ELVDDL, the fifth transistor T5, the first transistor T1, the sixth transistor T6, the light-emitting element LD, and the second power line ELVSSL may be formed.

The amount of driving current flowing through the first electrode and the second electrode of the first transistor T1 is adjusted according to the voltage maintained in the storage capacitor Cst. The light-emitting element LD emits light having a luminance corresponding to the amount of driving current. The light-emitting element LD emits light before the emission signal of the turn-off level is applied to the emission line ELi.

When the emission signal is in the turn-on level, pixels receiving a corresponding emission signal may be in a display state. Therefore, a period in which the emission signal is in the turn-on level may be referred to as the emission period EP (e.g., the emission allowable period). Further, when the emission signal is in the turn-off level, pixels receiving a corresponding emission signal may be in a non-display state. Therefore, a period in which the emission signal is in the turn-off level may be referred to as the non-emission period NEP (e.g., the emission disallowable period).

The non-emission period NEP described in FIG. 43 is to prevent the pixel PXij from emitting light having an undesired luminance during the initialization period and the data writing period.

One or more non-emission periods NEP may be further provided while data written in the pixel PXij is maintained (e.g., one frame period). This can effectively express a low gray scale by reducing the emission period EP of the pixel PXij, or can smoothly blur the motion of an image.

The detailed description of the disclosure described with reference to the drawings is merely illustrative, which is used only for the purpose of describing the disclosure and is not used to limit the meaning or scope of the disclosure as defined in the accompanying claims. Therefore, those skilled in the art will understand that various modifications and equivalences thereof are possible. Accordingly, the bounds and scope of the present disclosure should be determined by the technical spirit of the following claims.

A display device and a method of driving the same according to embodiments can transmit a driving signal for proximity sensing only to at least some of sensors corresponding to a second sensing area other than a first sensing area where a touch input is generated. Therefore, the influence of the touch input on the proximity sensing is excluded, and the proximity of the object can be more effectively determined.

Further, the display device and the method of driving the same can start to automatically measure the biometric information of the object based on the proximity of the object, and can also acquire the biometric information in a state in which the object does not contact the display device. Therefore, the biometric information of the object can be easily measured without a separate request for approval for the biometric information measurement of the object. Furthermore, as compared to a case in which the biometric information is measured only when the object contacts the display device, the biometric information of the object can be more accurately measured.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display panel comprising pixels;
a sensor layer overlapping the display panel and comprising sensors; and
a sensor driver configured to transmit a driving signal to the sensors and receive sensing signals from the sensors, wherein:
in a first mode, the sensor driver is configured to transmit a first driving signal to the sensors to detect a first sensing area where a touch occurs, and,
in a second mode, the sensor driver is configured to transmit a second driving signal to at least a portion of the sensors corresponding to a second sensing area different from the first sensing area,
wherein the first driving signal and the second driving signal are different from each other in voltage magnitude.

2. The display device of claim 1, wherein:
the sensor driver is configured to detect the touch based on first sensing signals provided from the sensors in response to the first driving signal in the first mode, and
second sensing signals are provided from the sensors in response to the second driving signal in the second mode, and are used for proximity sensing.

3. The display device of claim 1, wherein:
in the second mode, the sensor driver is configured to provide the first driving signal to the sensors corresponding to the first and second sensing areas, and
a second transmission rate of the first driving signal in the second mode is lower than a first transmission rate of the first driving signal in the first mode.

4. The display device of claim 3, wherein the sensor driver is configured to alternately transmit the first driving signal and the second driving signal to the sensor layer at least once in the second mode.

5. The display device of claim 1, wherein a second sensing rate at which a second sensing result based on the sensing signals is output in the second mode is less than a first sensing rate at which a first sensing result based on the sensing signals is output in the first mode.

6. The display device of claim 1, wherein the sensor driver is configured to transmit only sensing signals corresponding to the second driving signal to an external device, in the second mode.

7. The display device of claim 1, wherein the sensor driver comprises:
an analog front-end configured to differentially amplify one sensing signal of the sensing signals and a reference signal; and
an analog-to-digital converter configured to convert an output of the analog front-end into a sensing value, and
wherein the reference signal is another sensing signal of the sensing signals.

8. The display device of claim 7, wherein the one sensing signal of the sensing signals and the another sensing signal of the sensing signals correspond to the first sensing area.

9. The display device of claim 7, wherein the one sensing signal of the sensing signals corresponds to the first sensing area, and the another sensing signal of the sensing signals corresponds to the second sensing area.

10. The display device of claim 1, wherein the sensor driver comprises:
an analog front-end configured to receive one of the sensing signals; and
an analog-to-digital converter configured to convert an output of the analog front-end into a sensing value, and
wherein the analog front-end is implemented as a single analog front-end.

11. The display device of claim 1, wherein:
in a third mode, the sensor driver is configured to transmit a third driving signal to at least a portion of the sensors corresponding to the second sensing area, and
the third driving signal and the second driving signal are different from each other in at least one of a voltage magnitude, a frequency, or a number of sensors to which the driving signal is simultaneously provided.

12. The display device of claim 11, wherein:
second sensing signals are provided from the sensors in response to the second driving signal in the second mode, and are used for proximity sensing, and
the sensor driver is operated by switching from the second mode to the third mode in response to an object approaching the sensor layer within a first threshold distance.

13. The display device of claim 12, wherein third sensing signals are provided from the sensors in response to the third driving signal in the third mode, and comprise first sensing information in a state in which the object contacts the display device and second sensing information in a state in which the object does not contact the display device.

14. The display device of claim 12, wherein third sensing signals are provided from the sensors in response to the third driving signal in the third mode, and are used for measuring hydration of the object.

15. The display device of claim 12, wherein:
the sensor driver is operated by switching from the third mode to the second mode in response to the object being released from the sensor layer by a second threshold distance, and
the second threshold distance is greater than the first threshold distance.

16. The display device of claim 11, wherein:
the pixels are configured to emit light in the first mode and the second mode, and
the pixels are configured to emit no light in the third mode.

17. The display device of claim 16, wherein a number of transmissions of the driving signal per unit time in the third mode is greater than a number of transmissions of the driving signal per unit time in the second mode.

18. The display device of claim 16, wherein a third sensing rate at which a third sensing result based on the sensing signals is output in the third mode is equal to or less than a second sensing rate at which a second sensing result based on the sensing signals is output in the second mode.

19. The display device of claim 11, wherein the sensor driver is configured to alternately transmit the second driving signal and the third driving signal to the sensor layer at least once in the third mode.

20. The display device of claim 11, wherein the sensor driver is configured to alternately transmit the first driving signal, the second driving signal, and the third driving signal to the sensor layer at least once in the third mode.

21. A method of driving a display device having pixels and sensors overlapping the pixels, the method comprising the steps of:
transmitting a first driving signal to the sensors through a sensor driver;
receiving first sensing signals corresponding to the first driving signal from the sensors through the sensor driver;
transmitting a second driving signal to the sensors through the sensor driver, in response to an object approaching within a first threshold distance; and
receiving second sensing signals corresponding to the second driving signal from the sensors through the sensor driver,
wherein the first driving signal and the second driving signal are different from each other in voltage magnitude.

22. The method of claim 21, further comprising the steps of:
sensing proximity of the object based on the first sensing signals; and
measuring hydration of the object based on the second sensing signals.

23. The method of claim 22, wherein the second sensing signals comprise first sensing information in a state in which the object contacts the display device and second sensing information in a state in which the object does not contact the display device.

24. The method of claim 23, further comprising the steps of:
stopping the transmitting the second driving signal through the sensor driver to the sensors in response to the object being released from the sensors by a second threshold distance, and
wherein the second threshold distance is greater than the first threshold distance.

25. The method of claim 23, wherein:
the pixels are configured to emit light while the first driving signal is transmitted to the sensors, and
the pixels are configured to emit no light while the second driving signal is transmitted to the sensors.

26. The method of claim 25, wherein a number of transmissions of the second driving signal per unit time is greater than a number of transmissions of the first driving signal per unit time.

27. The method of claim 25, wherein a second sensing rate for the second sensing signals is equal to or less than a first sensing rate for the first sensing signals.

* * * * *